United States Patent [19]
Jenekhe

[11] Patent Number: 5,814,833
[45] Date of Patent: Sep. 29, 1998

[54] CONJUGATED POLYMER EXCIPLEXES AND APPLICATIONS THEREOF

[75] Inventor: Samson A. Jenekhe, Fairport, N.Y.

[73] Assignee: Research Corporation Technologies, Inc., Tucson, Ariz.

[21] Appl. No.: 674,390

[22] Filed: Jul. 1, 1996

Related U.S. Application Data

[60] Division of Ser. No. 187,278, Jan. 26, 1994, Pat. No. 5,597,890, which is a continuation-in-part of Ser. No. 146,266, Nov. 1, 1993, Pat. No. 5,599,899.

[51] Int. Cl.$^6$ .................................................. H01L 35/24
[52] U.S. Cl. .............................. 257/40; 257/103; 313/504
[58] Field of Search ....................... 257/40, 103; 313/504

[56] References Cited

U.S. PATENT DOCUMENTS

| | | | |
|---|---|---|---|
| 3,904,982 | 9/1975 | Dienes et al. ....................... | 331/94.5 L |
| 4,225,700 | 9/1980 | Wolfe et al. . | |
| 4,359,567 | 11/1982 | Evers . | |
| 4,533,692 | 8/1985 | Wolfe et al. . | |
| 4,533,724 | 8/1985 | Wolfe et al. . | |
| 4,703,103 | 10/1987 | Wolfe et al. . | |
| 4,772,678 | 9/1988 | Sybert et al. . | |
| 5,104,960 | 4/1992 | Inbasekaran et al. . | |
| 5,142,343 | 8/1992 | Hosokawa et al. . | |
| 5,236,980 | 8/1993 | Jenekhe et al. . | |
| 5,355,235 | 10/1994 | Nishizawa et al. ....................... | 359/59 |
| 5,454,880 | 10/1995 | Sariciftci et al. ....................... | 136/263 |

FOREIGN PATENT DOCUMENTS

| | | | |
|---|---|---|---|
| 0 478 380 | 4/1992 | European Pat. Off. .................. | 257/40 |
| 0 517 542A1 | 12/1992 | European Pat. Off. . | |
| 0 532 798A1 | 3/1993 | European Pat. Off. . | |
| 2-239664 | 9/1990 | Japan ....................... | 257/40 |
| 2-242879 | 9/1990 | Japan . | |
| US94/12322 | 10/1994 | WIPO . | |

OTHER PUBLICATIONS

Jenekhe, et al. (Aug. 3, 1899) "Solubilization, Solutions and Processing or Aromatic Heterocyclic Rigid Rod Polymers in Aprotic Organic Solvents: Poly(p–phenylene–2,6–benzobisthiazolediyl) (PBT)", *Macromolecules* 22:3216–3222.

Jenekhe, et al. (Jan. 29, 1990) "Complexation–Mediated Solubilization and Processing of Rigid–Chain and Ladder Polymers in Aprotic Organic Solvents", *Macromolecules* 23:4419–4429.

Osaheni, et al. (1992) "New Sulfur–Based Heterocyclic Conjugated Polymers for Electronics and Photonics", *Proc. ACS Div. Pol. Mat: Sci. and Eng.* 67:474–475.

Rao, et al. (May 5, 1986) "Third Order Nonlinear Optical Interactions in Thin Films of Poly–p–phenylenebenzobisthiazole Polymer Investigated by Picosecond and Subpicosecond Degenerate Four Wave Mixing", *Appl. Phys. Lett.* 48:1187–1189.

Sariciftci, et al. (Nov. 27, 1992) "Photoinduced Electron Transfer from a Conducting Polymer to Buckminsterfullerene", *Science* 258:1474–1476.

Shen, et al. (Jul. 1982) "Vibrational Spectroscopic Characterization of Rigid Rod Polymers: 3. Microstructural Changes in Stressed Polymers", *Polymer* 23:969–973.

Vanherzeele, et al. (Feb. 8, 1991) "Third–Order Nonlinear Optical Properties of Thin Films of Poly(p–phenylene benzobisthiazole) and its Molecular Composites with Polyamides", *Appl. Phys. Lett.* 58:663–665.

Wolfe, et al. (Aug. 28, 1981) "Rigid–Rod Polymers. 2. Synthesis and Thermal Properties of Para–Aromatic Polymers with 2,6–Benzobisthiazole Units in the Main Chain", *Macromolecules* 14:915–920.

Yokoyama, et al. (Mar. 22, 1990) "Synthesis of Ultra–Thin Films of Poly(vinylenebenzothiazole) at Air/Water Interface", *Chemistry Letters*: 779–782.

*Primary Examiner*—Sara W. Crane
*Attorney, Agent, or Firm*—Scully, Scott, Murphy & Presser

[57] ABSTRACT

The present invention is directed to an exciplex formed from a η-conjugated polymer and an electron donor or acceptor component. The present invention also relates to assemblies comprising said exciplex, their use in optoelectrical devices and method of enhancing optoelectrical properties of η-conjugated polymers by forming said exciplex.

36 Claims, 10 Drawing Sheets

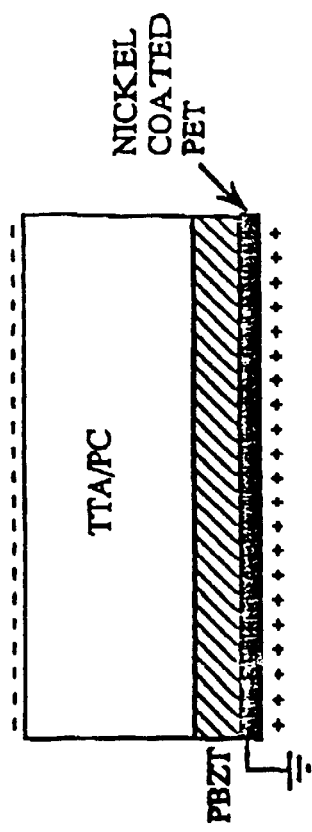
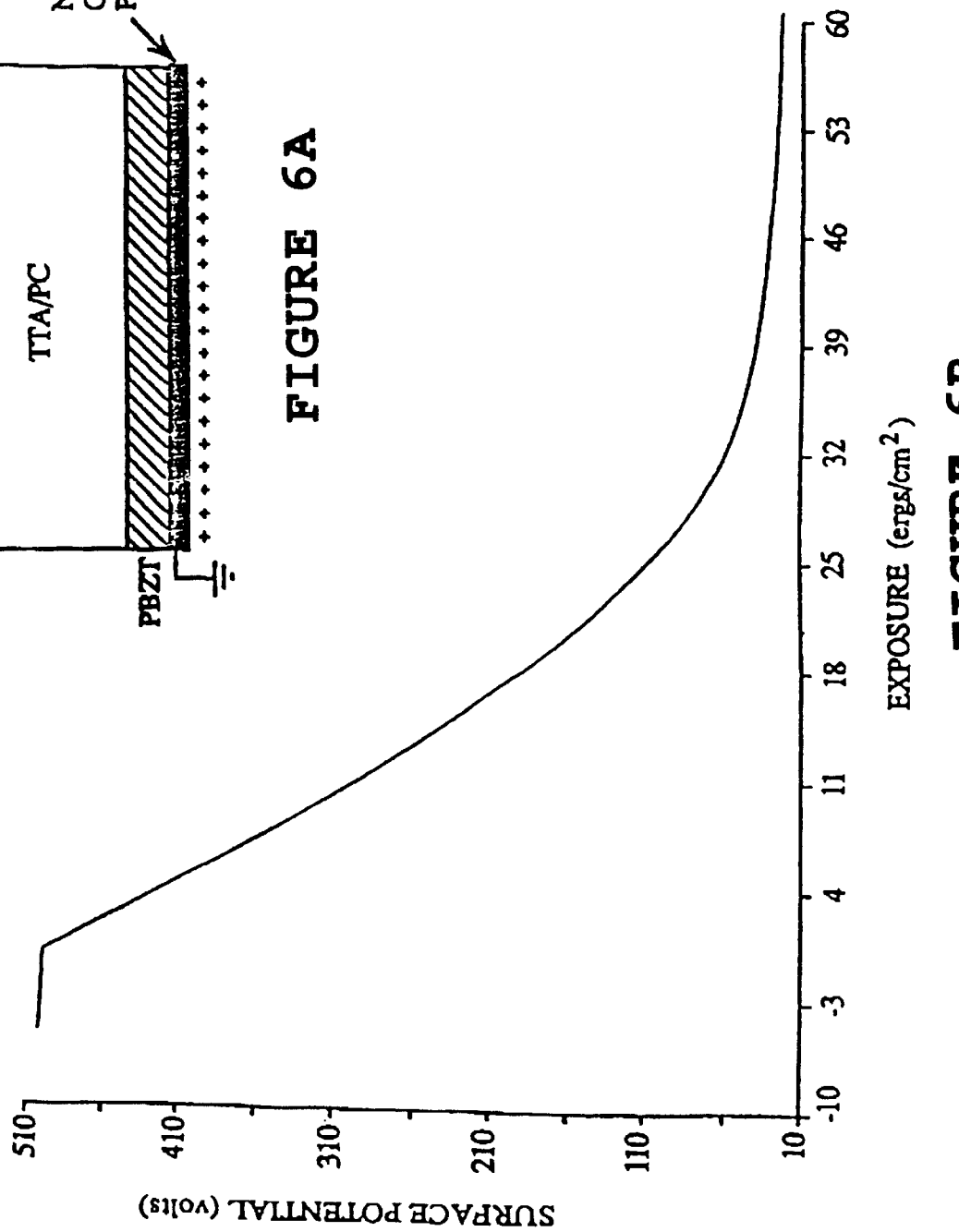
FIGURE 6A
FIGURE 6B

CONJUGATED POLYMER EXCIPLEXES AND APPLICATIONS THEREOF

This is a divisional of application Ser. No. 08/187,278, filed on Jan. 26, 1994, now U.S. Pat. No. 5,597,890, which is a continuation-in-part of Ser. No. 08/146,266, filed Nov. 1, 1993, now U.S. Pat. No. 5,599,899.

The invention described herein was made with Government support under Grant NSF CHE 912-0001 awarded by the National Science Foundation. The Government has certain rights in the invention.

BACKGROUND OF THE INVENTION

1. Field of the Invention

The present invention relates to polymers having optical and electronic characteristics well-suited for electronic, optoelectronic and photonic applications. In particular, the present invention relates to a composition comprising a η-conjugated polymer; specifically, an exciplex formed from a η-conjugated polymer and another component which, depending upon the circumstances, serves as an electron donor or acceptor. The exciplex of the present invention exhibits enhanced luminescence and photogeneration of charge carriers and excellent quantum efficiency. The present invention is also directed to assemblies and related devices incorporating the exciplex.

2. Background of the Invention

Recent advances in electronics, optoelectronics and photonics have created a need for new materials possessing the requisite optical, electrical and mechanical properties demanded for these applications. A particular class of materials of interest are polymers, which are generally more tractable and easier to process than conventional inorganic semiconductor materials, which characteristics make possible the creation of large and flexible light emitting diodes (LEDs) for displays.

One of the more promising polymer candidates for such uses are the η-conjugated polymers; that is, polymers whose backbone contain single bonds alternating with double bonds (which include those provided by way of rings and aromaticity) or triple bonds. Electrically conducting polymers, including η-conjugated polymers, are known also to form ground state charge transfer (CT) complexes, as described, e.g., by J. E. Frommer and R. R. Chance in *Encycl. of Polymer Sci. & Eng.*, pp. 462–507 (1985) and Wellinghoss et al. in U.S. Pat. No. 4,452,725, which patent discloses iodine and bromine CT complexes of poly(3,6-carbazoles). In these ground state CT complexes, the η-conjugated polymer can act as an electron donor or electron acceptor, and small molecules can act as electron donors or electron acceptors to form CT complexes in the ground state; examples of such include iodine, bromine, $AsF_5$ and $AsF_3$. While η-conjugated polymers have been employed in light emitting diodes, photodetectors, solar cells and electrographic photoreceptors, they suffer from having less-than-desirable quantum efficiencies and thus ultimately less-than-desirable electroluminescence device quantum efficiencies, which shortcomings include their inability to efficiently emit spectrally pure, i.e., bright, blue light.

Efforts to increase electroluminescence device quantum efficiency in this regard have been directed to "device engineering" techniques. Endeavors of this sort have focused on, for example, the type of metal electrode used, the thickness of the emitter, the use of charge transport layers to, among other things, improve electron transfer from the electrode, and the use of random copolymers in the device, as described, for example, by Bradley in *Adv. Mater.* (1992), 4, 756; Burroughes, et al., *Nature* (1990) 347, 539; Braun, et al., *Appl. Phys. Lett.* (1991), 58, 1982; Gustafsson, et al., *Nature* (1992), 357, 477; Burn, et al., *Nature* (1992), 356, 47; Brown, et al., *Chem. Phys. Lett.* (1992), 200, 46.

As to the difficulty in efficiently obtaining spectrally pure blue light emission from η-conjugated polymers, the problem with the same is associated with an unusually large apparent Stokes shift between the absorption and emission spectra for η-conjugated polymers and with the inability to control or predict a value for the apparent Stokes shift from molecular structure. Hence, although there are many conjugated polymers with a $\eta$-$\eta^*$ transition energy on the order of about 2.8 eV or higher, which value would appear adequate for obtaining blue luminescence, the aforementioned inability to predict the Stokes shift throws off any prediction from the $n$-$n^*$ transition energy. The large Stokes shift in η-conjugated polymers is believed to originate from energy relaxation in the course of excitation energy migration among randomly distributed chromophores of different conjugation lengths.

Blue light emitting conjugated and non-conjugated polymers have been reported, including polymers such as poly(p-phenylene), as reported by Green, et al., *Adv. Mater.* (1982), 4, 36; poly(alkylfluorene) as reported by Ohmari, et al., *Jpn. J. Appl. Phys.* (1991), 30, L1941; a polycarbonate derivative, as reported by Hosokawa, et al., *Appl. Phys. Lett.* (1992), 61, 2503; and a copolymer of poly(p-phenylene vinylene) as reported by Yang, et al., *Macromolecules* (1993), 26, 1188. These polymers, however, emit blue light with less-than-desirable efficiency and/or less than desirable spectral purity.

While attempts have been made to improve efficiency, these have been, as before stated, directed to device engineering techniques, which are usually hampered by the fact that the η-conjugated polymers have a propensity to form excimers; that is, excited state complexes formed from identical molecules. These complexes are generally stable in the excited state, but are substantially dissociative in the ground state. Excimers are known to emit energy, whereafter they return to a dissociated ground state; however, excimer emission from η-conjugated polymers gives rise to weak and inefficient luminescence because, in part, they tend to emit energy in the form of heat rather than luminescence, upon decay. For η-conjugated polymers, studies of excimer-like emissions have been made of poly(pyridine-2,5-diyl) by Yamamoto, et al., *J. Chem Soc. Chem. Commun.* (1990), 1306.

In addition to excimer emissions of η-conjugated polymers, studies of photo-induced electron transfer between poly[2-methoxy,5-(2'-ethyl-hexyloxy)-p-phenylene vinylene (MEH-PPV) and $C_{60}$, have been reported, Scaricifti, et al., *Science*, 258, 1474 (27 Nov. 1992), the result here being ionization, i.e., the generation of ion radicals from the separation of charges, which does not result in highly efficient luminescence.

Thus the art recognizes a continuing need to improve quantum efficiency of η-conjugated polymers in regard to luminescence and photogeneration of charge carriers, including the pressing need for efficient generation of spectrally pure blue light.

SUMMARY OF THE INVENTION

The present invention achieves enhanced luminescence and photogeneration of charge carriers and increased quantum efficiency without being strictly limited to device engineering techniques. The present invention is directed to a composition comprising an exciplex of a η-conjugated polymer. An exciplex is an excited state complex formed from different molecules. The exciplex forms when one or both of the component molecules are in an excited state and is stable in the excited state. The exciplex is substantially dissociative in the ground state; that is, there is no corresponding ground state interaction or complex formation.

In the present invention the η-conjugated polymer is the first component that forms the exciplex, and an electron donor or acceptor component is the second component that forms the exciplex. The second component is different from the first component and is effective to form the exciplex with the first component when at least one of the first component or the second component is in an excited state.

The present invention is also directed to assemblies and optoelectronic devices incorporating the exciplex.

The present invention is further directed to a method to enhance optoelectric properties of η-conjugated polymers by forming an exciplex from the same.

BRIEF DESCRIPTION OF THE DRAWINGS

FIG. 6A is a schematic representation of an assembly of the present invention useful in photoreceptor/photoconductive devices such as employed in electrophotographic imaging, the assembly comprising a poly(p-phenylene benzobisthiazole), PBZT/TTA bilayer thin film assembly prepared atop a nickel-coated poly(ethyleneterephthalate), PET, substrate.

FIG. 6B is a graph depicting the surface potential (volts) as measured against exposure (ergs/cm$^2$) for the assembly shown in FIG. 6A.

DETAILED DESCRIPTION OF THE INVENTION

Figure 1:
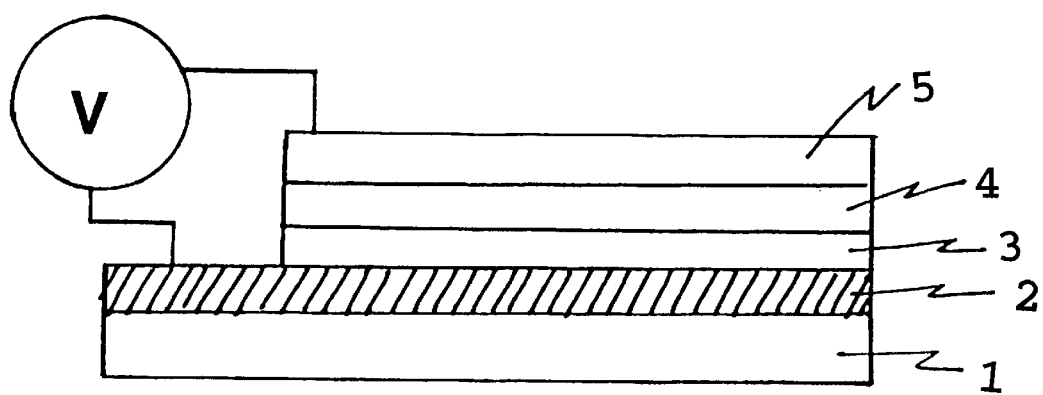
FIG. 1 is a schematic representation of a light emitting diode comprising a bilayer exciplex-forming assembly of the present invention.

The present invention is directed to an exciplex formed from a η-conjugated polymer and an electron donor or acceptor component that is effective to form an exciplex with the η-conjugated polymer. As used in the present specification the word "polymer" intends homopolymers and copolymers even though copolymers may be separately identified herein. A η-conjugated polymer, as contemplated by the present invention, is a polymer whose backbone is substantially comprised of single bonds alternating with double bonds, which for practical purposes include those provided by way of rings or aromaticity, or single bonds alternating with triple bonds; the bonds being between carbon atoms, between heteroatoms, such as nitrogen, oxygen or sulfur, or between carbon atoms and heteroatoms.

Examples of η-conjugated polymers include, without limitation, materials such as polybenzobisazoles, including polybenzobisimidazoles, polybenzobisoxazoles and polybenzobisthiazoles as known in the art or as described in commonly-assigned U.S. Ser. No. 146,266, filed Nov. 2, 1993, the contents of which are incorporated herein by reference; polyquinolines and polyanthrazolines as known in the art or as described in commonly-assigned U.S. Ser. No. 934,610, filed Aug. 24, 1992, the contents of which are incorporated herein by reference; polypyridines, such as poly(2,5-pyridine); polyimines; poly(phenylene vinylenes) such as poly(p-phenylene vinylene); polythiophenes; and poly(thiophene vinylenes).

In a specific aspect of the present invention, the η-conjugated polymer comprises a repeating unit having the structure:

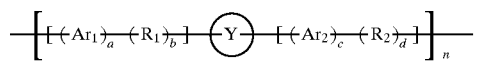

wherein Y is

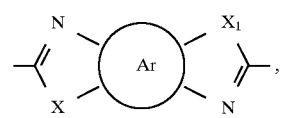
Formula I

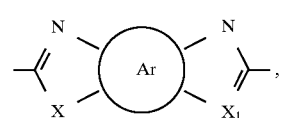
Formula II

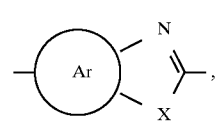
Formula III

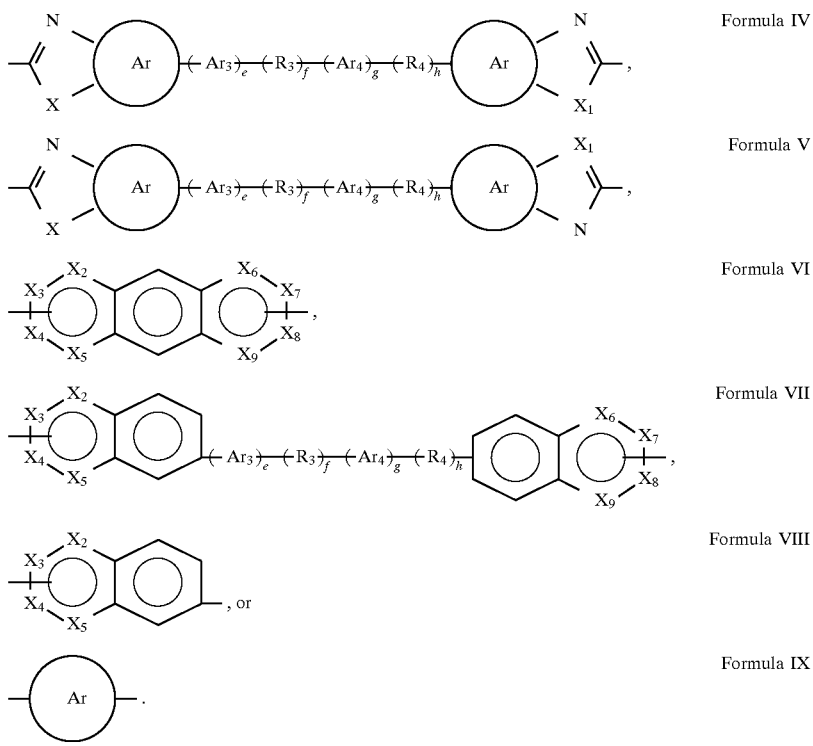

Formula IV

Formula V

Formula VI

Formula VII

Formula VIII

Formula IX

Ar is a monocyclic or polycyclic aromatic moiety having 6 to 18 ring atoms in said moiety or a nitrogen-, oxygen- or sulfur-containing heterocyclic moiety having from 5 to 18 ring atoms in said moiety, any one of which moieties may be unsubstituted or substituted with one or more lower alkyl, lower alkoxy, aryl or alkaryl, aralkyl, aroxy, nitro, hydroxy or halogen groups;

X and $X_1$ are each independently NR, oxygen or sulfur and each R is independently hydrogen or lower alkyl;

$Ar_1$, $Ar_2$, $Ar_3$ and $Ar_4$ are each independently a monocyclic or polycyclic aromatic moiety having 6 to 18 ring atoms in said moiety or a nitrogen-, oxygen- or sulfur-containing heterocyclic moiety having 5 to 18 ring atoms in said moiety, any of which moieties may be unsubstituted or substituted with one or more lower alkyl, lower alkoxy, aryl, alkaryl, aralkyl, aroxy, nitro, hydroxy or halogen groups;

$R_1$, $R_2$, $R_3$ and $R_4$ are each independently vinylene or ethynylene;

$X_2$, $X_5$, $X_6$ and $X_9$ are each independently nitrogen or $CR_5$, and $X_3$, $X_4$, $X_7$ and $X_8$ are each independently nitrogen or $CR_5$ when not forming a point of attachment, with the proviso that at least one but no more than two of $X_2$, $X_3$, $X_4$, and $X_5$ is nitrogen and at least one but no more than two of $X_5$, $X_6$, $X_7$ and $X_5$ is nitrogen and each $R_5$ is independently hydrogen, nitro, halogen, lower alkyl, lower alkoxy, alkaryl, aralkyl, a monocyclic or polycyclic aromatic moiety having 6 to 18 ring atoms in said moiety or a nitrogen-, oxygen- or sulfur-containing heterocyclic moiety having 5 to 18 ring atoms in said moiety, any of which may be unsubstituted or substituted with one or more halogen, lower alkyl, lower alkoxy or aroxy groups;

a, b, c and d are each independently 0 or an integer from 1 to 12;

e, f, g and h are each independently 0 or an integer from 1 to 6; and n is an integer from 2 to 2000.

The substituents related in the formulae above and as may be recited elsewhere in this specification are described as follows unless otherwise indicated.

A monocyclic or polycyclic aromatic moiety having 6 to 18 ring atoms in said moiety intends radicals formed from an aromatic moiety having 6 to 18 carbon atoms, for example, 6 to 12 carbon atoms and 6 to 10 carbon atoms, the number of free valencies forming the radical being indicated by the formulae given above or as may be recited elsewhere in this specification. Preferably, the free valencies forming the aromatic moiety are at ring atoms. Examples of monocyclic aromatic moieties include phenyl and phenylene; an example of a polycyclic aromatic moiety includes those having ring systems that are fused, preferably ortho-fused, such as naphthyl and naphthylene, or that are joined by one or more single bonds, such as biphenyl and biphenylene.

A monocyclic or polycyclic aromatic compound having from 6 to 18 ring atoms intends aromatic compounds having no free valencies and includes single ring aromatic compounds such as benzene, and polycyclic aromatic ring systems which may be fused or joined by one or more single bonds, such as anthracene, phenanthrene, naphthalene.

A nitrogen-, oxygen- or sulfur-containing heterocyclic moiety having from 5 to 18 ring atoms intends radicals formed from heterocyclic rings which include at least one nitrogen, oxygen or sulfur ring atom but which may also include one or several of such atoms. The number of free valencies forming the radical is indicated by the formulae given above or as elsewhere recited in this specification. It is preferred that the free valencies forming the heterocyclic moiety are at ring atoms, more preferably, carbon ring atoms. The expression includes radicals of saturated and unsaturated heterocyclics insofar as the requisite conjugation is maintained, as well as heteroaromatic rings, which in the practice of the present invention are preferred. The moiety may be formed from a single heterocyclic ring or it may be polycyclic, the latter being formed from fused ring systems, preferably ortho-fused, or from ring systems joined by one or more single bonds. Representative moieties in this regard include thienylene, especially 2,5-thienylene, pyridylene, especially, 2,5-pyridylene.

A nitrogen-, oxygen- or sulfur-containing heterocyclic compound having from 5 to 18 ring atoms intends compounds having no free valencies and includes saturated and unsaturated heterocyclics as well as heteroaromatics which in the practice of the present invention are preferred. The heterocyclic compound may be a single ring compound or a polycyclic compound which may be formed from fused ring systems or ring systems; joined by one or more single bonds.

The lower alkyl groups each contain up to 6 carbon atoms which may be in the normal or branched configuration, including, without limitation, methyl, ethyl, propyl, isopropyl, butyl, isobutyl, t-butyl, amyl, pentyl, hexyl and the like. The preferred alkyl groups contain 1 to 3 carbon atoms of which methyl is most preferred.

The lower alkoxy groups each contain up to 6 carbon atoms which may be in the normal or branched configuration, including without limitation, methoxy, ethoxy, propoxy and the like. The preferred alkoxy groups contain 1 to 3 carbon atoms of which methoxy is most preferred.

The aryl groups are aromatic rings containing 6 to 14 carbon atoms. An aryl group may be a single ring or a combination of multiple rings which may be ortho-fused or joined by one or more single bonds. Examples of aryl groups include phenyl, α-naphthyl, β-naphthyl and biphenyl.

The alkaryl groups each contain up to 16 carbon atoms, with each alkyl group thereof containing up to 6 carbon atoms, which may be in the normal or branched configuration, and with each aryl group thereof containing from 6 to 10 carbon atoms. Preferably each alkyl group contains 1 to 3 carbon atoms and each aryl group contains 6 carbon atoms.

The aralkyl groups each contain up to 16 carbon atoms with each aryl group thereof containing from 6 to 10 carbon atoms and each alkyl group thereof containing up to 6 carbon atoms which may be in the normal or branched configuration. Preferably, each aryl group contains 6 carbon atoms and each alkyl group contains 1 to 3 carbon atoms.

The aroxy (or aryloxy) groups each contain from 6 to 10 carbon atoms, with each aryl group preferably containing 6 carbon atoms.

Halogen includes fluorine, chlorine, bromine, iodine and astatine. Fluorine is preferred.

As employed herein, the hydroxy, nitro and cyano groups are —OH, —NO$_2$ and —CN, respectively.

Vinylene may be in the trans

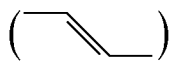

or cis

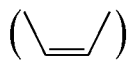

form; trans being preferred.

Ethynylene is —C≡C—.

$n$ is preferably an integer from 10 to 600; more preferably from 20 to 200.

In a first aspect of the present invention, Y has Formula I; and Ar is a monocyclic or polycyclic aromatic moiety having 6 to 12 ring atoms in said moiety. In a first configuration of this first aspect, Ar is

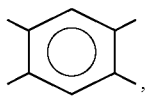

X and X$_1$ are each sulfur, and Ar$_1$ and Ar$_2$, when present, are each independently a monocyclic or polycyclic aromatic moiety having 6 to 10 ring atoms in said moiety. In a first embodiment thereof, Ar$_2$ is

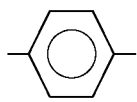

c is 2 and a, b and d are each zero; the resultant polymer being poly(p-biphenylenebenzobisthiazole) (PBBZT), the repeating unit thus having the structure:

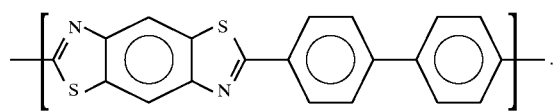

In a second embodiment, Ar$_2$ is

c is 1 and a, b and d are each zero; the resultant polymer being poly(p-phenylenebenzobisthiazole) (PBZT), the repeating unit thus having the structure:

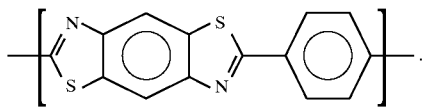

In a third embodiment, Ar$_2$ is

R$_1$ and R$_2$ are each vinylene; b, c and d are each 1 and a is zero; the resultant polymer being poly(benzobisthiazole-1,4-phenylenebisvinylene) (PBTPV), the repeating unit thus having the structure:

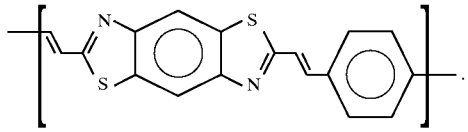

In a fourth embodiment, Ar$_2$ is

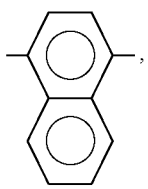

c is 1 and a, b and d are each zero; the resultant polymer being poly(1,4-naphthylbenzobisthiazole) (1,4-PNBT), the repeating unit thus having the structure:

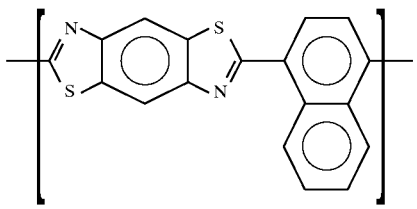

In a fifth embodiment, Ar$_2$ is

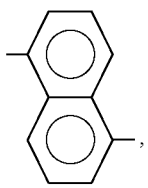

c is 1 and a, b and d ar each zero; the resultant polymer being poly(1,6-naphthylbenzobisthiazole) (1,6-PNBT), the repeating unit has the structure:

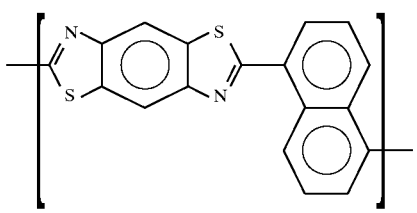

In a sixth embodiment, R$_2$ is vinylene, d is 2 and a, b and c are each zero; the resultant polymer being poly(benzobisthiazole divinylene) (PBTDV), the repeating unit thus having the structure:

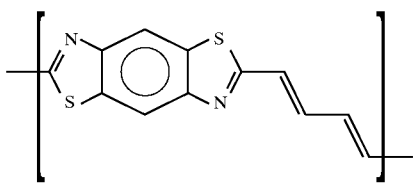

In a seventh embodiment, R$_2$ is vinylene, d is 1 and a, b and c are zero; the resultant polymer being poly(benzobisthiazole vinylene) (PBTV), the repeating unit thus having the structure:

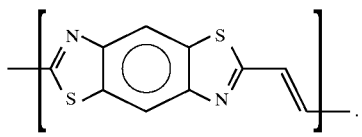

In a second configuration of the present invention wherein Y has Formula I, Ar is

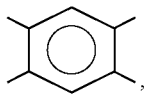

X and X$_1$ are each NR; and Ar$_1$ and Ar$_2$, when present, are each independently a monocyclic or polycyclic aromatic moiety having 6 to 10 ring atoms in said moiety. In a first embodiment thereof X and X$_1$ are each NH, and a, b, c and d are each zero; the resultant polymer being poly(benzobisimidazole) (PBI), the repeating unit thus having the structure:

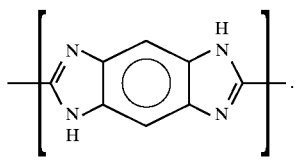

In a second embodiment, X and X$_1$ are each NH, Ar$_2$ is

c is 1 and a, b and d are each zero; the resultant polymer being poly(p-phenylene benzobisimidazole) (PBZI), the repeating unit thus having the structure:

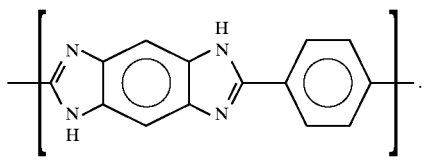

In a third embodiment, X and X$_1$ are each NH, R$_2$ is vinylene, d is 2 and a, b and d are each zero; the resultant polymer being poly(benzobisimidazole divinylene) (PBIDV), the repeating unit thus having the structure:

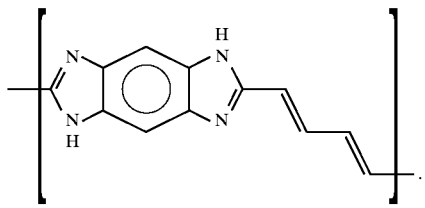

In a fourth embodiment, X and X$_1$ are each NH, R$_2$ is vinylene, d is 1 and a, b and d are each zero; the resultant polymer being poly(benzobisimidazole vinylene) (PBIV), the repeating unit thus having the structure:

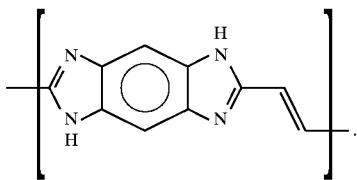

In a fifth embodiment, X and $X_1$ are each NH, $R_1$ and $R_2$ are each vinylene, $Ar_2$ is

b, c and d are each 1 and a is zero; the resultant polymer being poly(benzobisimidazole-1,4-phenylene bisvinylene) (PBIPV), the repeating unit thus having the structure:

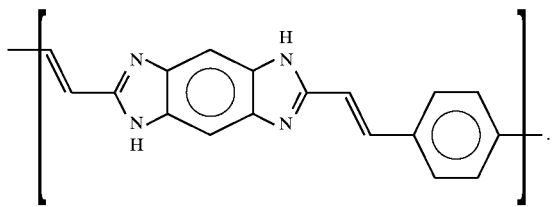

In a third configuration of the present invention wherein Y has Formula I, Ar is

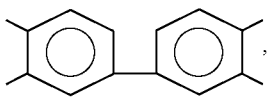

and X and $X_1$ are each independently NR. In a first embodiment thereof X and $X_1$ are each NH; $R_2$ is vinylene, d is 2 and a, b and c are each zero; the resultant polymer being poly(bisbenzoimidazole divinylene) (PBBIPV), the repeating unit thus having the structure:

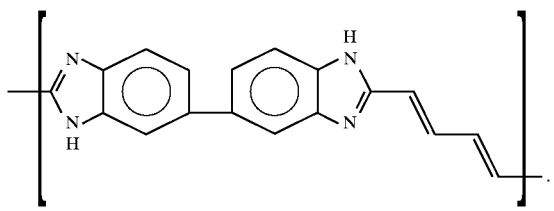

In a second aspect of the present invention, Y has Formula II and Ar is a monocyclic or polycyclic aromatic moiety having 6 to 12 ring atoms in said moiety. In a first configuration of this second aspect of the present invention, Ar is

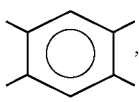

and X and $X_1$ are each oxygen. In a first embodiment thereof, $Ar_2$ is

c is 1 and a, b and d are each zero; the resultant polymer being poly(p-phenylene benzobisoxazole) (PBO), the repeating unit thus having the structure:

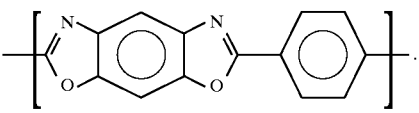

In a third aspect of the present invention, Y has Formula III and Ar is a monocyclic or polycyclic aromatic moiety having 6 to 12 carbon atoms in said moiety. In a first configuration of this third aspect of the present invention, $Ar_2$ is

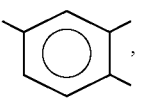

and a, b, c and d are each zero. In a first embodiment thereof, Ar, is

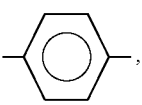

a is 1, and b, c and d are each zero.

In a fourth aspect of the present invention, Y has Formula IX, i.e., Y is Ar. In a first configuration of this fourth aspect of the present invention, Ar is a monocyclic aromatic moiety. In a first embodiment thereof Ar is

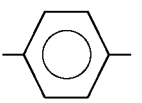

and a, b, c and d are each zero; the resultant polymer being poly(p-phenylene), the repeating unit thus having the structure:

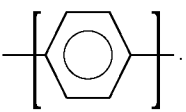

In a second embodiment, Ar is

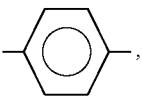

$R_2$ is vinylene, d is 1 and a, b and c are each zero; the resultant polymer being poly(p-phenylene vinylene), the repeating unit thus having the structure:

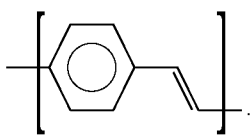

In a second configuration of this fourth aspect of the present invention, Ar is a nitrogen-containing heterocyclic moiety. In a first embodiment thereof, Ar is

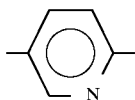

and a, b, c and d are each zero; the resultant polymer being poly(2,5-pyridine), the repeating unit thus having the structure:

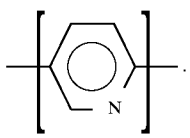

In a third configuration of this fourth aspect of the present invention Ar is a sulfur-containing heterocyclic moiety. In a first embodiment thereof, Ar is

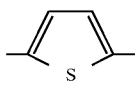

and a, b, c and d are each zero; the resultant polymer being poly(2,5-thiophene), the repeating unit thus having the structure:

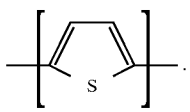

In a second embodiment, Ar is

$R_2$ is vinylene, d is 1, a, b and c are each zero; the resultant polymer being poly(thiophene vinylene), the repeating unit thus having the structure:

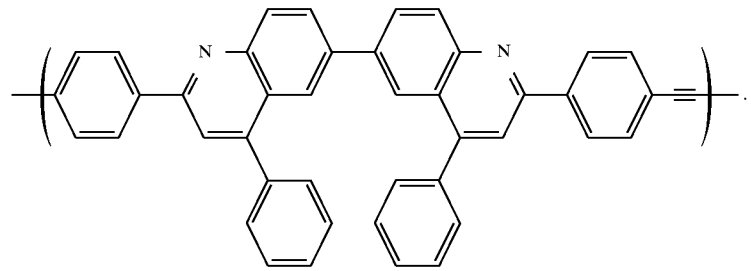

In a fifth aspect of the present invention, Y has Formula VII. In a first configuration of the fifth aspect of the present invention, $X_2$ and $X_6$ are each nitrogen, $X_3$ and $X_7$ are each points of attachment, $X_4$, $X_5$, $X_8$ and $X_9$ are each independently $CR_5$ and e, f, g and h are each zero. Preferably the $R_5$ associated with $X_4$ and the $R_5$ associated with $X_8$ are each hydrogen, and the $R_5$ associated with $X_5$ and the $R_5$ associated with $X_9$ are each phenyl. In a first embodiment thereof, $R_2$ is vinylene, d is 1 and a, b and c are each zero; the resultant polymer being PVPQ, the repeating unit thus having the structure:

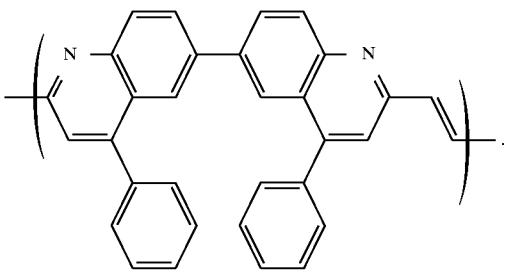

In a second embodiment, $R_2$ is ethynylene, d is 1 and a, b and c are each zero; the resultant polymer being PAPQ, the repeating unit thus having the structure:

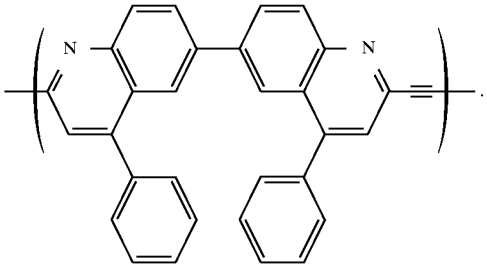

In a third embodiment, $Ar_1$ and $Ar_2$ are each

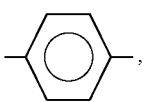

$R_2$ is ethynylene; a, c and d are each 1 and b is zero; the resultant polymer being PBAPQ, the repeating unit thus having the structure:

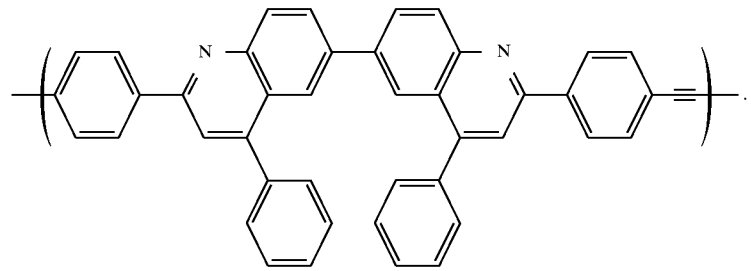

In a fourth embodiment, $Ar_2$ is

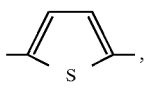

c is 1 and a, b and d are each zero; the resultant polymer being PTPQ, the repeating unit thus having the structure:

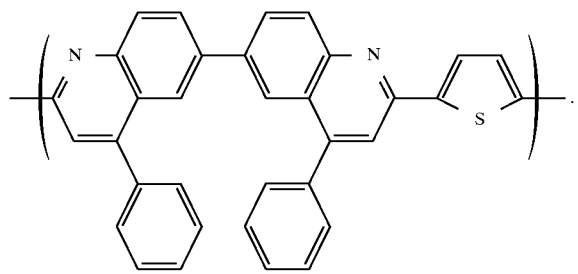

In a fifth embodiment, $Ar_2$ is

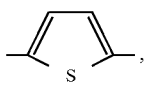

c is is 2 and a, b and d are each zero; the resultant polymer being PBTPQ, the repeating unit thus having the structure:

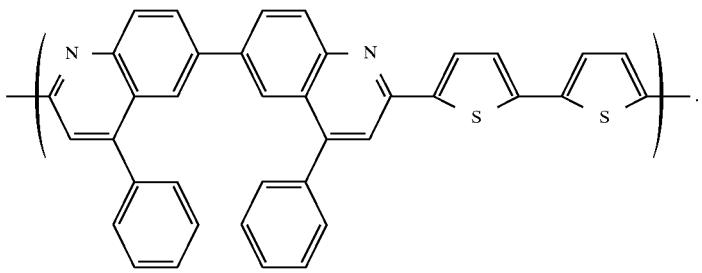

In a sixth embodiment, $Ar_2$ is

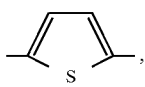

c is 3 and a, b and d are each zero; the resultant polymer being PTTPQ, the repeating unit thus having the structure:

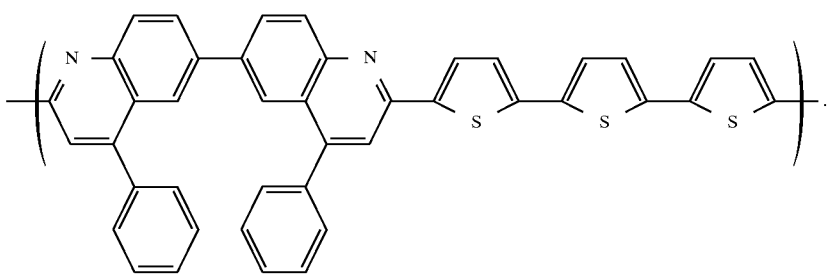

In a seventh embodiment $Ar_1$ and $Ar_2$ are each

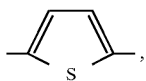

$R_2$ is vinylene, a, c and d are each 1 and b is zero; the resultant polymer being PBTVPQ, the repeating unit thus having the structure:

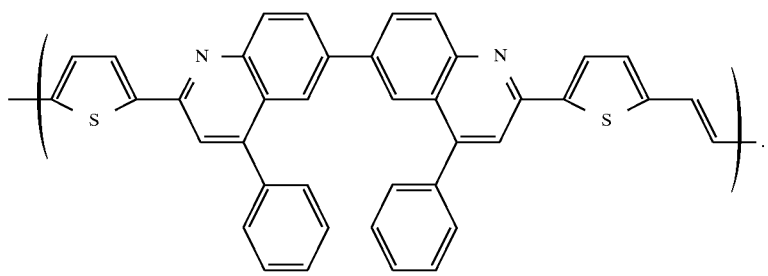

In an eighth embodiment, $Ar_1$ and $Ar_2$ are each

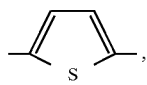

$R_2$ is ethynylene, a, c and d are each 1 and b is zero; the resultant polymer being PBTAPQ, the repeating unit thus having the structure:

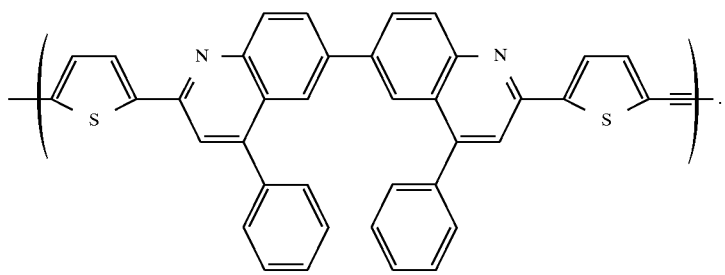

In a ninth embodiment, $Ar_2$ is

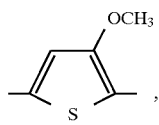

c is 1, and a, b and d are each zero; the repeating unit thus having the structure:

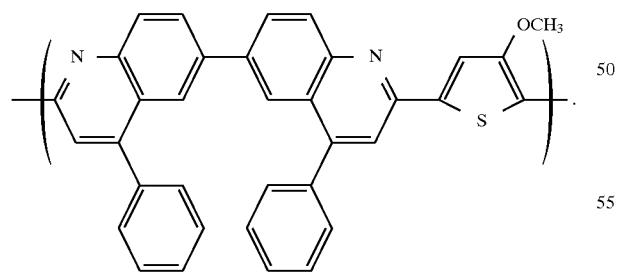

In a tenth embodiment, $Ar_2$ is

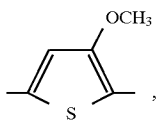

c is 2 and a, b and d are each zero; the repeating unit thus having the structure:

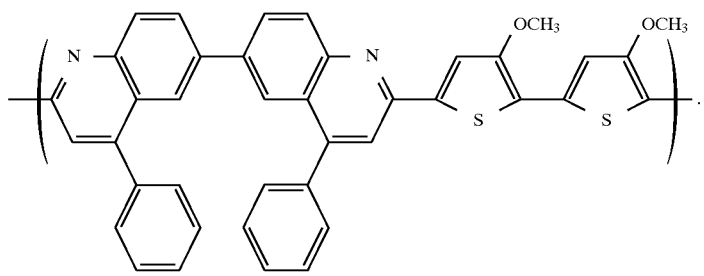

In an eleventh embodiment, $Ar_2$ is

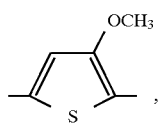

c is 2 and a, b and d are each zero; the resultant polymer being the repeating unit thus having the structure:

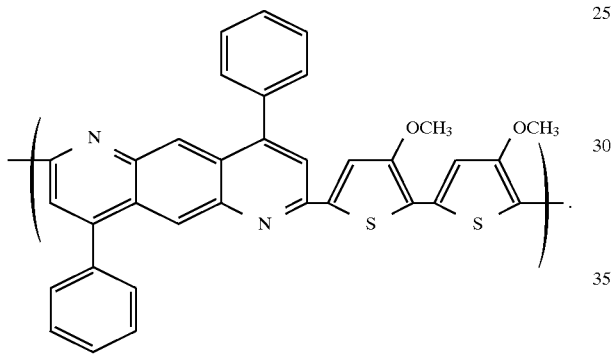

In a sixth aspect of the present invention, Y has Formula VI. In a first configuration of the sixth aspect of the present invention, $X_2$ and $X_9$ are each nitrogen, $X_3$ and $X_8$ are each points of attachment and $X_4$, $X_5$, $X_6$ and $X_7$ are each independently $CR_5$. Preferably, the $R_5$ associated with $X_4$ and the $R_5$ associated with $X_7$ are each hydrogen and the $R_5$ associated with $X_5$ and the $R_5$ associated with $X_6$ are each phenyl. In a first embodiment thereof, $R_2$ is vinylene, d is 1 and a, b and c are each zero; the resultant polymer being PVDA, the repeating unit thus having the structure:

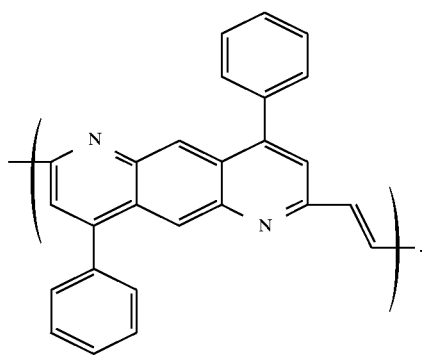

In a second embodiment, $R_2$ is ethynylene, d is 1, a, b and c are each zero; the resultant polymer being PADA, the repeating unit thus having the structure:

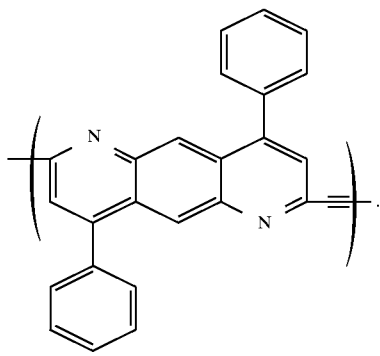

In a third embodiment, $Ar_1$ and $Ar_2$ are each

$R_2$ is vinylene, a, c and d are each 1 and b is zero; the resultant polymer being PSDA, the repeating unit thus having the structure:

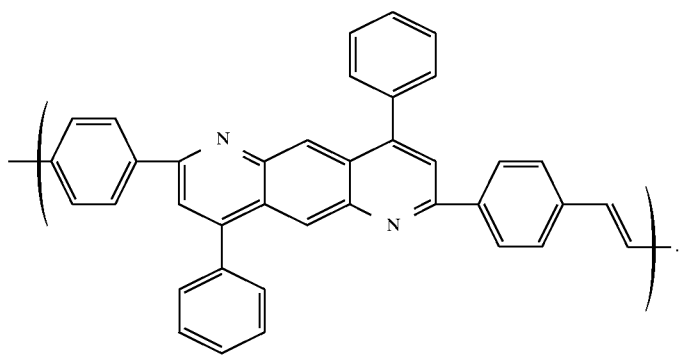

In a fourth embodiment, $Ar_1$ and $Ar_2$ are each

$R_2$ is ethynylene, a, c and d are each 1 and b is zero; the resultant polymer being PBADA, the repeating unit thus having the structure:

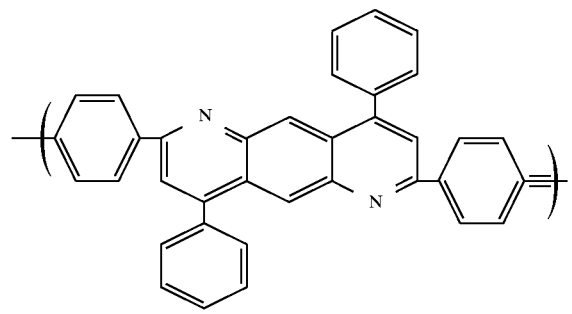

In a fifth embodiment, $Ar_2$ is

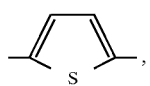

c is 1, a, b and d are each zero; the resultant polymer being PTDA, the repeating unit having the structure:

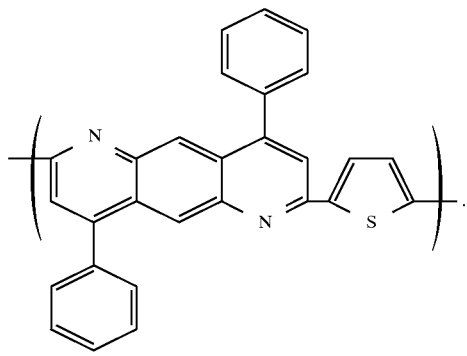

In a sixth embodiment, $Ar_2$ is

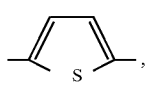

c is 2 and a, b and d are each zero; the resultant polymer being PBTDA, the repeating unit thus having the structure:

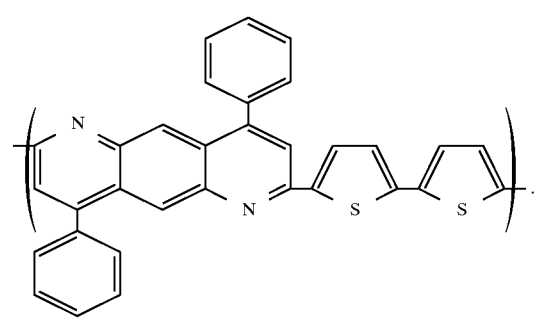

In a seventh embodiment, $Ar_2$ is

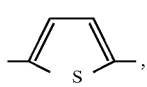

c is 3 and a, b and d are each zero; the resultant polymer being PTTDA, the repeating unit thus having the structure:

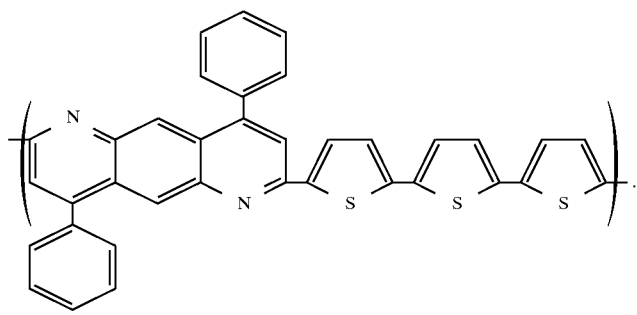

In a eighth embodiment, Ar₁ and Ar₂ are each

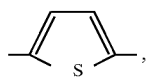

$R_2$ is vinylene, a, c and d are each 1 and b is zero; the resultant polymer being PBTVDA, the repeating unit thus having the structure:

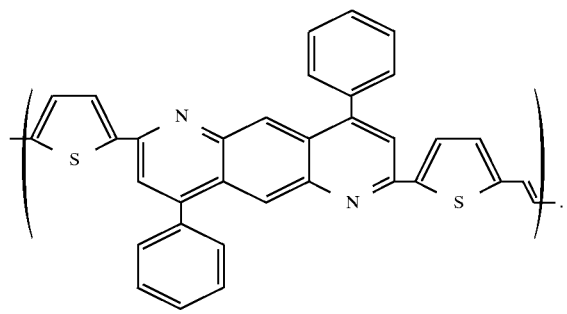

In a ninth embodiment, Ar₁ and Ar₂ are each

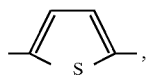

$R_2$ is ethynylene, a, c and d are each 1 and b is zero; the resultant polymer being PBTADA, the repeating unit thus having the structure:

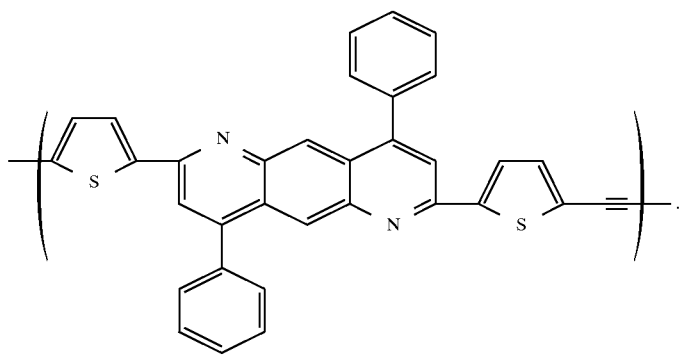

In a tenth embodiment, Ar₂ is

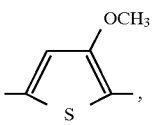

c is 1 and a, b and d are each zero; the resultant polymer being the repeating unit thus having the structure:

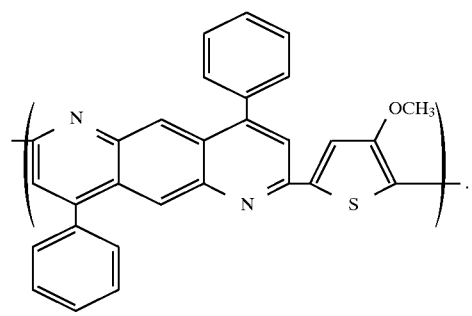

In a seventh aspect of the present invention Y has Formula VII and $X_2$ and $X_6$ are each nitrogen, $X_3$ and $X_7$ are each points of attachment, $X_4$, $X_5$, $X_8$ and $X_9$ are each independently $CR_5$, f is 1 and e, g and h are each zero. Preferably, the $R_5$ associated with $X_4$ and the $R_5$ associated with $X_8$ are each hydrogen, and the $R_5$ associated with $X_5$ and the $R_5$ associated with $X_9$ are each phenyl. In a first configuration of the seventh aspect of the present invention, Ar₂ is

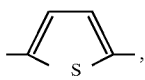

c is 2, R₃ is ethynylene and a, b and d are each zero; the resultant polymer being PBTPQA, the repeating unit thus having the structure:

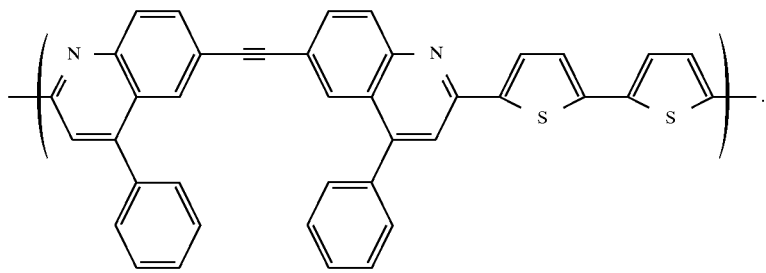

In a first embodiment thereof the phenyls associated with $X_5$ and $X_9$ are each halogen substituted; preferably, each halogen-substituted phenyl has the structure:

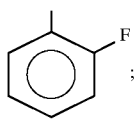

the resultant polymer being PBTPQA-F, the repeating unit thus having the structure:

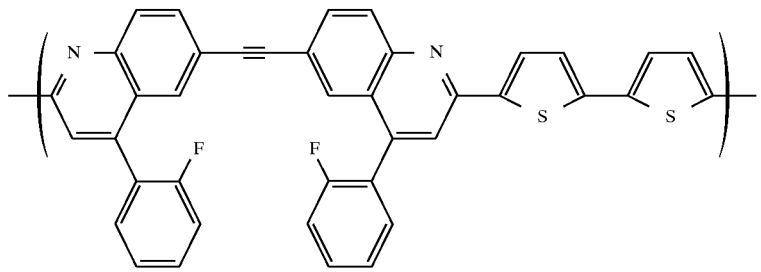

In another practice of this first embodiment, R₃ is vinylene; the resultant polymer being PBTPQV-F, the repeating unit thus having the structure:

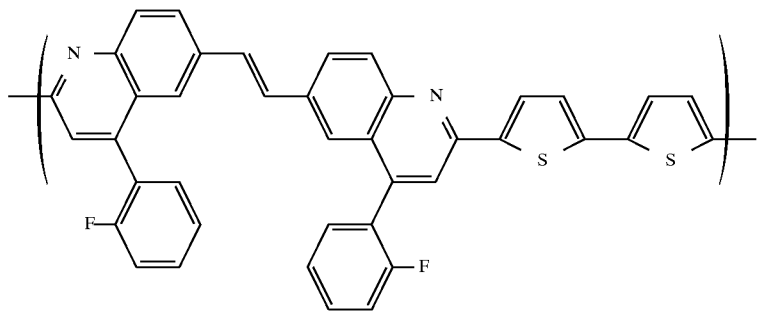

In a second embodiment, the phenyls associated with $X_5$ and $X_9$ are each substituted with alkoxy of up to 4 carbon atoms; preferably, each alkoxy-substituted phenyl has the structure:

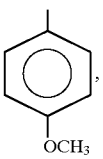

the resultant polymer being PBTPQA-OCH₃ the repeating unit thus having the structure:

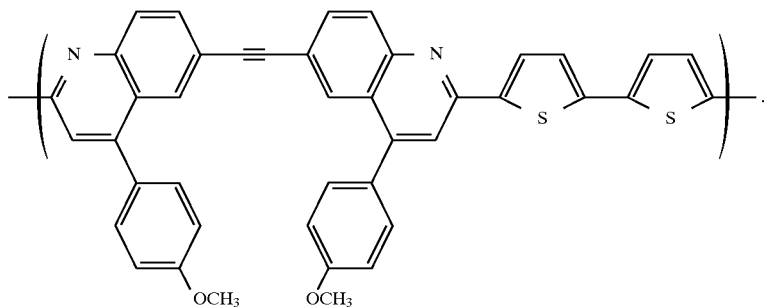

In another practice of this second embodiment, $R_3$ is vinylene; the resultant polymer being PBTPQV-OCH$_3$, the repeating unit thus having the structure:

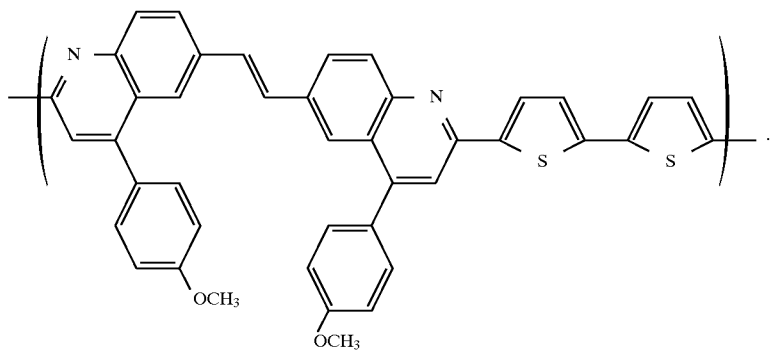

In a third embodiment, Ar$_2$ is

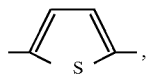

$R_3$ is vinylene, c is 1 and a, b and d are each zero; the resultant polymer being PTPQV, the repeating unit thus having the structure:

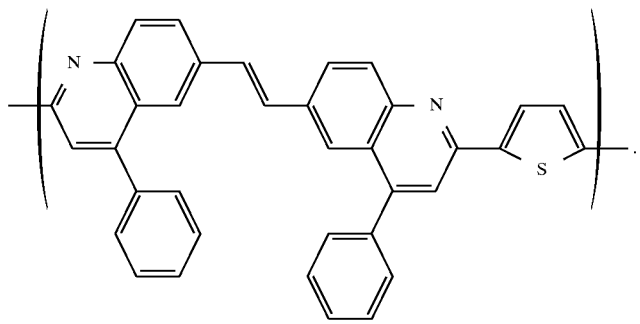

In a fourth embodiment, Ar$_2$ is

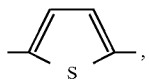

$R_3$ is vinylene, c is 2 and a, b and d are each zero; the resultant polymer being PBTPQV, the repeating unit thus having the structure:

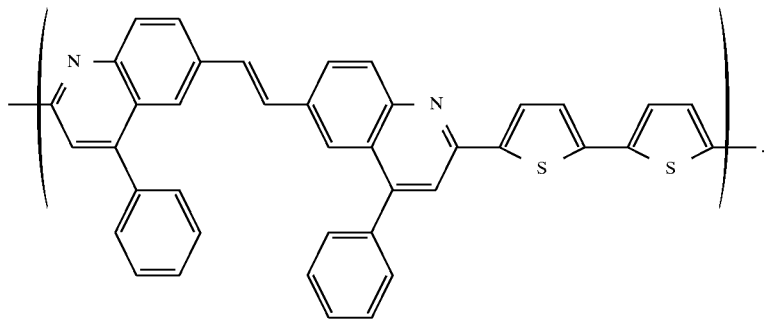

In a fifth embodiment Ar$_2$ is

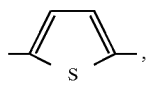

R$_3$ is vinylene, c is 3 and a, b and d are each zero; the resultant polymer being PTTPQV, the repeating unit thus having the structure:

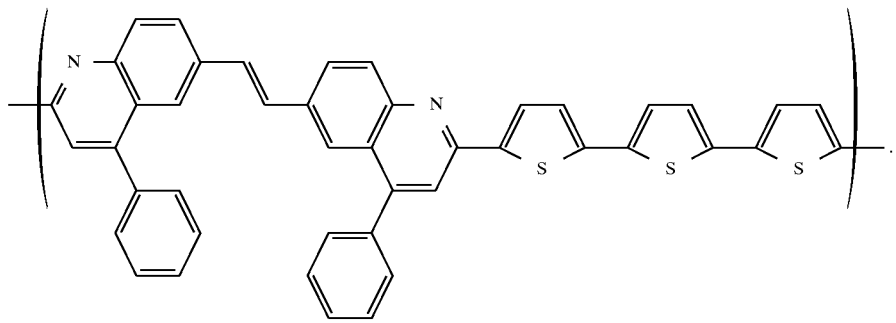

In a sixth embodiment, Ar$_1$ and Ar$_2$ are each

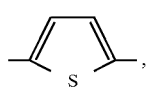

R$_2$ is ethynylene, R$_3$ is vinylene, a, c and d are each 1 and b is zero; the resultant polymer being PBTAPQV, the repeating unit thus having the structure:

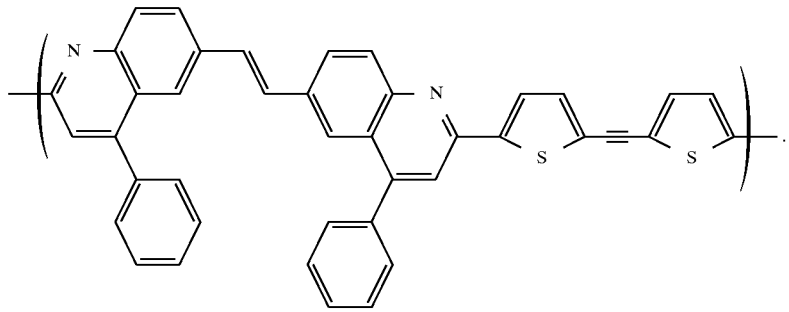

In a seventh embodiment, Ar$_1$ and Ar$_2$ are each

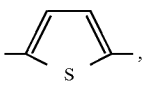

R$_2$ and R$_3$ are each vinylene, a, c and d are each 1 and b is zero; the resultant polymer being PBTVPQV, the repeating unit thus having the structure:

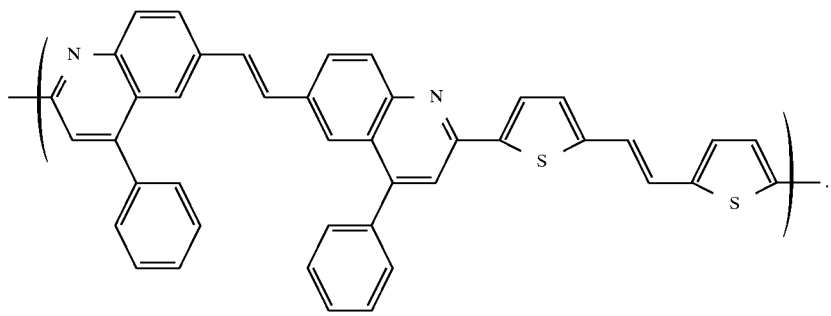
In an eighth embodiment, $Ar_2$ is
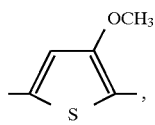
$R_3$ is vinylene, c is 2 and a, b and d are each zero; the resultant polymer being the repeating unit thus having the structure:
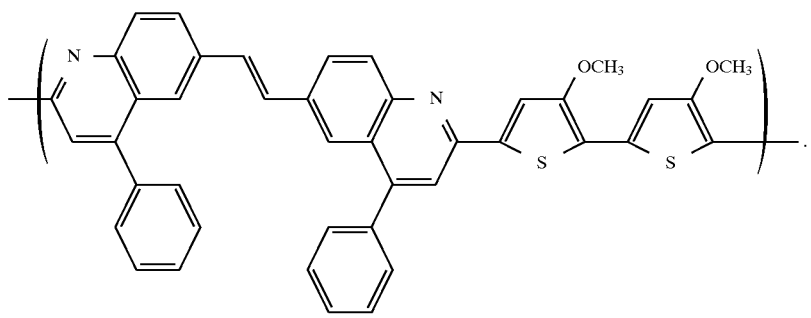
In an eighth aspect of the present invention, Y has Formula II and Ar is
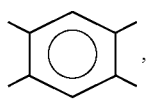 , 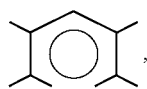 ,
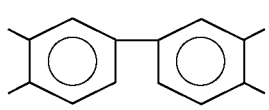
or
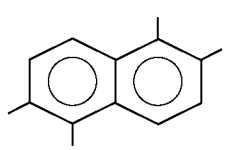 .
$Ar_2$ is  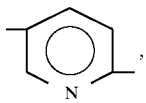 ,
-continued
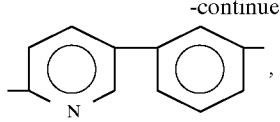
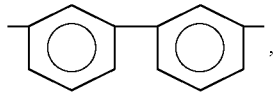
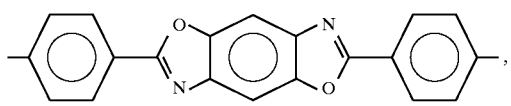
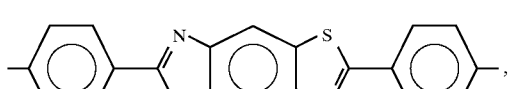

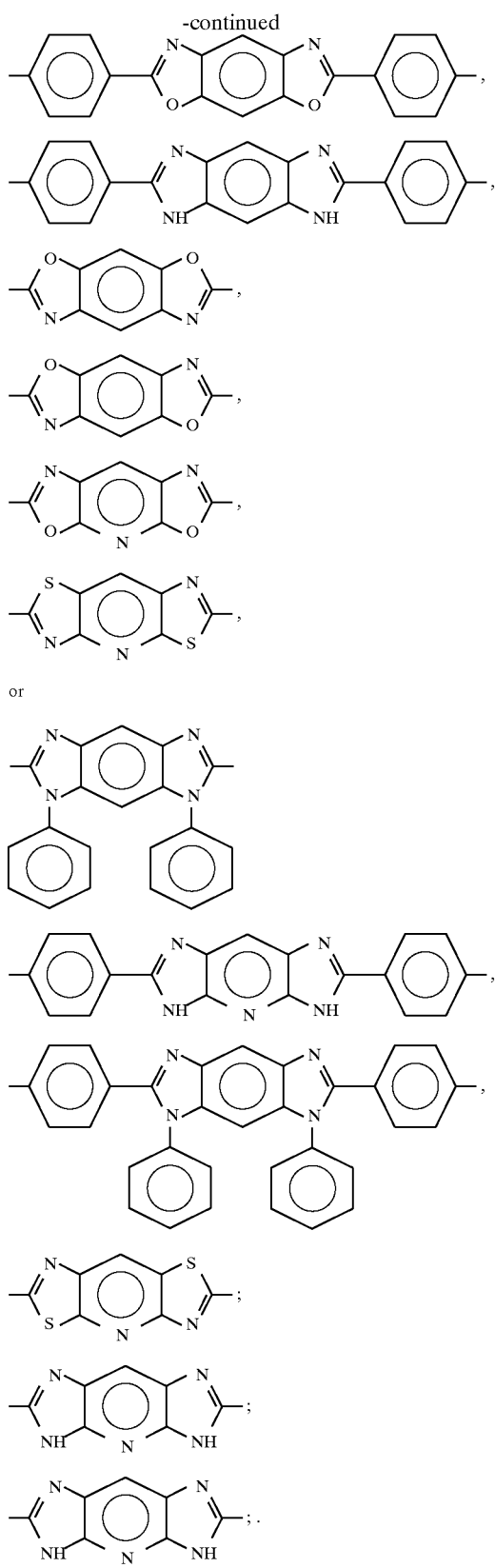

c is 1; and a, b and d are each zero.

In a ninth aspect of the present invention, the η-conjugated polymer comprises a repeating unit having the structure:

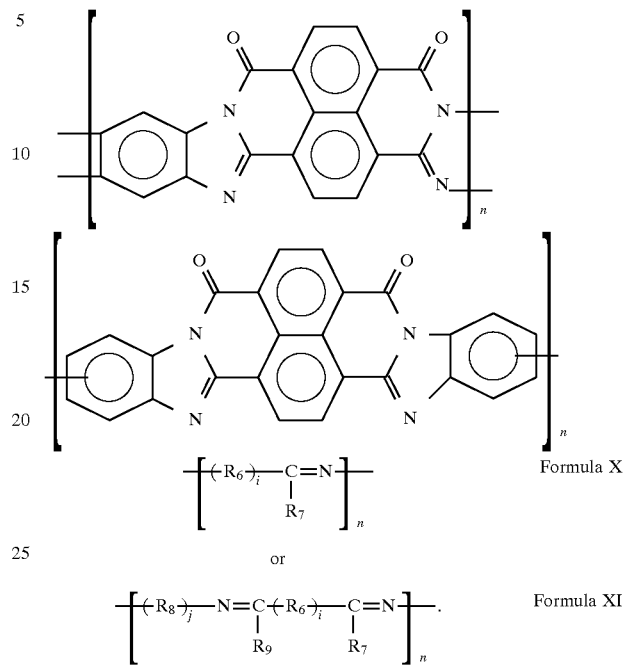

$$\left[ \begin{array}{c} (R_6)_i \!-\! C\!=\!N \\ | \\ R_7 \end{array} \right]_n$$   Formula X or $$\left[ (R_8)_j \!-\! N\!=\!C(R_6)_i \!-\! C\!=\!N \atop \phantom{x} \phantom{x} R_9 \phantom{xxxx} R_7 \right]_n .$$   Formula XI In Formulae X and XI, which are generally directed to polyimines, $R_6$ and $R_8$ are each independently vinylene, ethynylene, a monocyclic or polycyclic aromatic moiety having 6 to 18 ring atoms in said moiety or a nitrogen-, oxygen- or sulfur-containing heterocyclic moiety having 5 to 18 ring atoms in said moiety, any of which moieties may be unsubstituted or substituted with one or more lower alkyl, lower alkoxy, aryl, alkaryl, aralkyl, aroxy, halogen, nitro or hydroxy groups. Also in Formulae X and XI, $R_7$ and $R_9$ are each independently hydrogen, lower alkyl, alkaryl, aralkyl or aryl; i and j are each independently 0 or an integer from 1 to 12 and n is an integer from 2 to 2000.

In a first configuration of this ninth aspect of the present invention, the η-conjugated polymer has Formula XI and $R_7$ and $R_9$ are each hydrogen. In a first embodiment thereof, $R_6$ and $R_8$ are each

and i and j are each 1; the repeating unit thus having the structure:

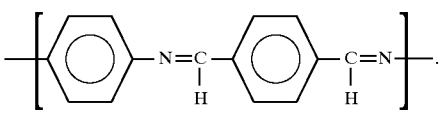

In a tenth aspect of the present invention, the η-conjugated polymer comprises a repeating unit having the structure:

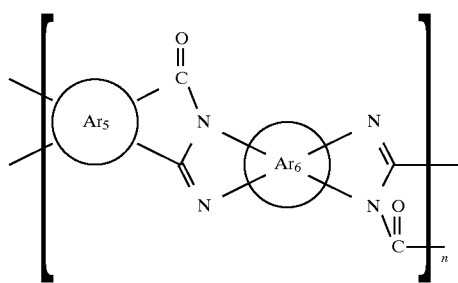

wherein Ar$_5$ is

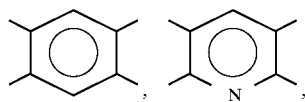

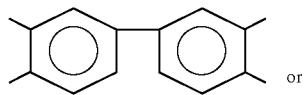

or

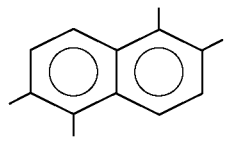

and Ar$_6$ is

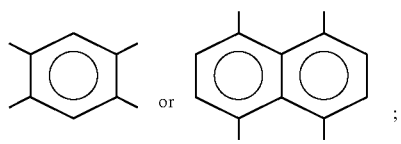

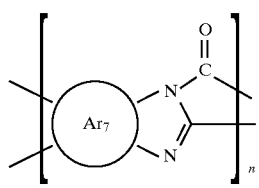

wherein Ar$_7$ is

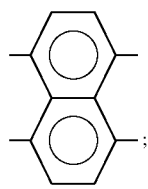

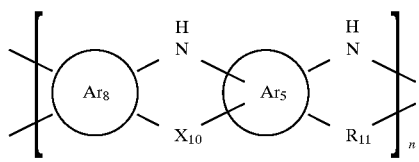

wherein Ar$_8$ is

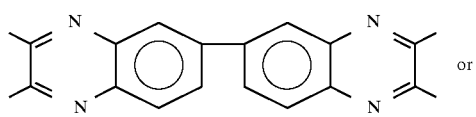

or

-continued

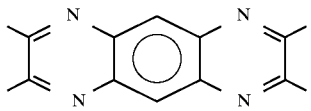

Ar$_5$ has the meaning given above,

X$_{10}$ and X$_{11}$ are each independently sulfur, oxygen or NR$_5$ wherein R$_5$ is hydrogen, lower alkyl, alkoxy or an aryl group;

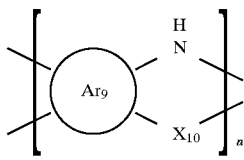

wherein Ar$_9$ is

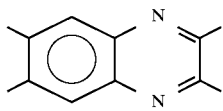

and X$_{10}$ has the meaning given above;

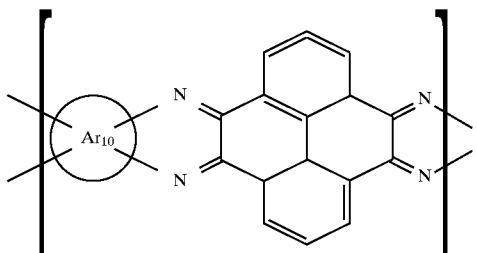

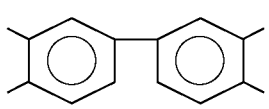

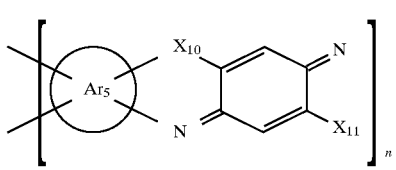

wherein Ar$_5$, X$_{10}$ and X$_{11}$ have the meanings given above and n is an integer from 2 to 2000.

The η-conjugated polymers contemplated by the present invention are not limited to homopolymers having the repeating structural units recited hereinabove. Copolymers of at least two repeating structural units within the scope of one or more of the above generic repeating structural units are within the practice of the present invention.

More particularly in this regard, a η-conjugated polymer contemplated by the present invention may be a random or block copolymer which preferably comprises only two of the repeating structural units as hereinbefore defined. Generally, the mole ratio of a first repeating unit to a second, different repeating unit is anywhere from about 0.5:95 to about 95:0.5. Other mole fractions preferred in this regard are about 90:10 to about 10:90; about 80:20 to about 20:80; about 70:30 to about 30:70; about 60:40 to about 40:60; and about 50:50.
Examples of preferred copolymers in this regard include PBPQ/PBAPQ shown below:
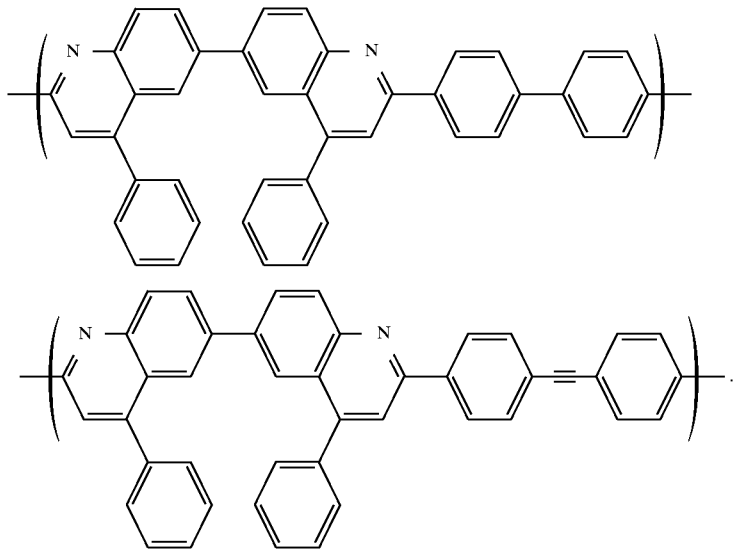
PBAPQ/PSPQ shown below:
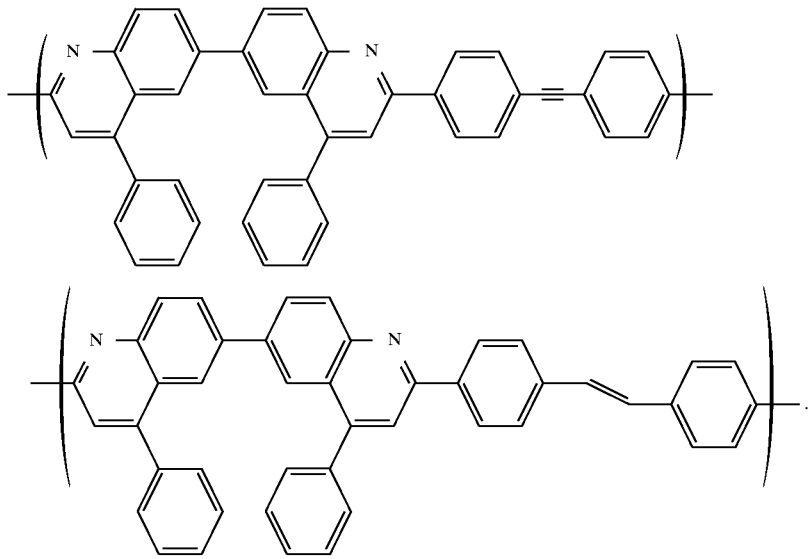
PBTPQA-F/PTBPQ shown below:

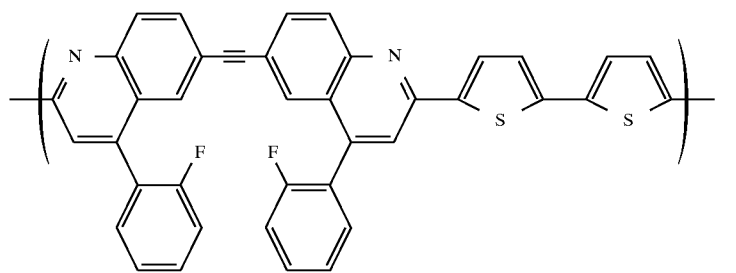
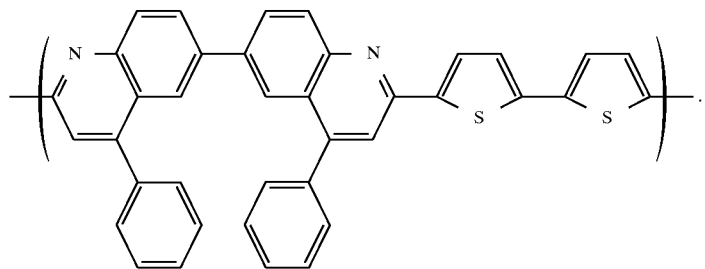
PBTPQA-OCH₃/PBTPQ shown below:
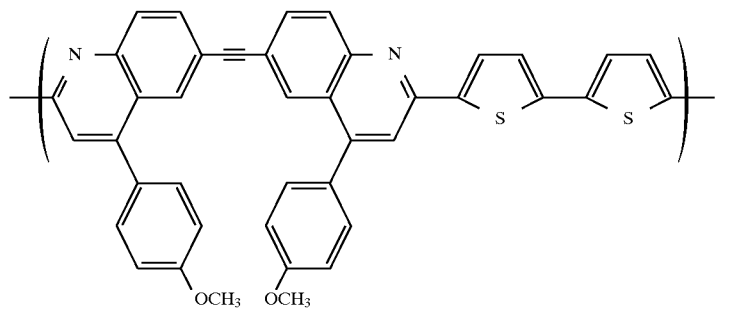
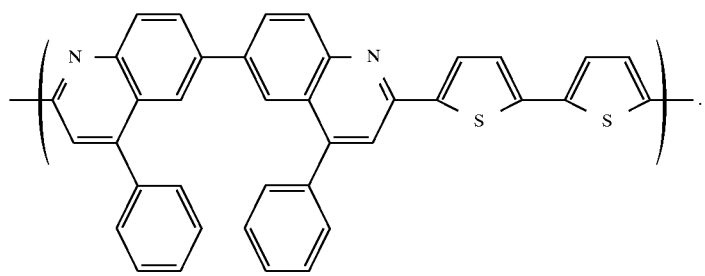
PBPQ/PSPQ shown below:

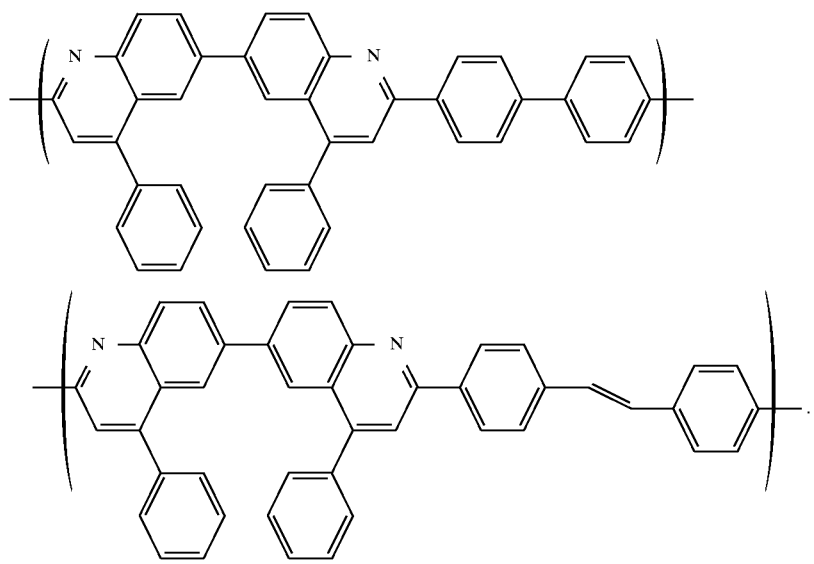

Also among the copolymers contemplated by the present invention is one having the repeating structural unit:

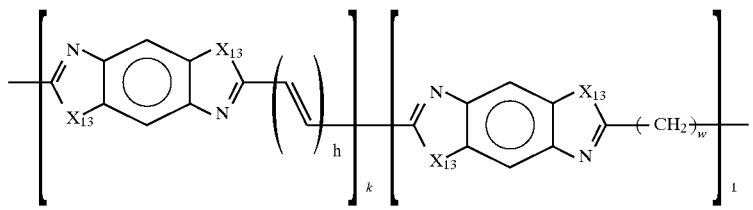

where w is O or an integer from 1 to 18, k and 1 are each independently an integer of 2 to 2000, h is an integer from 1 to 10, and each $X_{13}$ is independently sulfur, oxygen or $NR_{15}$ where $R_{15}$ is hydrogen or lower alkyl.

The preparation and properties of the η-conjugated polymers are generally known in the art or are described in commonly-assigned U.S. Ser. Nos. 146,266 filed Nov. 2, 1993 and 934,610 filed Aug. 24, 1992, the contents of both of which are incorporated herein by reference.

Thus, for example, a η-conjugated polymer which broadly falls within the scope of Formula I where Ar is

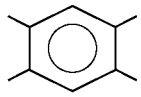

can generally be prepared by dissolving a compound having the structural formula:

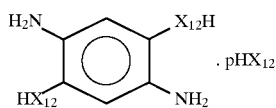

where $X_{12}$ is sulfur oxygen or $NR_{14}$ and $R_{14}$ is hydrogen or lower alkyl. In this formula, p is 2 when $X_{12}$ is sulfur or oxygen and p is 4 when $X_{12}$ is $NR_{14}$, preferably in polyphosphoric acid (PPA). Compounds meeting this formula include, e.g., 1,2,4,5-tetraaminobenzenetetrahydrochloride, 1,4-diamino-2,5-dithiobenzenedihydrochloride and 1,4-diamino-2,5-diolbenzenedihydrochloride. Preferably, these compounds are dehydrochlorinated by first being dissolved in 70% to 80% deaerated PPA. More preferably, 77% PPA is employed, as formed from 100% PPA and 85% phosphoric acid, which dissolves 1,2,4,5-tetraaminobenzenetetrahydrochloride or 1,4-diamino-2,5-dithiobenzenedihydrochloride. The solution is a dihydrochlorinated product and is then contacted with a compound having the structural formula:

$$COOH-R_{15}-COOH$$

or

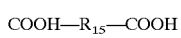

$$COOH-R_{15}-R_{15}-COOH$$

where each $R_{15}$, is the same or different and is alkyl, aryl, aralkyl alkaryl. To compensate for the water of condensation lost in heating, additional phosphorous pentoxide ($P_2O_5$) is added. Compounds meeting this formula include, e.g., fumaric acid, oxidic acid and trans, transmuconic acid. The product is heated for an extended period of time and thereafter cooled. The polymeric product is obtained by precipitation in water and purified by extracting the PPA with water.

Another example, the preparation of η-conjugated polymers broadly falling within the scope of Formula V, especially where Ar is

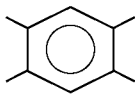

and e, f and h are each zero can be accomplished generally dehydrochlorinating a compound having the structural formula:

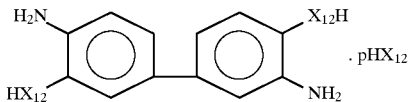

where $X_{12}$ has the meaning given above, in the presence of PPA followed by reacting the dehydrochlorinated product with trans, trans muconic acid. A compound meeting this formula includes 3,3'-diamino benzidine. It is preferred that the PPA utilized in this synthesis is between 80 and 90% weight % PPA.

As contemplated by the present invention, the η-conjugated polymer first component can act as either an electron donor or an electron acceptor, depending primarily upon the character of the second component and whether it is a stronger electron donor or electron acceptor than the η-conjugated polymer first component.

As appreciated by those of skill in the art, an electron acceptor is characterized by the relative ease it can accept electrons, which property is generally established by the measurement known in the art as reduction potential or electron affinity. An electron donor on the other hand is characterized by the relative ease it can give up electrons, which property is generally established by the measurement known in the art as oxidation potential or ionization potential. Both oxidation potential and reduction potential are related to ionization potential and electron affinity, respectively.

For purposes of the present invention, reduction potential and oxidation potential can be measured by conventionally known techniques. A preferred technique in this regard is cyclic voltammetry.

In the practice of the present invention, once a particular η-conjugated polymer is chosen as the first component, a determination can be made as to its reduction potential and its oxidation potential. A suitable electron donor as a second component is that which has an oxidation potential less than that of the η-conjugated polymer. A suitable electron acceptor is that which has a reduction potential greater than that of the η-conjugated polymer.

In the practice of the present invention, the electron donor or acceptor second component is generally a small molecule or polymer, including a η-conjugated polymer as hereinbefore defined with the proviso that it be different from the η-conjugated polymer selected as the first component. A small molecule or polymer in this regard includes, without limitation, a monocyclic or polycyclic aromatic compound having from 6 to 18 ring atoms, a nitrogen-, oxygen- or sulfur-containing heterocyclic compound having from 5 to 18 ring atoms, any of which compounds may be unsubstituted or substituted with one or more lower alkyl, lower alkoxy, aryl, aralkyl, alkaryl, aroxy, cyano, nitro, hydroxy or halogen groups. Examples of suitable compounds in this regard include anthracene, 9,10-dicyanoanthracene, tetracyanobenzene or 9,10-dimethylanthracene.

Other small molecules suitable in this regard includes nitrogen-containing compounds having the structure:

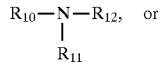 Formula XII

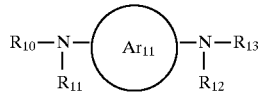 Formula XIII wherein $R_{10}$, $R_{11}$, $R_{12}$ and $R_{13}$ are each independently hydrogen, lower alkyl, aryl, aralkyl, alkaryl, wherein the aryl, aralkyl or alkaryl groups may be substituted with one or more lower alkyl groups; $Ar_{11}$ is a monocyclic or polycyclic aromatic moiety having 6 to 18 ring atoms in said moiety which moiety may be unsubstituted or substituted with one or more lower alkyl groups with the proviso that in Formula XII not more than two of $R_{10}$, $R_{11}$ and $R_{12}$ are hydrogen. Preferably in regard to Formula XII, $R_{10}$ and $R_{11}$ are each alkyl and $R_{12}$ is aryl. Examples of suitable Formula XII nitrogen-containing compounds in this regard include N,N'-dimethylaniline, N,N'- diethylaniline, N,N'-diphenyl-N-N'-bis(3-methylphenyl)-[1,1'-biphenyl]-4,4'-diamine, trip (p-dimethylamino-phenyl)amine or tris(p-tolyl)amine. Tris (p-tolyl)amine is particularly preferred in this regard.

In regard to Formula XIII it is preferred if $R_{10}$, $R_{11}$, $R_{12}$ and $R_{13}$ are each lower alkyl, more preferably ethyl or methyl. Examples of preferred embodiments in this regard include N,N,N',N'-tetramethyl-1,4-phenyldiamine where $Ar_{11}$ is p-phenylene and $R_{10}$, $R_{11}$, $R_{12}$ and $R_{13}$ are each methyl; N,N,N',N'-tetraphenyl-1,4-phenylenediamine where $Ar_{11}$ is p-phenylene and $R_{10}$, $R_{11}$, $R_{12}$ and $R_{13}$ are each ethyl; N,N,N',N'-tetraphenyl-1,4-phenylenediamine where $Ar_{11}$ is p-phenylene and $R_{10}$, $R_{11}$, $R_{12}$ and $R_{13}$ are each phenyl; and N,N,N',N'-tetratolyl-1,4-phenylene diamine where $Ar_{11}$ is p-phenylene and $R_{10}$, $R_{11}$, $R_{12}$ $_{and\ R13}$ are each tolyl, preferably m-tolyl. Other examples of preferred embodiments in this regard include N,N'-ditolyl-(N,N'-diphenyl)4,4'-diamine where $Ar_{11}$ is 1,1'-biphenyl and $R_{10}$ and $R_{13}$ are each phenyl and $R_{11}$ and $R_{12}$ are each tolyl, preferably m-tolyl (TPD); N,N,N',N'-tetraphenyl-(1,1'-biphenyl)-4,4'-diamine where $Ar_{11}$ is 1,1'-biphenyl and $R_{10}$, $R_{11}$, $R_{12}$ and $R_{13}$ are each methyl; and N,N,N',N'-tetraethyl-(1,1'-biphenyl)-4,4'-diamine where $Ar_{11}$ is 1,1'-biphenyl and $R_{10}$, $R_{11}$, $R_{12}$ and $R_{13}$ are each ethyl.

A small molecule or polymer also contemplated by the present invention includes a polymer that has as part of its repeating unit a moiety of the above-defined monocyclic or polycyclic aromatic compounds or nitrogen-, oxygen- or sulfur-containing heterocyclic compounds useful as the electron donor or acceptor component. In this regard, the moiety may appear in the backbone of said polymer or as a side chain or as a substituent attached to said backbone. An example of a polymer in this regard includes polyvinylcarbazole having a repeating unit of the general formula:

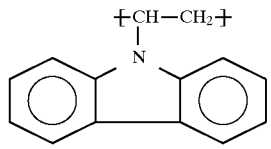

wherein the carbazole moiety falls within the scope of nitrogen-containing heterocyclic compounds contemplated by the present invention as an electron donor or acceptor component, the carbazole moiety appearing as a side group to the backbone of the polymer.

In another aspect, the present invention relates to an assembly comprising the η-conjugated polymer and the electron donor or acceptor component, the η-conjugated polymer and the electron donor or acceptor component having a physical contact relationship in said assembly that is sufficient to permit the exciplex to form when at least one of the η-conjugated polymer or the electron donor or acceptor component is in an excited state.

The assembly can be a bilayer or multilayer structure. Preferably the layers are comprised of thin films of the η-conjugated polymer and the electron donor or acceptor component. Preferably, the films are less than 1000 nm thick; more preferably less than 500 nm thick; still more preferably less than 100 nm thick. In the most preferred practice, optimal exciplex optical and electrical properties are obtained when the thickness of the films is less than or equal to the absorption thickness of the material, the values for which are obtainable from the absorption coefficient of the material as can be conventionally measured. In one embodiment of the bilayer or multilayer assembly, the η-conjugated polymer is contained in a first layer and the electron donor or acceptor component is contained in a second layer, the first layer being adhered to the second layer sufficient to permit the exciplex to form when at least one of the first or the second layers is excited. As contemplated herein, adhered intends a contact relationship between the first and the second layers be it by chemical, mechanical or electrical forces or means which contact relationship is adequate for the exciplex to form. For a multilayer assembly, the first layer, containing a η-conjugated polymer, and the second layer, containing a suitable electron donor or acceptor component, alternate to form a plurality of such layers. In the practice of this aspect of the present invention each "first" layer may contain the same or different η-conjugated polymer and each "second" layer may contain the same or different electron donor or acceptor compounds. Preferably, each "first" layer contains the same η-conjugated polymer and each "second" layer contains the same electron donor or acceptor component.

In a preferred embodiment of the layered assembly, the first or second layer is adhered to a substrate, such as glass, fused silica or an inert polymer, including e.g., polycarbonate, polymethylmethacrylate, poly(ethylene terephthalate) or polystyrene.

In practice, the first and second layers may be formed and adhered as conventionally known in the art. Preferably, the η-conjugated polymer is solubilized using an aprotic solvent, such as a nitroalkane, and a Lewis acid, such as aluminum chloride, as described, for example, in Jenekhe, et al., *Macromolecules* (1989), 22, 3216; Jenekhe, et al., *Macromolecules* (1990), 23, 4419; and commonly-assigned U.S. Ser. No. 934,610, filed Aug. 24, 1992, the contents of which are incorporated herein by reference.

The resulting solution may be applied to a substrate by conventional means, e.g., by spin coating, and the coating may be washed with a Lewis base, such as deionized water, to decomplex the η-conjugated polymer from the Lewis acid.

The films may be dried to remove the water, after which a solution containing the electron donor or acceptor may be applied atop of the η-conjugated polymer coat. The electron donor or acceptor component may be dispersed, for example, in a polycarbonate or like material, and placed into solution with a halogen-containing alkane. It will be appreciated that the order of film formation may be reversed; that is, the electron donor or acceptor-containing coating may be applied to the substrate first, with the η-conjugated polymer coating applied atop of it.

The η-conjugated polymer or electron donor or acceptor may be excited by techniques known in the art. Thus the excited state may be (1) photogenerated by absorption of light, e.g., photoexcitation by laser; (2) electrically generated, by injection of negative and positive charges, e.g., by injecting negative and positive charges into the assembly containing the η-conjugated polymer and the electron donor or acceptor component through electrodes; (3) by electrochemically generating charged ions in the η-conjugated polymer or electron donor or acceptor component; and (4) chemically generating radical ions in the η-conjugated polymer or electron donor or acceptor component.

In another embodiment, the assembly may be a dispersed assembly wherein the η-conjugated polymer is molecularly dispersed in the electron donor or acceptor or a matrix containing the same; or the electron donor or acceptor is molecularly dispersed in the η-conjugated polymer or a matrix containing the same; or both the η-conjugated polymer and the electron donor or acceptor are molecularly dispersed in an inert matrix, such as an inert polymer matrix, e.g., polycarbonate, polymethyl methacrylate, polyethylene terephthalate, polystyrene and like polymers.

The assembly of the present invention, be it layered, dispersed or otherwise, may be part of article of manufacture. Thus, an article of manufacture, such as a light emitting diode, a xerographic photoreceptor, a solar cell, a photodetector, a laser, a waveguide, a switch or a modulator may be comprised of the assembly of the invention and may further comprise means for generating the excited state. Articles such as the devices elaborated above, comprising the assembly of the present invention may be fabricated according to techniques known in the art.

Of especial interest of the optoelectrical devices incorporating an assembly of the present invention are electroluminescent light emitting diodes (LEDs) and photoconductive devices for electrophotographic imaging.

An example of an electroluminescent device for light emission employing the exciplex and assembly of the present invention is shown in FIG. 1. As illustrated in FIG. 1, layer 1 is a transparent substrate such as glass or plastic such as PET; layer 2 is a transparent conductive electrode, such as indiumtinoxide (ITO), or a thin film of gold or a conductive polymer such as polyaniline. Layer 3 is comprised of the η-conjugated polymer as hereinbefore defined. Layer 4 is comprised of the electron donor or acceptor second component as hereinbefore defined; typically, the second component acts as an electron donor and the η-conjugated polymer as an electron acceptor. Layer 5 is a conductive electrode comprised of, e.g., aluminum (Al), magnesium (Mg), calcium (Ca) or combinations thereof. The thickness of layers 1, 2 and 5 are not critical to device performance and may hence be of conventional dimensions. The thickness of either layer 3 or 4, preferably both 3 and 4, are between about 10 to about 1000 nm. By applying a sufficient voltage, V, in the LED of FIG. 1, light is emitted, the emission color from the exciplex depending upon the choice of η-conjugated polymer and electron donor or acceptor component.

It is theorized that electrical excitation of the assembly of the present invention, represented by layers 3 and 4 in FIG. 1, by application of voltage leads to the formation of the same exciplex as when excitation is by absorption of light (photoexcitation). Electrical excitation as in FIG. 1, leads to the injection of electrons from layer 5 into layer 4 and the injection of holes from layer 2 to layer 3 which circumstances result in the charged species (represented in FIG. 1 as the η-conjugated polymer acting as an electron acceptor). These species recombine to give the exciplex, the radiative decay of which results in the light emitted by the device. As discussed herein spectral tunability of emission can be obtained by fixing the choice of η-conjugated polymer (here acting as an electron acceptor, A) and varying the electron donor or acceptor component (here, an electron donor, D) or by fixing the latter and varying the former.

Figure 2:
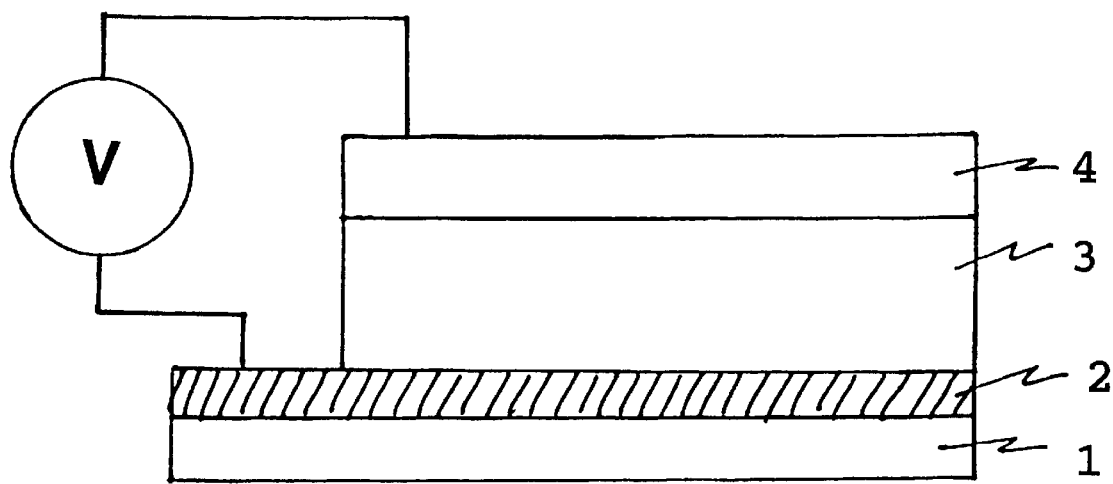
FIG. 2 is a schematic representation of a light emitting diode comprising a dispersed exciplex-forming assembly of the present invention.

Another example of an electroluminescent device employing the exciplex and assembly of the present invention is shown in FIG. 2. As illustrated in FIG. 2, layers 1 and 2 are as defined in FIG. 1 and layer 4 is a conductive electrode comprised of, e.g., aluminum, magnesium, calcium or combinations thereof. Layer 3 constitutes a dispersed assembly of the η-conjugated polymer as hereinbefore defined and an electron donor or acceptor component as hereinbefore defined. In FIG. 2, layer 3 may be a dispersion of the η-conjugated polymer in the electron donor or acceptor component; or a dispersion of the electron donor or acceptor component in the η-conjugated polymer; or a dispersion of the η-conjugated polymer and the electron donor or acceptor component in an inert matrix such as polycarbonate, polymethylmethacrylate, polystyrene or like compounds. The preferred thickness of layer 3 of FIG. 2 is between about 10 to about 1000 nm.

Figure 3:
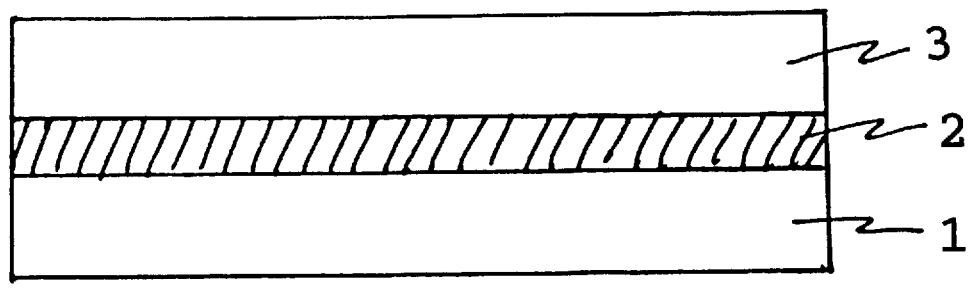
FIG. 3 is a schematic representation of a photoreceptor/photoconductive device for electrophotographic imaging comprising a bilayer exciplex-forming assembly of the present invention.

An example of a bilayer photoreceptor or photoconductive device for electrophotographic imaging employing the exciplex and assembly of the present invention is shown in FIG. 3. As illustrated in FIG. 3, layer 1 is a substrate which is a plastic film coated with a metal conductor, e.g., PET coated with nickel (Ni). Layers 2 and 3 constitute the active photoreceptor material system from which the exciplex forms. Layer 2 is a η-conjugated polymer as hereinbefore defined and Layer 3 is an electron donor or acceptor component as hereinbefore defined. Xerographic imaging with the bilayer photoreceptor of FIG. 3 involves, first, application of a surface charge on top of layer 3 by corona charging. Subsequently, photoexcitation of layer 2, here acting as an electron acceptor, A, leads to the formation of the exciplex of the present invention:

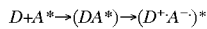
$$D+A^* \rightarrow (DA^*) \rightarrow (D^+ A^-)^*$$

The presence of electric field assists in the dissociation of the exciplex into charge carriers:

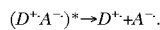
$$(D^+ A^-)^* \rightarrow D^+ + A^-.$$

By changing the composition of the exciplex, i.e., by varying the η-conjugated polymer and/or the electron donor or acceptor component, the charge photogeneration efficiency as well as the wavelength range over which the device is responsive can be varied and controlled.

In another embodiment, the exciplexes of the present invention may be used in or as a self-protecting composite for structures; that is, as stabilizing materials against photodegradation. For example, the η-conjugated polymer and electron donor or acceptor material, in layered or dispersed assembly, may be applied as a coating to structures that are subject or prone to photodegradation. When these structures are exposed to light, an exciplex will form from the η-conjugated polymer and the electron donor or acceptor compound. The energy that would otherwise photodegrade the structure is instead employed for exciplex formation.

In another aspect, the present invention relates to a method of enhancing the opto-electric properties of a η-conjugated polymer. The method comprises forming an exciplex of the η-conjugated polymer and an electron donor or acceptor component, the exciplex having, e.g., enhanced luminescence over the pure polymer and enhanced photogeneration of charge carriers.

In another embodiment, the luminescence of exciplexes formed in accordance with the invention may be color tuned by selecting an appropriate electron donor or acceptor component for a particular η-conjugated polymer or by selecting an appropriate η-conjugated polymer for a particular electron donor or acceptor component. For example, the peak luminescence ($\lambda_{max}$) for exciplexes formed from a particular electron donor or acceptor component with differing η-conjugated polymers has a linear relationship with the reduction potential (V vs. SCE) for each of the η-conjugated polymers. Thus one can predict with reasonable certainty which polymer to employ to obtain a given color by knowing the reduction and/or oxidation potential of that polymer. The same is true if a particular η-conjugated polymer is used and one varies the electron donor or acceptor component, with accompanying measurement of peak luminescence ($\lambda_{max}$) and reduction and/or oxidation potential for the electron donor or acceptor components.

The η-conjugated polymers identified herein may themselves be useful in a process to produce light wherein a source of energy is imposed upon a polymeric film. The polymeric film may be a film of a homopolymer of any of the polymers having a repeating structural unit within the contemplation of any of formulae given above. Moreover, the polymeric film may be a film of a copolymer having a repeating structural unit encompassing two or more repeating structural units of one or more of formulae given above.

The process of producing light by imposing a source of energy upon a polymeric film is moreover preferably characterized by the source of energy provided by a voltage source.

The η-conjugated polymers identified hereinabove may themselves be employed to fabricate a light emitting diode. The light emitting diode includes a polymeric film formed from a homopolymer or a copolymer characterized by one or more, respectively, repeating structural units within the scope of one or more repeating structural units of the formulae given above. The polymeric film of the light emitting diode is in electrical communication with positive and negative electrodes (anode and cathode respectively) which, in turn, are in electric communication with a voltage source.

Although all of the above described elements are required of the light emitting diode of the present invention, additional components and features may be provided. For example, the film may be disposed upon a substrate which may or not be ion-implanted. Furthermore, a portion of the polymeric film may be ion implanted to provide a positive and/or negative charge therein. These features will become readily understandable upon an analysis of specific embodiments of light emitting diodes discussed herein.

Prior to this discussion it is important to emphasize that light emitting diodes here include an LED of transverse geometry and an LED of longitudinal geometry. A polymeric LED of transverse geometry provides vertical surface light emission. A polymeric LED of longitudinal geometry provides edge light emission.

With this introduction, attention is focused initially upon LEDs of transverse geometry. Six embodiments of LEDs of transverse geometry are preferred for use in the present invention.

Figure 8:
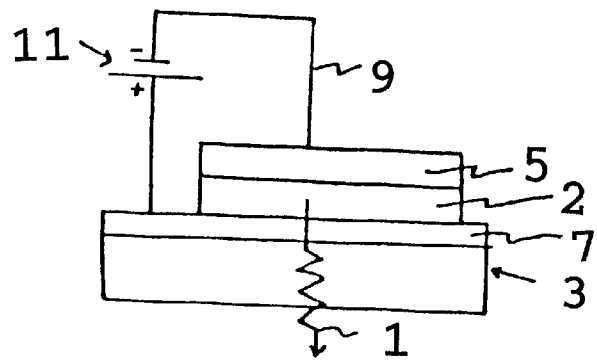
FIGS. 8 to 13 are schematic representatives of light emitting diodes of transverse geometry.

Turning to the first such design, illustrated in FIG. 8, that diode includes a polymeric film of a polymer within the contemplation of the light emitting device of the present invention having at least one repeating structural unit within the contemplation of formulae given above. That film, denoted by reference numeral 2, is disposed upon a substrate 3. A layer of substrate 3, in contact with the film 2, is ionically implanted to provide a positive electrode, that is, an anode identified at 7. In these light emitting diodes, a second, negatively charged electrode, the cathode, denoted at 5, is also included. The cathode 5, like the anode 7, is in electrical communication with the polymeric film 2. The cathode 5 in the LED of FIG. 8 is a metal electrode. Both electrodes 5 and 7 are in electrical communication, through electrical conduit 9, to a voltage source 11. Upon imposition of a electrical charge, the polymeric film emits light through a vertical surface, in this case light emission occurs through the substrate, side as indicated in FIG. 8 by the arrow 1.

It is emphasized that the light emitting device of this invention may include more than one polymeric film layers. The light emitting diode of FIG. 9 is identical to the LED of FIG. 8 but for the inclusion of a laminate of two polymeric films, denoted by film layers 4 and 6, rather than the single layer polymeric film 2 of the light emitting device of FIG. 8.

Figure 9:
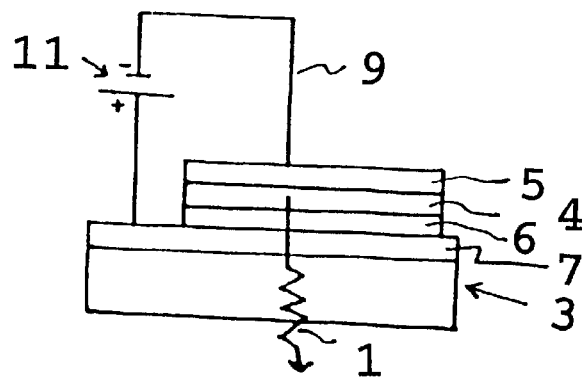

It is noted that the light emitting devices of FIGS. 8 and 9 employ a cathode 5 which covers the complete surface of the polymeric film. A more modestly sized electrode, which does not cover the full surface of the polymeric film, can also be utilized. In this preferred LED embodiment, however, the surface of the film in contact with the electrode is ion-implanted to provide a positive or negative charge. Such an LED is provided in FIG. 10.

Figure 10:
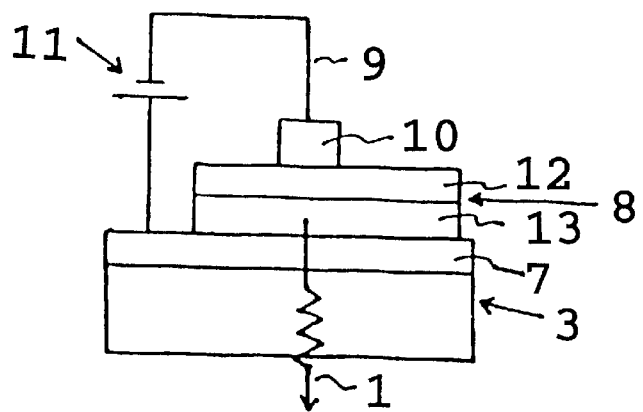

The light emitting diode of FIG. 10 is similar to the light emitting diode of FIG. 8. Thus, the anode is again provided by the same p-type doped portion 7 of the same substrate 3 as FIG. 8. The anode 7 is in electrical communication with a similar voltage source 11 by means of similar electrical conduit 9. However, the polymeric film of the LED of FIG. 10, identified by 8, includes an n-type ion implant layer 12 in electrical communication with a metal cathode 10. The cathode 10 is in electrical communication, again by means of electrical conduit 9, to a voltage source 11. The polymeric film 8 also includes a non-ion implanted layer 13. The LED of FIG. 10 also emits light through a vertical surface, again, as in the LEDs of FIGS. 8 and 9, through the substrate. This is depicted in FIG. 10 by the light designating arrow 1.

Figure 4:
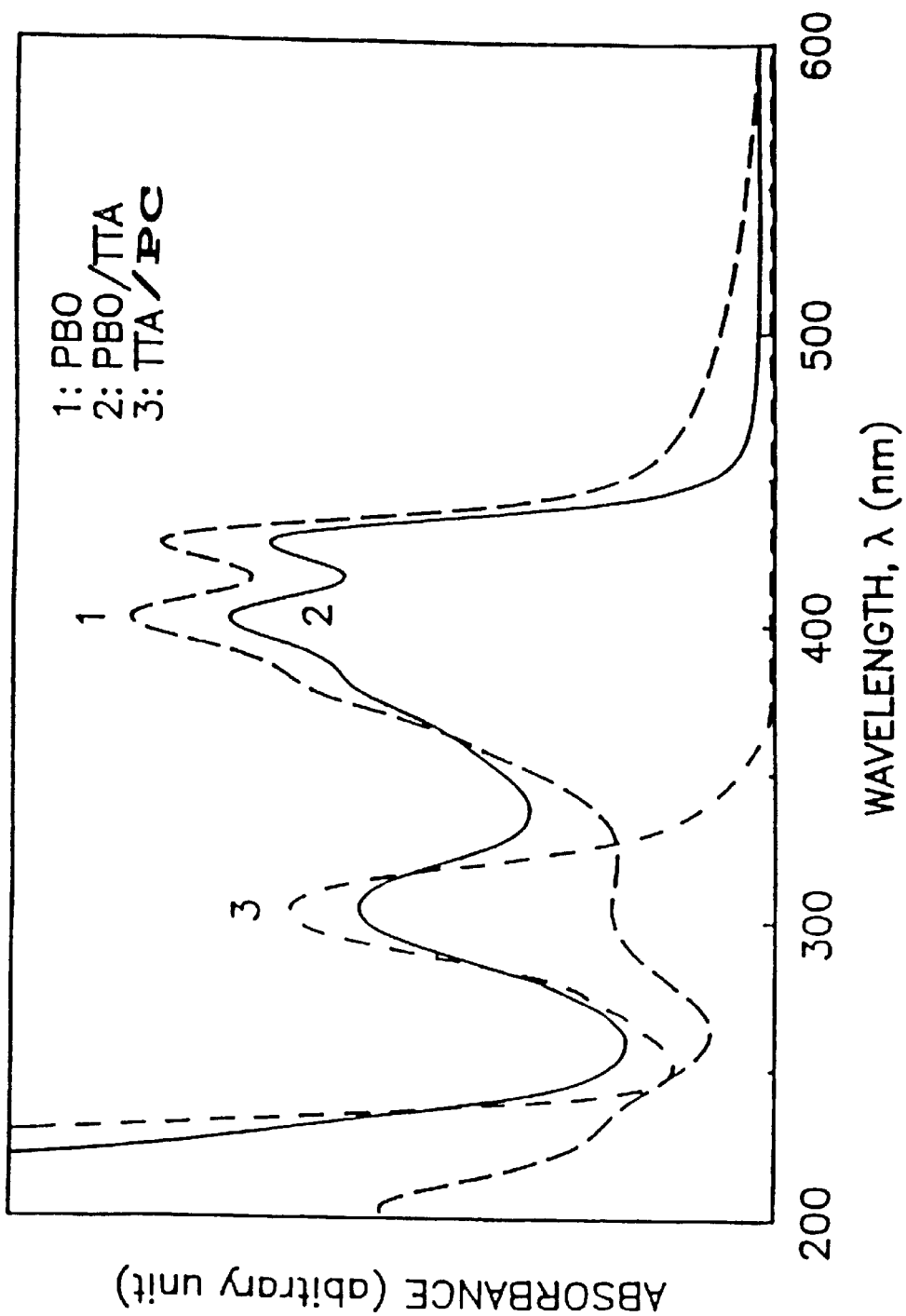
FIG. 4 is a graph depicting the optical absorption spectra of a thin film of tris(p-tolyl)amine dispersed in a matrix of polycarbonate, TTA/PC, Curve 3; a thin film of poly(benzobisoxazole-p-phenylene), PBO, Curve 1; and a bilayer thin film of PBO/TTA, Curve 2.
Figure 11:
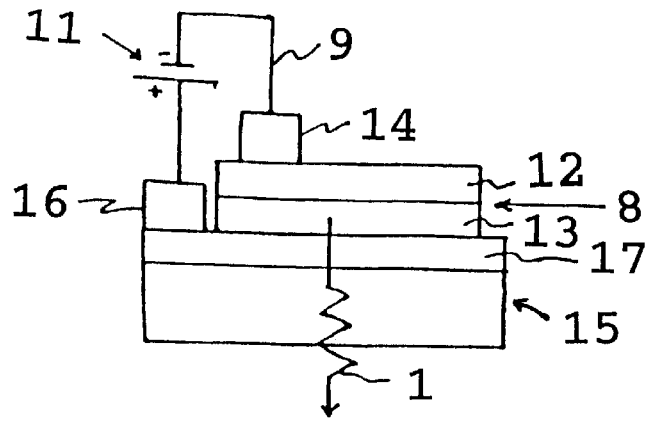

Another embodiment of a light emitting device is depicted in FIG. 11. The light emitting diode of FIG. 11, like the light emitting diodes of FIGS. 8 to 10, is again a vertical surface light emitting diode of transverse geometry. The light emitting diode of FIG. 11 is similar to the light emitting diode of FIG. 10. However, although the polymeric film of the light emitting diode of FIG. 4 is similar to that of FIG. 3, in that they both include a polymeric film 4 which comprises a n-type ion implant layer 12 as well as an undoped layer 13, there are variations in the substrate and the metal electrode elements thereof.

Whereas the substrate 3 of the LED of FIG. 10 includes an electrode layer 7, the substrate of the LED of FIG. 11, denoted at 15, includes a p-type ion implant layer 17. This layer is not an anode in the sense that is electrode 7 of substrate 3. Instead, a metal anode 16 is provided in electrical communication with the p-type ion implant layer 17 of substrate 15.

Figure 12:
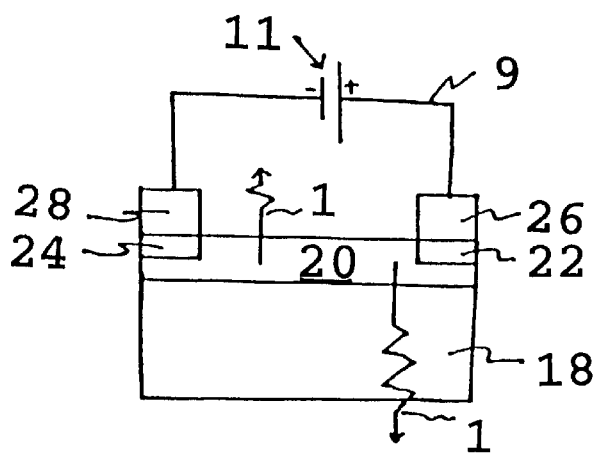

A further embodiment of a light emitting diode is illustrated FIG. 12. The LED of FIG. 12 includes a polymeric film 20 which is doped with a p-type ion implant 22 and an n-type ion implant 24. These ion implant portions of polymeric film 20 are disposed immediately below a metal anode 26 and a metal cathode 28, respectively. These electrodes are in electrical communication, by means of an electrical conduit 9, to a voltage source 11. The polymeric film 20 is disposed on a implant free substrate 18. Light is emitted through the polymeric film as denoted by light arrow 1.

Figure 13:
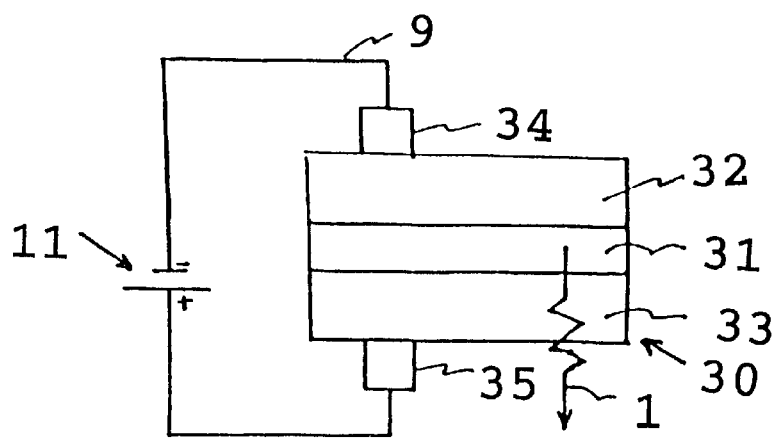

Yet a sixth embodiment of an LED of transverse geometry is depicted in FIG. 13. The LED of FIG. 13 includes a free-standing polymeric film 30 which includes an n-type ion implant layer 32 and a p-type ion implanted layer 33 sandwiching therebetween a non-doped film layer 31. A metal cathode 34 contacts the n-type ion implant layer 32 while a metal anode 35 is in contact with the p-type ion implant layer 33 of the polymeric film 30. As in the LEDs of FIGS. 8 to 12, the cathode 34 and the anode 35 are in electrical communication, by means of electrical conduit 9, with a voltage source 11. Light is emitted vertically through the substrate-free polymer as indicated by arrow 1.

In addition to the light emitting diodes of transverse geometry, illustrated by FIGS. 8 to 13, additional light emitting diodes of longitudinal geometry are employable. These diodes are again polymeric LEDs. An LED of longitudinal geometry is distinguished from an LED of transverse geometry insofar as an LED of transverse geometry provides vertical surface light emission in contradistinction to an LED of longitudinal geometry which emits light through the edges of the film.

Figure 14:
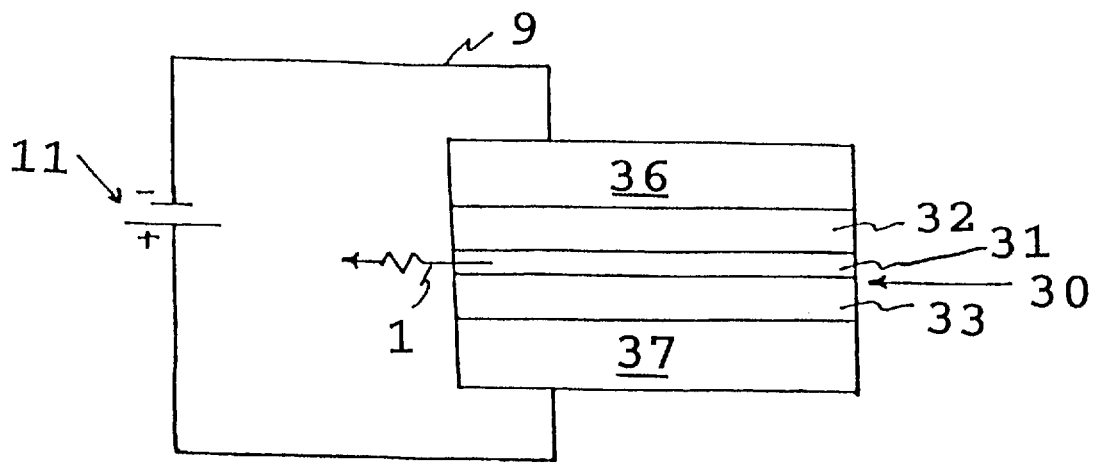
FIGS. 14 and 15 are schematic representations of light emitting diodes of longitudinal geometry.

To illustrate an LED of longitudinal geometry, attention is directed to FIG. 14. The light emitting diode of FIG. 14 incorporates a polymeric film of similar design to that utilized in the light emitting device of FIG. 13. That is, the polymeric film, generally indicated at 30, includes an n-type ion implant layer 32 and a p-type ion implant layer 33 on the surfaces sandwiching therebetween a non-ion implant layer 31.

It is appreciated that reference numerals for the polymeric film of the LED of FIG. 14 are identical with the polymeric film of the LED of FIG. 13. This is because the two freestanding polymeric films of the LEDs of FIGS. 13 and 14 are identical. What distinguishes the LED of longitudinal geometry of FIG. 14 from the LED of transverse geometry of FIG. 13 is the size and disposition of the electrodes. Although both LEDs employ metal electrodes, the metal electrodes employed in the LED of FIG. 14 completely cover polymeric film 30 such that there is no optical transmission between that film and its surfaces. This is illustrated in the LED of FIG. 14 by the metal cathode 36, disposed above the n-type implant layer 32, and the metal anode 37, disposed below the p-type ion implant layer 33. As in the embodiments of LEDs of transverse geometry, the metal electrodes are in electrical communication with a voltage source 11 provided by means of electrical conduit 9. Because metal electrodes 36 and 37 block light transmission, light is emitted from the polymeric film 30 through its edges as indicated by the arrow 1. Obviously, the electrodes 34 and 35 of the LED of transverse geometry of FIG. 6 is not obstruct vertical light emission.

Figure 15:
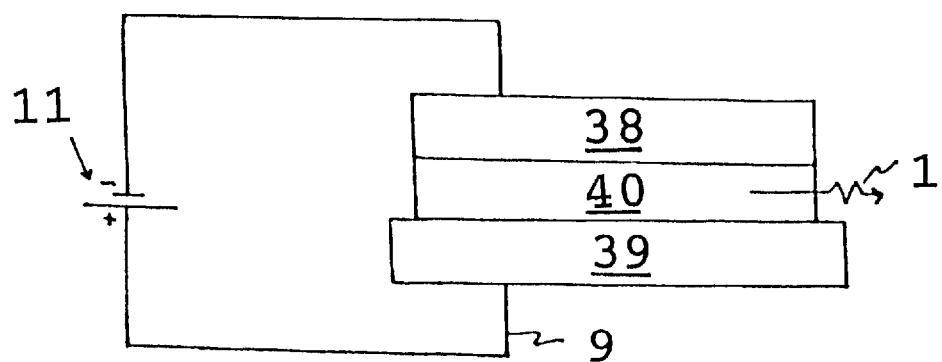

The final preferred embodiment depicted in the drawings is set forth in FIG. 15. FIG. 15 represents another preferred embodiment of an LED of longitudinal geometry. As in the light emitting diode of FIG. 14, the light emitting diode of FIG. 15 encompasses a polymeric film whose principal surfaces are completely covered by metal electrodes. This is depicted in the light emitting diode of FIG. 15 by metal cathode 38 and metal anode 39. The device of FIG. 15 differs from the light emitting device of FIG. 14 in that the polymeric film 40 is undoped. That is, no ion implant layers are provided. Thus, the polymeric film 40 is completely surrounded by electrodes 38 and 39 which block vertical light transmission. As in the light emitting diode of FIG. 14, light is emitted through the polymeric film edges as denoted by the arrow 1.

Several aspects of the afore-described LEDs merit emphasis. The first is that a critical component of the light emitting diode of the present invention is the η-conjugated polymeric film. Although other components of the light emitting diode are important in optimizing its effectiveness, it is the polymeric film which is the key component. Obviously, the light emitting diode also requires an anode and a cathode in communication with the polymeric film and a voltage source in electrical communication with the electrodes.

The remaining components, although important, are not critical. One such important component is the substrate. A substrate, when included in the LED, is utilized as a support to deposit the polymeric film light emitting layer. Obviously, optical characteristics of the substrate material are important. Optical transparency of the substrate permits viewing of emitted light in a direction perpendicular to the plane of the light emitting polymeric film. However, optical transparency of the substrate is not essential. As those skilled in the art are aware, optical transparency is not required where an integrated optics or optical interconnection of electronic devices, where the emitted light is guided to a waveguide, is not employed. In such case, the refractive index of the substrate material must be significantly different from that of the polymer or the waveguide. Independent of its optical properties, the substrate should be rigid if employed in a flat panel display but must be flexible if used in a curved panel display.

As depicted in the drawings illustrating preferred light emitting diodes, the substrate may be provided with a conducting electrode surface. The conducting electrode surface is deposited upon the substrate. Among preferred conducting electrode surfaces deposited upon a substrate are metals, indium tin oxide, polyaniline, an ion implanted polymer of one of the polymers within the contemplation of those polymers useful as the polymeric film of the present invention and the like. It is emphasized that these materials, other than a metallic layer, are optically transparent permitting emitted light to pass therethrough. In the preferred embodiment wherein a metallic layer is utilized, the thickness of the layer is deliberated provided in a layer so thin that it is not light opaque, permitting emitted light to pass therethrough.

The substrate itself is preferably glass or a polymer. Particularly preferred polymers for use as the substrate are such transparent plastics as polycarbonate or poly (methylmethacrylate). These substrates are provided in the form of films.

As noted earlier, many of the polymeric films utilized in the light emitting diode of the present invention are ion implanted. The ion implanted films utilized in the light emitting device of the present invention are transparent in the visible range.

In regard to the ion implantation of the polymeric film, it has been surprisingly found that both n-type and p-type conductivity by means of ion implantation is obtainable. Ions of inert elements including helium, neon, argon, xenon and krypton may be ion implanted to provide either n-type or p-type ion implantation. Of these, argon, krypton and xenon are preferred, especially to provide an n-type ion implantation layer. The halogen elements, fluorine, chlorine, bromine and iodine are employable to provide ion implantation albeit only in forming a p-type ion implanted electrically conductive layer. Elements of the alkaline metals, lithium, sodium and potassium, are particularly preferred to provide an n-type ion implantation layer. The metal cathode utilized in these devices are preferably calcium, indium or aluminum. The metal of the anode is preferably gold or platinum. It is particularly preferred that the metal cathode be calcium and the metal anode be gold.

It is noted that ion implanted polymeric films require less film-metal electrode contact than non-ion implanted films. Thus, polymeric films which are free of ion implantation usually require complete surface contact with a metal electrode. On the other hand, smaller electrodes, providing much less contact with the polymeric surface, may be used where electrode contact is with an ion implant layer of the polymeric film.

The polymeric light emitting diodes employing η-conjugated polymers described herein are preferably prepared by film extrusion, in the case of free standing films, or by spin coating the polymer onto a substrate, in the case of supported films. Spin coating involves coating a solution of the polymer, preferably in a nitroalkane/Lewis acid solvent. Polymeric films produced by spin coating typically have a thickness in the range of between about 20 nm to 5 microns and are not oriented. Extruded films, utilized in free standing films, are oriented and have a thickness in excess of one micron.

The electrodes, in electrical communication with the polymeric film, are metals of the type mentioned above which are preferably vacuum evaporated onto the surface of the polymeric film to which they are in electrical communication.

The following examples are given for illustrative purposes only and should not be taken as forming a limitation of any sort on the scope of the present invention.

EXAMPLE 1–35

Examples 1–35 are directed to the preparation of π-conjugated polymers falling within the scope of Formulae VI and VII, which generally relate to polyanthrazoles and polyquinolines, respectively, and copolymers comprising repeating units of these formulae. In the preparation of these polymers the following materials referred to herein were prepared or obtained as indicated below or otherwise set forth in the examples.

The following monomers were prepared as indicated: 3,3'-dibenzoylbenzidine was synthesized as set forth in *Macromolecules* (1981) 14, 493–502 and *Macromolecules* (1990) 23, 2418–2422. 2,5-dibenzoyl-1,4-phenylenediamine was synthesized as set forth in *J. Polym. Sci., Polym. Chem. Ed.,* (1975) 13, 2233–2249; 5-acetyl-2-amino benzophenone was synthesized as set forth in *J. Heterocycl. Chem.* (1974) 11, 107–111; Diacetylstilbene was synthesized as set forth in *Macromolecules* (1985) 18, 321–327; 5,5'-Diacetylbiphenylacetylene was synthesized as set forth in *Macromolecules* (1986) 19, 257–266; Hex-3-ene-2,4-dione was synthesized as set forth in *Bull. Soc. Chim. Fr.* 1957, 997–1003. Hex-3-yne-2,4-dione was synthesized as set forth in *J. Chem. Soc., Perkin Trans. I* (1987) 1579–1584; 2,5-diacetylthiophene was synthesized as set forth in *J. Org. Chem.* (1982) 47, 3027–3038. Di-m-cresyl-phosphate (DCP) was synthesized as set forth in *J. Polym. Sci., Polym. Symp.,* 1978, 65, 41–53.

4,4'-diacetyl-1,1'-biphenylene (methanol), 1,4-diacetylbenzene (benzene), and 4,4'-diacetyldiphenylmethane (toluene) were obtained commercially and purified by recrystallization. All other materials were used as obtained: dibenzyl phosphate (Aldrich); diethyl dithiophosphate (Aldrich); bis(2-ethylhexyl) hydrogen phosphate (Aldrich); diphenyl phosphate (Aldrich); triphenyl phosphate (Aldrich); $AlCl_3$ (Aldrich); $GaCl_3$ (Sigma); triethylamine (Baker).

Example 1

Preparation of the monomer 1,2-Bis(5-acetyl-2-thienyl) ethylene: To a slurry of 1 g tetrakis(triphenyl phosphine)

Palladium (0) in 30 ml of dry toluene was added a solution of 6.6 g (32.2 mmol) of 2-acetyl-5-bromo thiophene in 30 ml of dry toluene under argon. The light brown solution so obtained was heated to reflux. To this solution was added dropwise a solution of 9.8 g (16.1 mmol) of (E)-1,2-bis(tri-n-butyl stannyl) ethylene, as described in *Dokl. Akad. Nauk. SSSR* 174, 96, (1967) in 50 ml of toluene (dry) over a period of 1.5 h. After refluxing the reaction mixture for another 5.5 h, it was slowly cooled down to −5° C., and the yellow product was isolated by suction filtration. The product was washed with hexane to remove most of the tri-n-butyltin bromide and dried before it was recrystallized from chloroform. On drying in a vacuum oven at 60° C. for 24 hr., a yield of 3.23 g (72.6%) having the following characteristics was obtained. mp 247.6° C.; UV/vis $\lambda_{max}$ (CHCl$_3$): 413 (log $\epsilon$=4.54), 392 (4.66); FT-IR (KBr, cm$^{-1}$): 3070, 3014, 1655, 1646, 1528, 1459, 1423, 1363, 1276, 1263, 1224, 1075, 1032, 983, 929, 805, 747, 714, 655, 612, 592, 578, 500, 480; $^1$H NMR (CD$_2$Cl$_2$, 300 MHz, TMS) δ 2.53 (s,6H), 7.15 (d,2H), 7.21 (s,2H), 7.60 (d,2H). Anal. calc. for C$_{14}$H$_{12}$S$_2$: C, 60.84, H, 4.38; N, 0.0. Found: C, 60.55; H, 4.22; N, 0.0.

Example 2

Preparation of the monomer 5,5'-Diacetyl-2,2'-bithiophene: To a slurry of 1 g tetrakis(triphenyl phosphine) Palladium (0) in 30 ml of dry toluene was added a solution of 6.26 g (30.5 mmol) of 2-acetyl-5-bromo thiophene in 30 ml of dry toluene under argon. The reaction was heated to reflux and to this solution was added dropwise a solution of 5 g (15.26 mmol) of hexamethylditin (99%) in 50 ml toluene (dry) over a period of 1.5 h. The reaction mixture was refluxed for another 6 h and then cooled down to −5° C. Light yellow crystals of the product were isolated by suction filtration and were washed with hexane. The product was then continuously extracted through Whatman filter paper #42 with dioxane using a soxhlet apparatus until all of the product was dissolved and collected in the boiling flask. Slow cooling of the dioxane solution resulted in needle shaped light yellow crystals of the monomer which were separated by suction filtration and dried in vacuum. A Yield of 2.56 g (67%) having the following characteristics was obtained: mp 235° C. (lit. mp 233.5°–234° C.); UV/vis $\lambda_{max}$ (CHCl$_3$): 367 (log $\epsilon$=4.19), 262 (3.57); FT-IR (KBr,cm$^{-1}$): 3070, 1797 1656, 1611, 1511, 1433, 1361, 1302, 1270, 1089, 1036, 1020, 937, 897, 881, 792, 745, 673, 611, 593, 555, 463, 442; $^1$H NMR (CDCl$_3$ 300 MHz, TMS) δ 2.58 (s,6H), 7.30 (d,2H), 7.62 (d,2H). Anal. calcd. for C$_{12}$H$_{10}$S$_2$: C, 57.58; H, 4.03; N, 0.0. Found: C, 57.48; H, 3.87; N, 0.0.

Example 3

Preparation of the monomer 1,2-Bis(5-acetyl-2-thienyl) acetylene: To a slurry of 1 g tetrakis(triphenyl phosphine) Palladium (0) in 30 ml of dry toluene was added a solution of 6.6 g (32.2 mmol) of 2-acetyl-5-bromo thiophene in 30 ml of dry toluene under argon. The light brown solution so obtained was heated to reflux. To this solution was added dropwise a solution of 9.8 g (16.1 mmol) of 1,2-bis(tri-n-butylstannyl)acetylene in 50 ml of toluene (dry) over a period of 2 h. After refluxing the reaction medium for another 6 h, it was cooled down to −5° C., and the yellow product was isolated by suction filtration. The product was washed with hexane to remove most of the tri-n-butyltin bromide. The product was then continuously extracted through Whatman filter paper #42 with dioxane using a soxhlet apparatus until all of the product was dissolved and collected in the boiling flask. Slow cooling of the dioxane solution resulted in needle shaped light yellow crystals of the monomer which were separated by suction filtration and dried in vacuum at 60° C. for 24 h. A yield of 2.56 g (65%) having the following characteristics was obtained: mp 214° C.; V/vis $\lambda_{max}$ (CHCl$_3$): 387 (log $\epsilon$=4.25), 362 (4.31), 281 (3.78); IR (Nujol, cm$^{-1}$): 3070, 1670, 1390, 1295, 1260, 1045, 945, 910, 820; $^1$H NMR (CD2C12, 300 MHz, TMS) δ 7.60 (d, 2H), 7.33 (d,2H), 2.55 (s,6H).

Example 4

Preparation of Poly(2,2'-(p,p'-biphenylacetylene)-6,6'-bis (4-phenylquinoline)) (PBAPQ): Equimolar amounts (3.82 mmol each) of both 3,3'-dibenzoylbenzidine and 5,5'-diacetyl biphenylacetylene were added to a solution of 25 g of di-m-cresyl phosphate (DCP) and 9 g of freshly distilled m-cresol in a cylindrical shaped reaction flask (glass) fitted with a mechanical stirrer, two gas inlets, and a side arm. The reactor was purged with argon for 10–15 min. before the temperature was raised slowly to 140°–142° C. in 2–3 h. As the viscosity of the reaction mixture increased with time, small amounts of m-cresol were added to the reaction mixture to facilitate efficient stirring. The reaction was maintained at this temperature for 48 h under static argon. Thereafter the reaction was quenched by cooling it down to room temperature under argon and precipitating it in 500 ml of 10% triethylamine/ethanol mixture. The precipitated polymer was then chopped in a blender and collected by suction filtration. The polymer was purified by continuous extraction in soxhlet apparatus with 20% triethylamine/ethanol solution for 36 h and was dried in vacuum at 80° C. for 24 h. The PBAPQ polymer obtained had the following characteristics: [η]=8.9 dL/g (25° C., 0.1 mol % DCP/m-cresol); FT-IR (freestanding film, cm$^{-1}$): 3057, 3036, 1586, 1575, 1538, 1519, 1488, 1455, 1410, 1358, 1234, 1181, 1153, 1110, 1065, 1016, 874, 840, 828, 786, 771, 735, 701, 622, 588; Anal. calcd. for (C$_{44}$H$_{26}$N$_2$)$_n$: C, 90.70; H, 4.50; N, 4.84. Found: C, 88.87; H, 4.49; N, 4.69.

Example 5

Preparation of Poly(2,2'-(4,4'-diphenylmethane)6,6'-bis (4-phenylquinoline)) (PDMPQ): PDMPQ was synthesized using the procedure described in Example 4 using equimolar amounts (1.78 mmol each) of 3,3'-dibenzoylbenzidine (18) and diacetyldiphenylmethane as the two monomers. 15 g of diphenyl phosphate with 8 g of m-cresol was used as the reaction medium instead of DCP/m-cresol. The PDMPQ polymer obtained had the following characteristics: [η]=9.3 dL/g (25° C., 0.1 mol % DCP/m-cresol); FT-IR (freestanding film, cm$^{-1}$): 3056, 3028, 1585, 1572, 1541, 1486, 1427, 1353, 1230, 1182, 1152, 1065, 1017, 910, 826, 761, 700, 587; Anal. calcd. for (C$_{43}$H$_{33}$N$_2$)$_n$: C, 90.18; H, 4.93; N, 4.89. Found: C, 85,34; H, 4.51; N, 4.58.

Example 6

Preparation of Poly(2,7-(p,p'-biphenylacetylene)-4,9-diphenyl-1,6-anthrazoline) (PBADA): PBADA was synthesized and isolated according to the procedure described in Example 4 using equimolar amounts (2.21 mmol each) of the monomers 2,5-dibenzoyl-1,4-phenylenediamine and diacetylbiphenylacetylene as reactants which were added to a mixture of 15 g of DCP and 8 g of m-cresol. The PBADA polymer obtained had the following characteristics: [η]=−7.65 dL/g (25° C., 0.1 mol % DCP/m-cresol); FT-IR (freestanding film, cm$^{-1}$): 3037, 2967, 1590, 1558, 1519, 1492, 1453, 1408, 1351, 1288, 1238, 1181, 1052, 1016, 970, 894, 840, 765, 699, 539; Anal. calcd. for (C$_{38}$H$_{22}$N$_2$)$_n$: C, 90.09; H, 4.38; N, 5.53. Found: C, 86.92; H, 4.20; N, 5.23.

Example 7

Preparation of Poly(2,7-(p,p'-stilbene)-4,9-diphenyl-1,6-anthrazoline) (PSDA): PSDA was synthesized and isolated according to the procedure described in Example 6 using equimolar amounts (2.21 mmol each) of 2,5-dibenzoyl-1,4-phenylenediamine and diacetylstilbene as reactants. The PSDA polymer obtained had the following characteristics: $[\eta]$=30.3 dL/g (25° C., 0.1 mol % DCP/m-cresol); FT-IR (freestanding film, cm$^{-1}$): 3028, 2966, 1733, 1590, 1572, 1492, 1453, 1415, 1349 1238, 1181, 1148, 1053, 1015, 969, 894, 840, 765, 699, 533; Anal. calcd. for $(C_{38}H_{24}N_2)_n$: C, 89.74; H, 4.76; N, 5.51. Found: C, 85.66; H, 4.55; N, 5.32.

Example 8

Preparation of Poly(2,7-(4,4'-diphenylmethane)-4,9-diphenyl-1,6-anthrazoline) (PDMDA): PDMDA was synthesized and isolated according to the procedure described in Example 4 using equimolar amounts (2.21 mmol each) of 2,5-dibenzoyl-1,4-phenylenediamine and diacetyldiphenylmethane as reactants in a reaction medium of 15 g DPP and 11.5 g m-cresol. The polymer obtained was worked up as usual. The PDMDA polymer obtained had the following characteristics: $[\eta]$=0.87 dL/g (25° C., 0.1 mol % DCP/m-cresol); FT-IR (freestanding film, cm$^{-1}$): 3027, 1588, 1566, 1528, 1510, 1490, 1451, 1433, 1412, 1363, 1344, 1276, 1234, 1180, 1147, 1110, 1074, 1051, 1030, 1016, 969, 893, 816, 761, 697; Anal. calcd. for $(C_{37}H_{24}N_2)_n$: C, 89.49; H, 4.87; N, 5.64. Found: C, 87.34; H, 4.68; N, 5.40.

Example 9

Preparation of Poly(2,2'-(2,2'-bithiophenyl)6,6'-bis(4-phenylquinoline)) (PBTPQ): PBTPQ was synthesized isolated according to the procedure described in Example 4 using equimolar amounts (1.27 mmol each) of 3,3'-dibenzoylbenzidine and 5,5'-diacetyl-2,2'-bithiophene prepared according to the procedure described in Example 2, as reactants which were mixed with 12 g DCP and 2 g m-cresol. The PBTPQ polymer obtained had the following characteristics: $[\eta]$=11.5 dL/g (25° C., 0.1 mol % DCP/m-cresol); FT-IR (freestanding film, cm$^{-1}$): 3063, 2967, 1586, 1543, 1519, 1489, 1454, 1442, 1360, 1282, 1225, 1076, 871, 823, 787, 767, 701, 621, 590; anal. calcd. for $(C_{38}H_{22}N_2S_2)_n$: C, 79.97; H, 3.89; N, 4.91. Found: C, 78.27; H, 3.89; N, 4.77.

Example 10

Preparation of Poly(2,2'-(2-thienylethynyl-2-thienyl)-6,6'-bis(4-phenylquinoline)) (PBTAPQ): PBTAPQ was synthesized and isolated according to the procedure described in Example 4 using equimolar amounts (1.27 mmol each) of 3,3'-dibenzoylbenzidine and 1,2-Bis(5-acetyl-2-thienyl)acetylene prepared according to the procedure described in Example 3 were mixed with 12 g DCP and 2 g m-cresol. The PBTAPQ polymer obtained had the following characteristics: FT-IR (freestanding film, cm$^{-1}$): 3059, 2969, 1740, 1590, 1544, 1489, 1465, 1359, 1304, 1243, 1149, 1069, 1030, 970, 874, 825, 768, 701, 585; Anal. calcd. for $(C_{40}H_{22}N_2S_2)_n$: C, 80.78; H, 3.73; N, 4.71. Found: C, 77.04; H, 4.12; N, 4.13. Intrinsic viscosity was not determined.

Example 11

Preparation of Poly(2,2'-(2-thienylethenyl-2-thienyl)-6,6'-bis(4-phenylquinoline)) (PBTVPQ): PBTVPQ was synthesized and isolated according to the procedure described in Example 4 using equimolar amounts (1.27 mmol each) of 3,3'-dibenzoylbenzidine and 1,2-Bis(5-acetyl-2-thienyl)ethylene prepared according to the procedure described in Example 1, as reactants which were mixed with 12 g DCP and 2 g m-cresol. The polymer PBTVPQ obtained had the following characteristics: $[\eta]$=6.2 dL/g (25° C., 0.1 mol % DCP/m-cresol); FT-IR (freestanding film, cm$^{-1}$): 3060, 2968, 1586, 1545, 1473, 1360, 1259, 1238, 1066, 1029, 932, 874, 825, 768, 701, 621, 586; Anal. calcd. for $(C_{40}H_{24}N_2S_2)_n$: C, 80.51; H, 4.05; N, 4.69. Found: C, 78.02; H, 4.22; N, 4.71.

Example 12

Preparation of Poly(2,2'-(2,5-thiophenyl)-6,6'-bis(4-phenylquinoline)) (PTPQ): PTPQ was synthesized and isolated according to the procedure described in Example 4 using equimolar amounts (1.78 mmol each) of 3,3'-dibenzoylbenzidine and 2.5-diacetyl thiophene as reactants in 16.5 g DCP and 2 g m-cresol. The PTPQ polymer obtained had the following characteristics: $[\eta]$=10.5 dL/g (25° C., 0.1 mol % DCP/m-cresol); FT-IR (freestanding film, cm$^{-1}$): 3057, 2967, 1586, 1544, 1489, 1451, 1362, 1235, 1150, 1075, 1030, 872, 846, 824, 767, 701, 623, 570; Anal. calcd. for $(C_{34}H_{20}N_2S_1)_n$: C, 83.58; H, 4.13; N, 5.73. Found: C, 81.31; H. 4.02; N, 5.55.

Example 13

Preparation of Poly(2,7-(2,2'-bithiophenyl)-4,9-diphenyl-1,6-anthrazoline) (PBTDA): Equimolar amounts of both 2,5-dibenzoyl-1,4-phenylenediamine (0.5 g) and 5,5'-diacetyl-2,2'-bithiophene (0.3957 g), prepared according to the procedure described in Example 2, were added along with 15 g of diphenyl phosphate (DPP) and 2 g of freshly distilled m-cresol in a glass reactor fitted with mechanical stirrer, two gas inlets, and a side arm. The reaction mixture was purged with argon for 15 min., and then the temperature was slowly raised in steps to 140° C. under positive pressure of argon. The temperature was maintained for 48 h, during which time small amounts of m-cresol were added to facilitate efficient stirring of the reaction mixture whenever it became highly viscous. After cooling, the polymerization dope was slowly poured into the stirred solution of 55 mL of ethanol/500 mL of triethylamine (TEA). The precipitated polymer was then chopped in a blender and collected by suction filtration. The polymer was purified by continuously extracting it with 20% TEA/ethanol solution for 24–36 h and was dried in vacuum at 80° C. The PBTDA obtained had the following characteristics: $[\eta]$=2.3 dL/g (25° C. 1.5 mol % DCP/m-cresol); IR (freestanding film, cm$^{-2}$) 3055, 2964, 1588, 1527, 1492, 1442, 1425, 1358, 1274, 1232, 1074, 1030, 892, 794, 765, 700, 613, 549. Anal. Calcd. for $(C_{32}H_{18}N_2S_2)_n$: C, 77.7; H, 3.67; N, 5.66. Found: C, 75.76; H, 3.59; N, 5.34.

Example 14

Preparation of Poly(2,7-(2,2'-thienylethynyl-2-thienyl)-4,9-diphenyl-1,6-anthrazoline) (PBTADA): PBTADA polymer was prepared using equimolar amounts of 2,5-dibenzoyl-1,4-phenylenediamine (0.5 g) and 1,2- bis(5-acetyl-2-thienyl)acetylene (0.4336 g), prepared according to the procedure described in Example 3 in di-m-cresyl phosphate (DCP) as the solvent medium instead of DPP. The same procedure as described in Example 13 was used for the polymerization. The PBTADA polymer obtained had the following characteristics: $[\eta]$=4.4 dL/g (25° C., 0.1 mol % DCP/m-cresol); IR (free-standing film, cm$^{-1}$) 3055, 2971, 1589, 1530, 1492, 1445, 1427, 1355, 1290, 1240, 1063, 1030, 894, 807, 766, 701, 614, 546. Anal. Calcd. for $(C_{34}H_{18}N_2S_2)_n$: C, 78.74; H, 3.50; N, 5.40. Found: C, 76.82; H, 4.03; N, 4.66.

Example 15

Preparation of Poly(2,7-(2,2'-thienylethenyl-2-thienyl)-4,9-diphenyl-1,6-anthrazoline) (PBTVDA): PBTVDA was synthesized and isolated according to the procedure described in Example 13 using equimolar amounts (1.58 mmol each) of 2,5-dibenzoyl-1,4-phenylenediamine and 1,2-Bis(5-acetyl-2-thienyl)ethylene prepared according to the procedure described in Example 1, as reactants which were reacted in 12 g DCP and 2.5 g m-cresol. The PBTVDA polymer obtained had the following characteristics: [η]=4.4 dL/g (25° C., 0.1 mol % DCP/m-cresol); IR (freestanding film, cm$^{-1}$): 3060, 2968, 1588, 1574, 1532, 1492, 1475, 1357, 1289, 1259, 1239, 1146, 1061, 1030, 959, 934, 895, 796, 765, 748, 702, 616, 545; Anal. calcd. for $(C_{34}H_{20}N_2S_2)_n$: C, 78.43; H, 3.87; N, 5.38. Found: C, 77.38; H, 3.83; N, 5.09.

Example 16

Preparation of Poly(2,7-(2,5-thiopheneyl)-4,9-diphenyl-1,6-anthrazoline) (PTDA): PTDA was synthesized and isolated according to the procedure described in Example 15 using equimolar amounts (1.58 mmol each) of 2,5-dibenzoyl-1,4-phenylenediamine and 2,5-diacetylthiophene as reactants. The PTDA polymer obtained had the following characteristics: [η]=1.2 dL/g (25° C., 0.1 mol % DCP/m-cresol); FT-IR (freestanding film, cm$^{-1}$): 3056, 3028, 1586, 1571, 1529, 1491, 1432, 1354, 1234, 1042, 1030, 892, 851, 805, 763, 698, 616, 587; Anal. calcd. for $(C_{28}H_{16}N_2S_1)_n$: C, 81.53; H, 3.91; N, 6.79. Found: C, 78.68; H, 3.83; N, 6.29.

Example 17

Preparation of the copolymer PBPQ/PBAPQ: 1.27 mmoles of 4,4'-diacetyl-1,11-biphenylene; 1.27 mmoles of 5,5'-diacetylbiphenylacetylene, and 2.55 mmole of 3,3'-dibenzoylbenzidine were mixed together in a reaction medium of 17 g DCP and 16 g/m-cresol. Synthesis and isolation of the copolymer was carried out as described in Example 4. The copolymer obtained had the following characteristics: [η]=25 dL/g (25° C., 0.1 mol % DCP/m-cresol); FT-IR (freestanding film, cm$^{-1}$): 3057, 3033, 2960, 1586, 1539, 1488, 1457, 1357, 1233, 1151, 1154, 1068, 1016, 1004, 872, 827, 771, 701, 623, 590.

Example 18

Preparation of the copolymer PBAPQ/PSPQ: 1.27 mmoles of 4,4'-diacetylstilbene, 1.27 mmoles of 5,5'-diacetylbiphenylacetylene, and 2.55 mmole of 3,3'-dibenzoylbenzidine were mixed together in a reaction medium of 17 g DPP and 15 g m-cresol. Synthesis and isolation of the copolymer was carried out as described in Example 4. The copolymer obtained had the following characteristics: [η]=14.3 dL/g (25° C., 0.1 mol % DCP/m-cresol); FT-IR (freestanding film, cm$^{-1}$): 3057, 3030, 2960, 1586, 1575, 1539, 1488, 1460, 1357, 1235, 1181, 1065, 1015, 828, 771, 701, 588.

Example 19

Preparation of the copolymer PSPQ/PBPQ: 1.27 mmole of 4,4'-diacetylstilbene, 1.27 mmole of diacetyl-1,1'-biphenylene and 2.55 mmol of 3,3'-dibenzoylbenzidine were mixed together in a reaction medium of 17 g DCP and 16 g m-cresol. The reaction was carried out as described in Example 4. The polymer obtained was worked up as usual. [η]=22.6 dL/g (25° C., 0.1 mol % DCP/m-cresol); FT-IR (freestanding film, cm$^{-1}$): 3057, 3029, 2960, 1586, 1574, 1540, 1488, 1457, 1357, 1234, 1182, 1068, 1004, 870, 827, 772, 743, 701, 590.

Example 20

Preparation of 5-Bromo-2-(trifluoroacetamido) benzophenone (hereafter "Compound 1"): To a solution of 17 g (61.6 mmol) of 2-amino-5-bromo benzophenone in 556 ml of diethyl ether (anhydrous) was added 64.3 g (0.61 mol) of anhydrous sodium carbonate. The mixture was cooled in an ice-bath and trifluoro acetic anhydride was added dropwise as rapidly as possible to maintain at the most a gentle reflux. The reaction mixture was removed from the ice-bath and stirred for 30 min. at room temperature. The white slurry was separated between 700 ml of water and 700 ml of methylene chloride. After removing the aqueous phase, the organic phase was washed twice with water and dried over $MgSo_4$. Removal of the solvent gas 22.3 g (97.4% yield) of off-white solid. mp °C.; $^1$H NMR (CDCl$_3$, 300 MHz) d: 7.54–7.59 (m,2H), 7.66–7.80 (m,5H), 8.55 (d,1H), 11.89 (br. s, 1H).

Example 21

Preparation of 1,2-Bis(trifluoroacetamido)-3,3'-dibenzoyldiphenyl-1-1'-acetylene (hereafter "Compound 2"): To a mixture of 22 g (59.1 mmol) of Compound 1 in 220 ml of dry toluene was added a mixture of 1 g of tetrakis (triphenyl phosphine)palladium (0) in 50 ml of dry toluene under argon. The light brown solution so obtained was heated to reflux and to this solution was added dropwise a solution of 17.9 g (29.6 mmol) of bis(tri-n-butylstannyl) acetylene in 92 ml of dry toluene. On completion of the addition, the reaction was refluxed for an additional 10 h. The reaction was cooled to –5° C. and yellow product isolated was by suction filtration followed by drying. Crude yield 14.5 g (80%). The product was purified by recrystallization from 300 ml of tetrahydrofuran. Yield 13.2 g (73%). mp 253.8° C.; $^1$H NMR (CDCl$_3$, 300 MHz) d: 7.53–7.58 (m,4H), 7.66–7.81 (m,10H), 8.65 (d,2H), 12.04 (br,s,2H); Anal. calcd. for $C_{32}H_{18}N_2O_4F_6$: C, 63.16; H, 2.98; N, 4.60. Found: C, 62.84; H, 2.79; N, 4.55.

Example 22

Preparation of 4,4'-Diamino-3,3'-dibenzoyldiphenyl-1,11-acetylene (hereafter "Compound 3"): A mixture of 13 g (21.4 mmol) of Compound 2, 425 ml of degassed ethanol, 105.3 ml of water and 19.15 g (0.181 mol) of anhydrous sodium carbonate was refluxed for 72 h. The yellow slurry was cooled to room temperature, and the product was separated by filtration. After washing the product twice with water and then with a little methanol, it was dried in vacuum at 70° C. for 24 h. Crude yield 8.66 g (97.3%). The product was purified by continuously extracting it in dioxane using a soxhlet apparatus (with a double thickness thimble lined with Whatman # 42 filter paper) until all of the product was dissolved and recrystallized in the boiling flask. The pure product was recovered by suction filtration, washed with hexane and methanol and dried in vacuum at 60° C. for 24 h. Yield 7.5 g (84%). mp 310.1° C.; FT-IR (KBr, cm$^{-1}$): 3457, 3338, 1630, 1619, 1578, 1545, 1488, 1445, 1417, 1381, 1326, 1306, 1290, 1245, 1170, 1135, 975, 911, 880, 831, 807, 758, 712, 706, 659, 552; Anal. calcd. for $C_{28}H_{20}N_2O_2$: C, 80.75; H, 4.84; N, 6.73. Found: C, 80.53; H, 4.71; N, 6.46.

Example 23

Preparation of 3-(p-methoxyphenyl)-5-bromo-2,1-benzisoxazole (hereafter "Compound 4"): To a solution of 148 g of potassium hydroxide in 300 ml of anhydrous methanol at 0° C. was added 21.3 g (0.145 mole) of 4-methoxy phenylacetonitrile. The mixture was stirred at 0° C. for 10 min. and then a solution of 25.4 g (0.126 mol) of p-bromo nitrobenzene in 300 ml of tetrahydrofuran and methanol (1:2) was slowly added over a period of 1 h. The deep purple mixture was continuously stirred and maintained at 0°–5° C. during addition. The temperature was then raised to 55° C. using a hot water bath and reaction mixture was stirred for another 3 h. On cooling, the reaction mixture was poured into 1500 ml of water, and the brown precipitate was separated by suction filtration. The product was washed twice with water followed by cold methanol. The yellow solid so obtained was recrystallized twice from methanol to give needle like light yellow crystals. Yield 19.5 g (51%). mp 137.1° C. Anal. calcd. for $C_{14}H_{10}NO_2Br$: c, 55.29; H, 3.31; N, 4.61. Found: C, 54.99; H, 3.14; N, 4.62.

Example 24

Preparation of 2-Amino-5-bromo-4'-methoxy benzophenone (hereafter "Compound 5"): To a solution of 19.3 g of Compound 4 in 193 ml of acetic acid (glacial) at 95° C. was added 28.95 g of iron filings and 63 ml of water in 12 equal portions over a period of 3 h. The reaction was allowed to run for an additional 20 minutes after which it was cooled down to room temperature. This step gave a green slurry which was diluted with 1500 ml of water. Yellow product was extracted from this mixture in ethyl ether which was then washed with sodium carbonate solution followed by water and dried over $MgSO_4$. Removal of solvent gave yellow solid as the product which was recrystallized from methanol to give a yield of 16.6 g (85.4%). mp 120.4° C.; $^1H$ NMR ($CDCl_3$, 300 MHz) d: 3.9 (s,3H), 5.87 (br. s, 2H), 6.64 (d,1H); 6.96 (d,2H), 7.32–7.4 (m,1H), 7.57 (d,1H), 7.65–7.75 (d,2H); Anal. calcd. for $C_{14}H_{12}NO_2Br$: C, 54.92; H, 3.95; N, 4.57. Found: C, 54.70; H, 3.74; N, 4.56.

Example 25

Preparation of 5-Bromo-4'-methoxy-2-(trifluoroacetamido) benzophenone (hereafter "Compound 6"): To a solution of 16 g (52.3 mmol) of Compound 5 in 368 g of ethyl ether (dry) was added 54 g (0.515 mol) of sodium carbonate (anhydrous). The slurry was cooled in an ice bath and 37.2 ml (0.263 mol) of trifluoroacetic anhydride was added dropwise as rapidly as possible to maintain at the most a gentle reflux. Thick white slurry so obtained, was stirred at room temperature for another 45 minutes and then separated between 500 ml of methylene chloride and 500 ml of water. The aqueous layer was removed and organic layer was washed twice with water before drying it over $MgSO_4$. Removal of solvent gave 21.02 g (95.5%) of off-white product. mp 148.9° C.; $^1H$ NMR ($CDCl_3$,300 MHz) d: 3.93 (s,3H), 7.02 (d,2H), 7.75–7.78 (m,4H), 8.49 (d,1H), 11.66 (br. s,1H); Anal. calcd. for $C_{16}H_{11}NO_3BrF_3$: C, 47.79; H, 2.76; N, 3.48. Found: C, 47.67; H, 2.70; N, 3.51.

Example 26

Preparation of 4-4'-Bis(trifluoroacetamido)-3-3'-di-p-methoxybenzoyldiphenyl;-1,1'-acetylene (hereafter "Compound 7"): To a solution of 19.5 g of Compound 6 in 233 ml of dry toluene was added a mixture of 1 g of tetrakis (triphenyl phosphine)Palladium (0) and 50 ml of dry toluene under argon. The mixture was heated to reflux, and to it was added dropwise a solution of 14.6 g (24.2 mmol) of bis(tri-n-butyl stannyl)acetylene in 76.5 ml of dry toluene over a period of 2 h. The reaction was refluxed for an addition 10 h during which time part of orangish-yellow product precipitated. After cooling the reaction mixture to −5° C., the product was isolated by suction filtration (crude yield 13.03 g, 80%). The product was purified by continuously extracting it in toluene using soxhlet apparatus (with double thickness thimble lined with Whatman # 42 filter paper) until all of the product was dissolved and collected in the boiling flask. The pure product was recovered by suction filtration of the cold toluene mixture (at −5° C.). Yield 11 g (68%). mp 261.2° C.; $^1H$ NMR ($CDCl_3$,300 MHz) d: 3.93 (s,6H), 7.02 (d,4H), 7.75–7.80 (m,8H), 8.60 (d,2H), 11.82 (br. s, 2H); Anal. calcd. for $C_{34}H_{22}N_2O_6F_6$: C, 61.08; H, 3.32; N, 4.19. Found C, 60.80; H, 3.20; N, 4.19.

Example 27

Preparation of 4,4'-Diamino-3,3'-di-p-methoxybenzoyldiphenyl-1,1'-acetylene (hereafter "Compound 8"): 11 g of Compound 7 was mixed with 350 ml of degassed ethanol, 89 ml of water, and 15 g (0.142 mol) of sodium carbonate. The mixture was refluxed for 84 h. Bright yellow slurry was cooled to room temperature, filtered and the solid product dried to give crude yield of 7.7 g. The product was purified by continuously extracting it in dioxane using soxhlet apparatus (with double thickness thimble line with Whatman # 42 filter paper) until all of the product was dissolved and recrystallized in the boiling flask. Pure product was recovered by suction filtration and dried in vacuum at 60° C. for 24 h. Yield was 6.3 g (80%). mp 235.3° C.; $^1H$ NMR ($CDCl_3$, 300 MHz) d: FT-IR (KBr, $cm^{-1}$): 3457, 3345, 1624, 1602, 1562, 1570, 1508, 1461, 1441, 1415, 1363, 1305, 1258, 1243, 1172, 1111, 1028, 977, 957, 881, 843, 785, 695, 635, 614; Anal. calcd. for $C_{30}H_{24}N_2O_4$: C, 75.62; H, 5.08; N, 5.88. Found: C, 75.86; H, 5.01; N, 5.78.

Example 28

Preparation of 5-Bromo-2'-fluoro-2-(trifluoroacetamido) benzophenone (hereafter "Compound 9"): To a solution of 12 g of 2 amino-5-bromo-2'-fluoro benzophenone (Lancaster) in 407 ml of dry diethylether was added 42.6 g of anhydrous sodium carbonate. The reaction mixture was cooled in an ice bath, and 29 ml of trifluoroacetic anhydride was added dropwise as rapidly as possible while maintaining at the most a gentle reflux. Thereafter, the ice bath was removed, and the reaction mixture was stirred for 30 min. at room temperature. The off-white reaction slurry was separated between 500 ml methylene chloride and 500 ml of water. The aqueous layer was removed and organic layer was washed twice with water and dried over $MgSO_4$. Filtration and evaporation of the solvent gave 15.7 g (98.5%) of product. mp 132° C.; $^1H$ NMR ($CDCl_3$,300 MHz) d: 7.24 (t,1H), 7.35 (t,1H), 7.50–7.55 (m,1H), 7.60–7.67 (m,1H), 7.72 (t,1H), 7.77–7.81 (d of d,1H), 8.62 (d,1H), 12.29 (s,1 NH); Anal. calcd. for $C_{15}H_8NO_2BrF_4$: C, 46.18; H, 2.07; N, 3.59. Found: C, 46.33; H, 1.94; N, 3.68.

Example 29

Preparation of 4,4'-Bis(trifluoroacetamido)-3-3'-di-o-fluorobenzoyldiphenyl-1,1'-acetylene (hereafter "Compound 10"): To a solution of 15 g (38.4 mmol) of Compound 9 in 100 ml of dry toluene was added a mixture of 1 g of tetrakis(triphenylphosphine)Palladium (0) in 50 ml of dry toluene under argon. The reaction mixture was then heated to reflux, and to this mixture was added dropwise a solution of 11.6 g (19.2 mmol) of bis(tri-nbutylstannyl)acetylene in 60 ml toluene (dry) over a period of 2 h. The reaction was refluxed for an additional 10 hrs after which it was cooled down to −5° C. The yellow crystals of product were isolated by suction filtration followed by washing with hexane. The crude product obtained (12.4 g) was dissolved in excess chloroform, filtered and then recrystallized from chloroform to give a yield of 7.6 g (61.1%). mp 267.2° C.; $^1$H NMR (CDCl$_3$,300 MHz) d: 7.24 (t,2H), 7.35 (t,2H), 7.5–7.55 (m,2H), 7.59–7.67 (m,2H), 7.72 (t,2H), 7.76–7.81 (d of d,2H), 8.71 (d,2H), 12.29 (s,2NH); Anal. calcd. for $C_{32}H_{16}N_2O_4F_8$: C, 59.64; H, 2.50; N, 4.35. Found: C, 59.24; H, 2.41; N, 4.33.

Example 30

Preparation of 4,4'-Diamino-3,3'-di-o-fluorodibenzoyldiphenyl-1,1'-acetylene (hereafter "Compound 11"): A mixture of 7.35 g (11.5 mmol) of Compound 10, 10.36 g (98 mmol) of anhydrous sodium carbonate, 57 ml of water and 230 ml of degassed ethanol was heated at reflux for 72 h. On cooling, the solid product was separated by suction filtration, washed with water (twice), and dried in vacuum oven. Crude yield 5.05 g. The product was purified by continuously extracting it in chloroform using soxhlet apparatus (with double thickness thimble layered with Whatman # 42 filter paper) until all of the product was dissolved and recrystallized in the boiling flask. Upon cooling, the product was isolated by suction filtration and dried in vacuum oven at 60° C. for overnight. Yield was 4.24 g (82%). Compound 11 did not show any mp, exothermic peak (possibly crosslinking) starts around 290° C.; FT-IR (KBr, cm$^{-1}$): 3464, 3338, 1638, 1621, 1582, 1545, 1485, 1450, 1420, 1364, 1329, 1307, 1289, 1270, 1245, 1218, 1172, 1138, 976, 887, 830, 817, 757, 648; Anal. calcd. for $C_{28}H_{18}N_2O_2F_2$: C, 74.33; H, 4.01; N, 6.19; F, 8.40. Found C, 73.98; H, 3.93; N, 6.12; F, 8.46.

Example 31

Preparation of the polymer Poly(2,2'-(2,2'-bithiophene)-6,6'-bis(4-phenylquinoline)acetylene (PBTPQA): Equimolar amounts (1.2 mmol each) of both 4,4'-diamino-3,3'-dibenzoyldiphenyl-1,1'-acetylene (Compound 3) and 5,5'-diacetyl-2,2'-bithiophene were added to a solution of 12 g of di-m-cresyl phosphate (DCP) and 15 g of freshly distilled m-cresol in a cylindrical shaped reaction flask (glass) fitted with a mechanical stirrer, two gas inlets, and a side arm. The reactor was purged with argon for 10–15 min. before the temperature was raised slowly to 90° C. The reaction was run at this temperature for 24 h and then at 120°–130° C. for an additional 10 h under static argon. Thereafter the reaction was quenched by cooling it down to room temperature under argon and precipitating it in 500 ml of 10% triethylamine/ethanol mixture. The precipitated polymer was then collected by suction filtration. The polymer was purified by continuous extraction in soxhlet apparatus with 20% triethylamine/ethanol solution for 36 h and was dried in vacuum at −80° C. for 24 h. The PBTPQA polymer obtained had the following characteristics: ([η]=0.89 dL/g (25° C.,0.5 mol % DCP/m-cresol); FT-IR (KBr,cm$^{-1}$): 3050, 2910, 1584, 1542, 1490, 1457, 1438, 1361, 1290, 1229 (w), 1155, 1074, 1030, 873, 835, 797, 767, 700, 619, 584; Anal. calcd. for $(C_{40}H_{22}N_2S_2)_n$: C, 80.78; H, 3.73; N, 4.71. Found: C, 77.5; H, 4.32; N, 3.96.

Example 32

Preparation of the polymer Poly(2,2'-(2,2'-bithiophene)-6,6'-bis(4-(p-methoxy)phenylquinoline) acetylene) (PBTPQA-OCH$_3$): Equimolar amounts (1.2 mmol each) of both 4,4'-diamino-3,3'-di-p-methoxybenzoyldiphenyl-1,1'-acetylene (Compound 8) and 5,5'-diacetyl-2,2'-bithiophene were added to a solution of 12 g of di-m-cresyl phosphate (DCP) and 15 g of freshly distilled m-cresol in a reaction flask as described in Example 31. The reaction was purged with argon for 10–15 min. before the temperature was raised slowly to 60° C. and then to 90° C. The reaction was run at 90° C. for 4 h and then at 100° C. for addition 15 h under static argon. The temperature was then raised to 125°–130° C. for 5 h and then to 140° C. for 2 h. As the viscosity of the reaction mixture increased with time, addition at m-cresol was added to the reaction mixture to maintain diluted conditions. Thereafter the reaction was quenched, precipitated, and purified as described in Example 31. The PBTPQA-OCH$_3$ polymer obtained had the following characteristics: [η]=1.1 dL/g (25° C., 0.5 mol 5 DCP/m-cresol); FT-IR (KBr, cm$^{-1}$): 3055, 2914, 1649, 1608, 1583, 1541, 1511, 1453, 1439, 1400, 1362, 1291, 1248, 1176, 1031, 832, 798, 573; Anal. calcd. for $(C_{42}H_{26}N_2O_2S_2)_n$: C, 77.04; H, 4.00; N, 4.28. Found: C, 74.27; H, 4.51; N, 3.60.

Example 33

Preparation of the polymer Poly(2,2'-(2,2'-bithiophene)-6,6'-bis(4-(o-fluoro)phenylquinoline acetylene) (PBTPAQA-F): Equimolar amounts (0.663 mmol each) of both 4,4'-diamino-3,3'-di-o-fluorodibenzoyldiphenyl-1,1'-acetylene (Compound 11) and 5,5'-diacetyl-2,2'-bithiophene were reacted as described in Example 31. The polymer product was collected and purified as described in Example 31. The PBTPAPQ-F polymer obtained had the following characteristics: [η]=0.65 dL/g (25° C., 0.5 mol % DCP/m-cresol); FT-IR (KBr,cm$^{-1}$): 1616, 1585, 1543, 1518, 1487, 1447, 1433, 1358, 1290, 1270, 1227 (s), 1156, 1100, 1064, 1032, 877, 835, 799, 758, 619, 589; Anal. calcd. for $(C_{40}H_{20}N_2S_2F_2)_n$: C, 76.17; H, 3.2; N, 4.44. Found: C, 74.66; H, 3.87; N, 3.72.

Example 34

Preparation of the copolymer PBTPQ/PBTPQA-OCH$_3$ (molar ratio of 80:20), respectively: 0.255 mmole of 4,4'-diamino-3,3'-di-p-methoxybenzoyldiphenyl-1,1'-acetylene (Compound 8), 1.02 mmol of 3,3'-dibenzoylbenzidine and 1.275 mmol of 5,5'-diacetyl-2,2'-bithiophene were mixed together in a reaction medium of 12 g DCP and 2 g m-cresol. After the reactor was purged with argon for 10–15 min., the temperature was raised slowly to 90° C. The reaction was run at this temperature for 9 h and then at 110° C. for 15 h followed by 135°–140° C. for addition 24 h under static argon. As the viscosity of the reaction mixture increased with time, additional m-cresol was added to the reaction mixture to facilitate efficient stirring. Thereafter the reaction was quenched, precipitated and purified as described in Example 31.

Example 35

Preparation of the copolymer PBTPQ/PBTPQA-F (molar ratio of 80:20), respectively: 0.255 mmole of 4,4'-diamino-3,3'-di-o-fluorodibenzoyldiphenyl-1,1'-acetylene (Compound 11), 1.02 mmol of 3,3'-dibenzoylbenzidine and 1.275 mmol of 5,5'-diacetyl-2,2'-bithiophene were mixed together in a reaction medium of 12 g DCP and 2 g m-cresol. The reactor was purged with argon for 10–15 min. before the temperature was raised slowly to 90° C. The reaction was run at this temperature for 2 h and then at 100° C. for 3 h followed by 130° C. for additional 25 h under static argon.

As the viscosity of the reaction mixture increased with time, additional m-cresol was added to the reaction mixture to facilitate efficient stirring. Thereafter the reaction was quenched, precipitated, and purified as described in Example 31.

EXAMPLES 36–50

Examples 36–50 are directed to the preparation of π-conjugated polymers falling within the scope of Formulae I–IV, which generally relate to polybenzobisazoles.

Example 36
Preparation of Polybenzobisimidazole 1,2,4,5-tetraminobenzene tetrahydrochloride (TABH) (4.0 g, 14.18 mmol) was dissolved in 77% polyphosphoric acid (PPA) (12 g). The 77% PPA was prepared by combining polyphosphoric acid and 85% phosphoric acid. The thus formed solution of TABH in PPA was placed in a glass reactor fitted with a mechanical stirrer, two gas ports and a side arm. The reaction vessel was purged with nitrogen for 20 minutes and thereupon maintained at a temperature of 80° C. under vacuum for 24 hours. After this treatment, complete dehydrochlorination occurred and the reaction mixture was cooled to 50° C. under a nitrogen atmosphere.

Oxalic acid (1.277 g, 14.18) and phosphorus pentoxide ($P_2O_5$) (8 g), the $P_2O_5$ to compensate for the calculated water of condensation, was added to the dehydrochlorinated product. The reaction temperature was raised to 120° C. and held at this temperature for 10 hours. The reaction temperature was thereupon raised to 140° C. and finally to a range of 180° to 200° C. The reaction was allowed to proceed in this elevated temperature range of 180° to 200° C. for 36 hours.

The resultant product, a polymerization dope in PPA, blue-green in color, was cooled to room temperature and precipitated in water. The product was thereupon purified by extraction of the PPA with water for three days.

The thus prepared product, polybenzobisimidazole (PBBI), was characterized by Fourier Transfer Infrared (FTIR) as follows:

FTIR (KBr pellet, cm$^{-1}$) 3408, 3010, 1616, 1512, 1447, 1356, 1256, 1179, 1139, 1069, 841.

Example 37
Preparation of Poly(benzobisimidazole vinylene)

TABH (5.2 g 18.3 mmol) was dehydrochlorinated in deaerated 77% (PPA) (16.5 g) in accordance with the procedure utilized in Example 1. Upon complete dehydrochlorination, and under the conditions present in Example 1, fumaric acid (2.125 g, 18.3 mmol) and $P_2O_5$ (12.2 g) were added. The temperature was gradually raised to 120° C. over six hours and then to 160° C. and finally to 180° C. This polymerization mixture, which became yellowish-brown in color, was allowed to proceed at 180° C. for 24 hours. The polymeric dope mixture was then precipitated in water. The precipitated polymer was purified by extraction in water for three days.

The polymeric product, poly(benzobisimidazole vinylene) (PBIV), was characterized as follows:

FTIR (KBr pellet, cm$^{-1}$) 3300, 3010, 1629, 1388, 1297, 1238, 1151, 1015, 960, 841, 669.

Example 38
Preparation of Poly(benzobisimidazole divinylene)

The dehydrochlorination reaction of TABH (2.2 g, 7.75 mmol) was repeated in accordance with the procedure utilized in Example 1. The cooled dehydrochlorination reaction product was reacted with trans,trans-muconic acid (1.1 g, 7.75 mmol) in accordance with the procedure utilized in Example 2. $P_2O_5$ added with the muconic acid in an amount to compensate for the water of condensation. The temperature of the thus formed reaction product was raised to 85° C. over two hours and held at this temperature for six hours. Thereupon, the reaction temperature was increased to 120° C. The viscosity of the reaction mixture rose rapidly with a corresponding color change from yellow to yellowish-green under the elevated 120° C. temperature. The reaction was allowed to proceed for 14 hours at 120° C. during which time the polymerization dope became stir opalescent. The polymerization dope was cooled to room temperature and precipitated in water. The fibrous polymer thus formed was shredded into small pieces with a blender to facilitate purification which was facilitated by extraction with water for 2 to 3 days.

The polymer product, poly(benzobisimidazole divinylene) (PBIDV), was characterized by Fourier Transfer Infrared (FTIR) and nuclear magnetic resonance (NMR). The characterizing data were as follows:

FTIR(free standing film, cm$^{-1}$)3400, 3010, 1619, 1500, 1383, 1278, 1151, 1091, 984, 828;

$^1$H NMR(CD$_3$NO$_2$/AlCl$_3$, 300 MHz TMS) δ, ppm, 7.5 (d,2H); 8.0(d,2H); 8.4(d,2H); 9.1(s,2H).

Example 39
Preparation of Poly(bibenzobisimidazole divinylene)

3,3'-Diaminobenzidine (1.508 g, 7.04 mmol) was dehydrochlorinated with 83.3 wt % deaerated PPA in accordance with the procedure enumerated in Example 1. The product of this dehydrochlorination was reacted with trans, trans-muconic acid (1.0 g, 7.04 mmol) in accordance with the procedure of Example 1. This polymerization reaction was conducted for a total of 30 hours, the first 6 hours of which were at a temperature of 100° C. and the final 24 hours at 140° C. The product of this reaction was a yellowish-brown polymerization dope. This product was precipitated in water and purified by extraction, for 3 days, with water.

The product of this polymerization reaction, poly (bibenzobisimidazole divinylene) (PBBIDV), was characterized by Fourier Transfer Infrared (FTIR) and nuclear magnetic resonance (NMR). These characterizations are as follows:

FTIR (KBr pellet, cm$^{-1}$) 3400, 3010, 1627, 1504, 1458, 1287, 1249, 1081, 995, 881;

$^1$H NMR (CD$_3$NO$_2$/AlCl$_3$, 300 MHz, TMS) δ, ppm, 7.4 (s2H), 7.9–8.4 (broad peaks, 8H), 9.0 (s,2H).

Example 40
Preparation of Poly(benzobisthiazole-1,4-phenylenebisvinylene)

2,5-Diamino-1,4-benzenedithiol (DABDT) (1.8 g, 4.08 mmol) was dissolved in 77% deaerated PPA (25 g) under a nitrogen atmosphere in a glass reactor of the type described in Example 1. The resultant dehydrochlorination reaction was conducted after 30 minutes purge with nitrogen at 70° C. under vacuum.

The resultant reaction mixture was cooled to 50° C. and contacted with 1,4-phenylene diacrylic acid (PDAA) (0.89 g, 4.08 mmol). $P_2O_5$ (10.5 g) was added under positive pressure to compensate for the calculated theoretical water of condensation. The reaction mixture was raised to 60° C. and held at this temperature for eight hours. The temperature was further raised to 100°–120° C. and maintained in this temperature range for an additional 22 hours. The polymerization dope product of this reaction was poured into a beaker and precipitated with 500 ml deionized water. The fibrous precipitate was shredded with a blender and purified by stirring in a large volume of deionized water for three days. The product was dried in a vacuum oven at 60° C. and was obtained in a yield of approximately 100%.

The product of this polymerization reaction, poly (benzobisthiazole-1,4-phenylenebisvinylene) (PBTPV), was characterized by both FTIR and $^1$H NMR spectra. These spectra were as follows:

FTIR (free standing film cm$^{-1}$) 3033, 3000, 2923, 2852, 1622, 1558, 1516, 1489, 1418, 1403, 1312, 1265, 1180, 1054, 949, 855, 804, 656;

$^1$H NMR (CD$_3$NO$_2$/GaCl$_3$, 300 MHz, TMS) δ, ppm, 9.0 (s,2H), 8.4–8.5 (m,4H), 8.1 (s,2H), 8.0 (s,2H).

Example 41
Preparation of Poly(p-biphenylene benzobisthiazole)

2,5-Diamino-1,4-benzenedithiol dihydrochloride (DABDT) (1.3 g, 5.3 mmol) was dehydrochlorinated in 77% deaerated PPA (13.7 g) in accordance with the procedure of Example 1. The product obtained in the glass reactor, was cooled to 50° C. and then 4,4'-diphenyldicarboxylic acid (1.28 g, 5.3 mmol) and P$_2$O$_5$ (6.7 g) were added under a nitrogen purge. The reaction mixture, under slow stirring, was heated to 100° C. for 4 hours, followed by heating at 140° C. for 8 hours and finally heating at 180° C. for 24 hours.

The polymerization dope was allowed to cool to room temperature and the polymer precipitated in water. The polymer was shredded into small pieces with a blender to facilitate purification which involved extraction with a large volume of water, over 2 days.

The product of this polymerization poly(p-biphenylene benzobisthiazole) (PBBZT), was characterized by nuclear magnetic resonance as follows:

[1H NMR:CD$_3$N$_2$O/AlCl$_3$, δ ppm: 9.2,2H; 8.5,4H; 8.3, 4H].

Example 42
Preparation of Poly(2,6-naphthyl benzobisthiazole) DABDT (1.0 g, 4.08 mmol), was dissolved in 77% deaerated PPA (9.8 g) and dehydrochlorinated at 70° C. 2,6-Naphthalene dicarboxylic acid (0.88 g, 4.08 mmol) was added to the completely dehydrochlorinated product along with P$_2$O$_5$ (5.0 g). The heating regime and purification steps used in the polymerization of the polymer of Example 6 was repeated.

The product of this polymerization, poly(2,6-naphthyl benzobisthiazole) (2,6-PNBT), was characterized by nuclear magnetic resonance as follows:

[$_1$HNMR:CD$_3$NO$_2$/AlCl$_3$, δ ppm: 9.3,2H; 8.5,4H; 8.2, 2H].

Example 43
Preparation of Poly(1,4-naphthyl benzobisthiazole)

The procedure of Example 7 was identically reproduced except for the substitution of an identical amount of 1,4-naphthalene dicarboxylic acid for the 2,6-naphthalene dicarboxylic acid of Example 7.

The product of this example, poly(1,4-naphthylbenzobisthiazole) (1,4-PNBT), was characterized by nuclear magnetic resonance as follows:

[$^1$H NMR: CD$_3$NO$_2$/AlCl$_3$, δ ppm: 9.4,2H; 8.6,4H.; 8.1, 2H].

Example 44
Preparation of Poly(benzobisthiazole decamethylene)

The procedure of Example 6 was repeated but for the substitution of decanedioic acid for the 4,4'-biphenylene dicarboxylic acid of Example 6.

This procedure resulted in the formation of poly (benzobisthiazole decamethylene) (PBTC10). This polymer was characterized by both nuclear magnetic resonance and infrared spectra as follows:

[$^1$H NMR: CD$_3$NO$_2$/AlCl$_3$, δ ppm: 8.9,2H; 3.6,4H; 2.0, 4H; 1.2–1.7, 12H]

FTIR(free standing film, cm$^{-1}$) 2922, 2850, 1532, 1426, 1404, 1308, 1161, 1054, 859.

Examples 45 to 47
Preparation of Other Poly(benzobisthiazole methylenes)

The synthesis of poly(benzobisthiazole docamethylene) of Example 9 was repeated in three additional examples wherein decanedioic acid was replaced with octanedioic acid, nonanedioic acid, and undecanedioic acid, respectively to produce poly(benzobisthiazole octamethylene) (PBTC8), poly(benzobisthiazole nonmethylene) (PBTC9), and poly (benzobisthiazole undecamethylene) (PBTC11), respectively.

These polymers were characterized by nuclear magnetic resonance data as follows:

(PBTCB)
$^1$H NMR [δ, ppm: 1.2–1.7, 2.0, 3.6, 8.9]
PBTC9
$^1$H NMR [δ, ppm: 1.2–1.7, 2.0, 3.6, 8.9]
PBTC11
$^1$H NMR [δ, ppm: 1.2–1.7, 2.0, 3.6, 8.9] HOOC (CH$_2$)$_8$ COOH.

Example 48
Preparation of Poly(benzobisthiazole vinylene)

2,5-Diamino-1,4-benzenedithiol dihydrochloride (DABDT) (1.667 g, 6.8 mmol) was dehydrochlorinated with 77% deaerated PPA (18.5 g) in accordance with the procedure of Example 1. Fumaric acid (0.789 g, 6.8 mmol) and P$_2$O$_5$ (9 g) were added to the dehydrochlorinated product, the latter compound to compensate for the water of condensation. The temperature was gradually raised to 120° C. over six hours and then to 160° C. and finally to 180° C. The polymerization mixture became shiny dark green and the reaction was allowed to proceed for eight hours at 180° C. At that time the polymeric dope was precipitated in water. The polymer thus formed was shredded into tiny pieces with a blender to facilitate purification. Purification involved extraction with water for two days.

The product of this polymerization, poly (benzobisthiazole vinylene) (PBTV), was characterized by FTIR spectra. This data is as follows:

FTIR (free standing film, cm$^{-1}$): 1663, 1600, 1515, 1400, 1313, 1052, 944, 856, 689.

Example 49
Preparation of Poly(benzobisthiazole divinylene)

DABDT (4.31 g, 17.57 mmol) was dehydrochlorinated in accordance with the procedure of Example 13. This product was then reacted with trans,trans-muconic acid (2.5 g, 17.57 mmol) with the concurrent addition of P$_2$O$_5$ to compensate for the water of condensation. The thus formed mixture was raised to a temperature of 80° C. and held at that temperature for six hours. The temperature was thereupon raised to 120° C. for 10 additional hours. The resultant polymerization product was precipitated in water and thereafter shredded into tiny pieces with a blender. The polymer was purified by extraction in water for 2 days.

The product of this polymerization reaction, poly (benzobisthiazole divinylene) (PBTDV), was characterized by IR spectra data. This data is as follows:

FTIR (free standing film, cm$^{-1}$): 1601, 1480, 1400, 1315, 1053, 974, 845, 680.

Example 50
New Process for Preparing Polybenzobisthiazole

DABDT (3.87 g, 15.78 mmol) was dissolved in deaerated 77% PPA (14.66 g) and dehydrochlorinated at 70° C. under vacuum in accordance with the procedure of Example 1. Oxalic acid (1.42 g, 15.78 mmol) was added together with $P_2O_5$ (12 g) under positive pressure. The temperature of this reaction mixture was gradually raised to 120° C. over ten hours, subsequently to 140° C. and finally to 180°–200° C. The reaction continued at this elevated temperature (180°–200° C.) for 24 hours. The polymerization dope in PPA was precipitated in water and purified by extraction of the PPA with water for two days.

The product of this polymerization reaction, polybenzobisthiazole (PBBT), was characterized by infrared spectra data. That data is as appears below:

FTIR (free standing film, $cm^{-1}$): 1467, 1406, 1313, 889, 860, 685.

Example 51
Exciplex Formation from poly(p-phenylene benzobisoxazole) and tris(P-tolyl)amine An isotropic solution of PBO in nitromethane with aluminum (III) chloride ($AlCl_3$) as prepared as described in Jenekhe, et al., *Macromolecules* (1989), 22, 3216 and Jenekhe, et al., *Macromolecules* (1990), 23, 4419. Thin films of PBO were prepared by spin coating the resultant solution onto glass and fused silica substrates. The resultant coatings of $PBO/AlCl_3$ complex were washed several times with deionized water and subsequently placed in a beaker of deionized water overnight to ensure complete decomplexation occurred. The films were then dried in a vacuum oven for 6 hrs. at 80° C. to obtain PBO-coated substrates. The PBO thin film layer was approximately 50 nm thick.

Tris (p-tolyl) amine, TTA, was obtained from Eastman Kodak, Rochester, N.Y. A solution of TTA and poly (bisphenol A carbonate), PC, 40:60 by weight TTA:PC, in dichlormethane was prepared. The solution was spin coated onto the PBO-coated substrates. The resultant TTA/PC thin films containing 40 weight % TTA, hereafter referred to as TTA layers, were about 200 nm thick. The result was a PBO/TTA bilayer thin film assembly. It was found that the rigid rod polymer PBO does not dissolve or swell in dichloromethane, $CH_2Cl$. It was also found that the TTA layer can be subsequently washed off with $CH_2Cl$ to recover a pure PBO-coated substrate.

Optical absorption spectra, photoluminescence (PC) spectra and PL decay experiments were conducted on the PBO thin films, TTA thin films and PBO/TTA bilayer thin films. All photophysical measurements were made at room temperature. UV-visible spectra were obtained on a Perkin Elmer Lamba 9 spectrophotomer. Steady state photoluminescence studies were done on a Spex Fluorolog-2-fluorimeter equipped with a DM3000F spectroscopy computer. The polymer films on glass slides were positioned such that the emission was detected at 22.5° from the incident beam. The relative PL quantum efficiency was obtained by comparing the integration of the emission spectra of PBO/TTA bilayers to those of PBO films. The steady state PL spectra were obtained with excitation at 380 nm.

Time-resolved photoluminescence decay measurements were performed by using time-correlated single photon counting technique. The excitation system consisted of a mode-locked frequency doubled Nd:YAG laser (Quantronics Model 416) synchronously pumping a cavity dumped dye laser (Coherent Model 703D) circulating rhodamine 6G. The Nd:YAG laser pulses were typically 10 ps duration at a repetition rate of 38 MHz. PBO and PBO/TTA samples were photoexcited at 380 nm. Time-resolved PL decay measurements were also done on the single-layer TTA/PC thin films (about 200 nm) by exciting at 300 nm, the $\lambda_{max}$ of TTA's lowest energy absorption band. The excitation at 300 nm was obtained by frequency doubling of the output of a dye laser (Rhodamine 6G).

FIG. 4 shows the optical absorption spectra of thin films of TTA dispersed in the matrix of polycarbonate, PBO, and PBO/TTA. As seen in FIG. 4, the absorption maximum ($\lambda_{max}$) of the lowest energy absorption band of the TTA films, Curve 3, is 300 nm. The lowest energy absorption band of PBO thin film, Curve 1, has peaks ($\lambda_{max}$) at 401 and 427 nm, similar to its absorption spectrum as reported by Jenekhe, et al. in *Chem. Mater.* (1992), 4683. The optical absorption spectrum of the PBO/TTA bilayer thin film shown in FIG. 4, is composed of the component spectra. There are no new features or absorption bands in the spectrum of PBO/TTA bilayer, which new features or absorption bands would indicate strong interaction between PBO and TTA in the ground state. This result is in accord with the weak electron accepting properties of PBO in the ground state.

Figure 5:
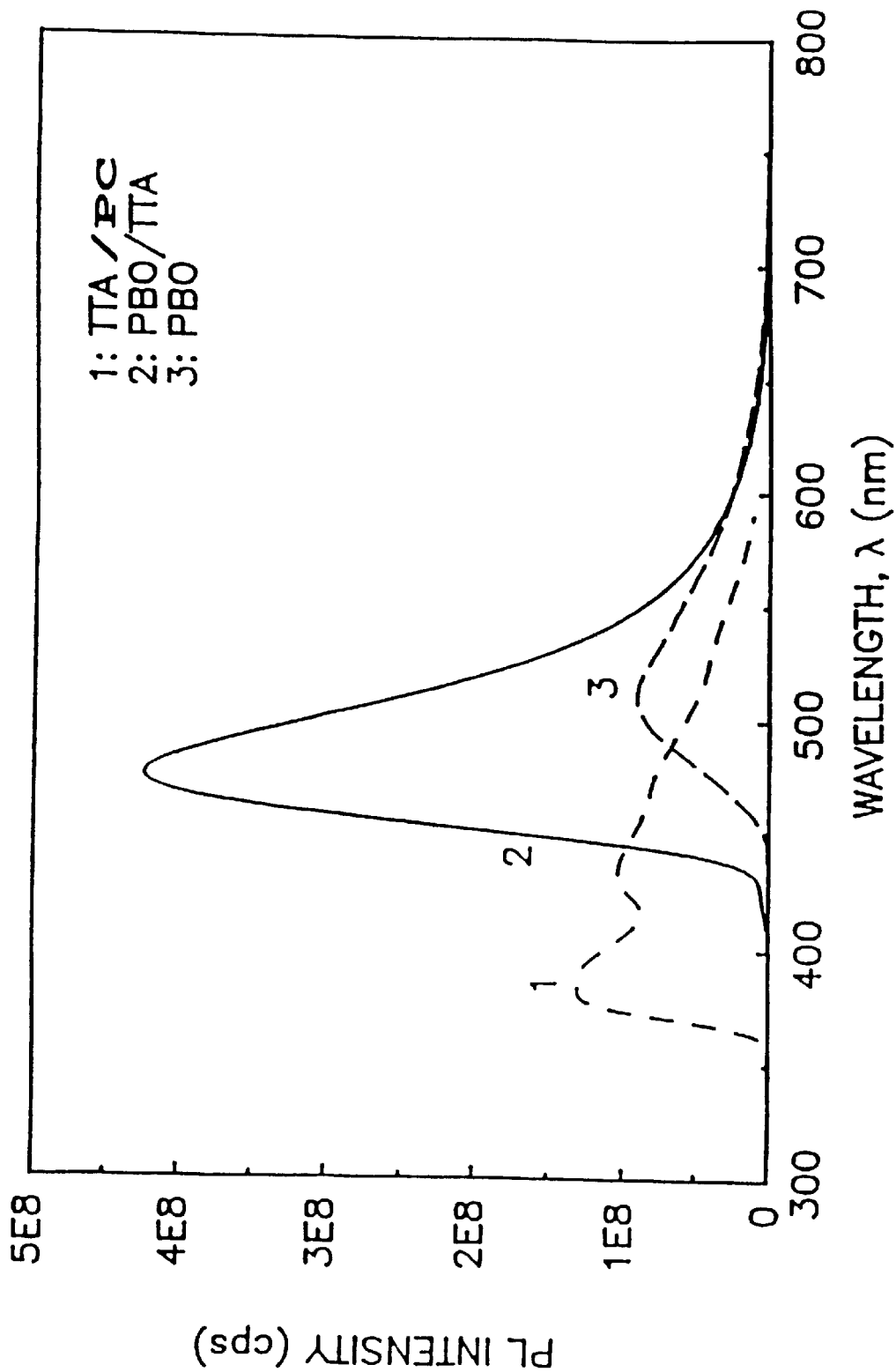
FIG. 5 is a graph depicting the photoluminescence (PL) spectra of a PBO thin film excited at 380 nm, Curve 3; a TTA/PC thin film excited at 380 nm, Curve 2; and a PBO/TTA bilayer thin film excited at 380 nm, Curve 2.

FIG. 5 shows the photoluminescence (PL) spectrum of a PBO thin film, Curve 3, excited at 380 nm. The PL spectrum has a peak at 500 nm, indicating green light emission. The PL spectra of PBO thin films excited at wavelengths in the spectral range 380–440 nm were identical with the one shown in FIG. 5, suggesting that emission is from the same state. Although measurement of the absolute fluorescence quantum efficiency $\Phi_f$ in the solid state is very difficult, as related by Demas, et al. in *J. Phys. Chem.* (1971), 75, 991, it was nevertheless estimated for the present example relative to other conjugated polymers that have been measured. PBO thin films are about 30% more fluorescent than poly (p-phenylene vinylene) and about a factor of 2 more fluorescent than poly(benzobisthiazole-1,4-phenylene-bisvinylene (PBTPV) reported by Osaheni, J. A., et al. in *Macromolecules* (1993), 26, 4726. The emission spectrum of the pure TTA layer, Curve 1, shown in FIG. 5, corresponds to excitation at 300 nm and has a monomer emission peak at 380 nm, indicating ultraviolet emission, and an excimer emission at 432 nm. Excitation of pure TTA layer at 380 nm showed a very weak emission at 440 nm that was at least a factor of 10 weaker in intensity compared to the emission from 300 nm excitation.

An exciplex of PBO/TTA was formed by exciting the PBO/TTA bilayer thin film. FIG. 5 shows the PL spectrum of a PBO/TTA bilayer thin film, Curve 2, excited at 380 nm. A highly intense bright blue emission with peak at 474 nm was observed. The emission peak of PBO/TTA was blue shifted by 26 nm from the emission peak of the pure PBO. Most dramatic of all the differences between PBO/TTA and PBO was the enhancement by a factor of 3.4 of the fluorescence quantum efficiency of PBO/TTA compared to the pure PBO.

Time-resolved photoluminescence decay dynamics of PBO/TTA and PBO thin films confirmed the observed enhancement of the luminescence in PBO/TTA to originate from an excited state that is distinctively different from that of either component. The decay dynamics of PBO and of PBO/TTA excited at 380 nm were very different, reflecting the different excited states of the materials. The decay of PBO showed that the longest lifetime was 0.66 ns. However, the major component of the decay of the excited state associated with PBO/TTA had a lifetime of 4.6 ns. TTA layer excited at 300 nm also exhibited a different decay dynamics with the major component having a lifetime of 2.9 ns.

Examples 52–58

Examples 52–58 were prepared and subsequent measurements were all made in accordance with the procedures set forth in Example 51. Thin films of the following π-conjugated polymers were prepared on glass or fused silica substrates:

| Example | π-Conjugated Polymer |
|---|---|
| 52 | poly(p-phenylene benzobisthiazole), PBZT |
| 53 | poly(p-biphenylene benzobisthiazole), PBBZT |
| 54 | poly(1,4-naphthyl-benzobisthiazole), 1,4-PNBT |
| 55 | poly(benzobisthiazole-1,4-phenylenebis-vinylene), PBTPV |
| 56 | poly(benzobisthiazole vinylene), PBTV |
| 57 | poly(benzobisthiazole divinylene), PBTDV |
| 58 | poly(p-phenylene benzobisoxazole), PBO |

Solutions of TTA dispersed in polycarbonate in a weight ratio of 40:60 were prepared in accordance with Example 51 and were spun coated onto the π-conjugated polymer-coated substrates of Examples 52–58. The film thickness of TTA/PC atop each of the polymers of Examples 52–58 was 55 nm.

Optical absorption spectra $(\lambda_{max})$ and the photoluminescence $(\lambda_{max})$ spectra of the pure polymers are given in Table 1. The exciplexes were formed in accordance with Example 1 by photoexcitation at 380 nm, and the photoluminescence spectra $(\lambda_{max})$ for each of the exciplexes thus formed were taken and appear $(\lambda_{max})$ at Table 1. Also shown in Table 1 is the relative luminescence enhancement factor, $\Phi_{exp1}/\Phi_o$ of each of Examples 52–58 exciplex to the pure polymers thereof; and the reduction potential, E° red, of each of the pure polymers of Examples 52–58, given as V vs. SCE.

TABLE 1

| Example | Film Thickness (nm) | Absorption $\lambda_{max}$ (nm) | Emission $\lambda_{max}$ (nm) | Exciplex $\lambda_{max}$ (nm) | $\Phi$ expl / $\Phi_o$ | E° red (V vs. SCE) |
|---|---|---|---|---|---|---|
| 52 | 35 | 438 | 564 | 512 | 3.5 | -1.75 |
| 53 | 40 | 415 | 536 | 490 | 3.8 | -1.80 |
| 54 | 30 | 436 | 572 | 542 | 3.5 | -1.70 |
| 55 | 40 | 475 | 640 | 560 | 3.4 | -1.68 |
| 56 | 20 | 468 | 618 | 588 | 3.6 | -1.46 |
| 57 | 25 | 500 | 640 | 592 | 3.8 | -1.45 |
| 58 | 15 | 401 | 502 | 474 | 4.2 | -1.92 |

As can be seen from Table 1, the exciplexes of each of Examples 52–58 all showed an emission peak, $\lambda_{max}$ shifted to shorter wavelengths than the emission peak $\lambda_{max}$, of the pure polymer, with the exciplex of PBO/TTA, Example 58), emitting, at peak, a deep blue color at 474 nm.

Also as can be seen at Table 1, the relative luminescence enhancement factor, $\Phi_{exp1}/\Phi_o$, of the exciplex relative to the pure polymer shows that the light emission of the exciplex is far more efficient than that of the pure polymer. Thus, for example, the luminescence of the PBO/TTA exciplex of Example 58 at $\lambda_{max}$=474 nm, was a factor of 4.2, or 420%, more efficient than the luminescence of the single-layer PBO film alone.

Also, as seen in Table 1, the peak luminescence, $\lambda_{max}$, of the exciplexes are linear with the reduction potential of the pure polymers, E° red., thus permitting the color of the light emitted to be tuned by paring suitable materials having the desired E° red. for the particular exciplex to be formed.

Example 59

Photogeneration of Charge

A bilayer assembly consisting of 0.1 μm thick PBZt and 10 μm thick TTA/PC (40:60 wgt % TTA:PC) was prepared substantially as described in Example 51. The assembly was disposed atop a substrate comprised of nickel-coated polyl-ethylene terephthalate) such that the TTA layer was the top (free surface) layer. The final assembly is illustrated at FIG. 6A. Xerographic photodischarge measurements were made to determine the charge photogeneration efficiency of the bilayer device assembly as a function of applied electric field.

To instigate photogeneration of charge, a surface charge was applied to the top of the TTA layer by corona charging, followed by photoexcitation of the PBZT layer. The PBZT/TTA exciplex to form a PBZT/TTA exciplex where PBZT acted as an electron aczeptor and TTA acted as an electron donor. The photocarrier generation mechanism in the bilayer PBZT/TTA assembly consisted of electric field-assisted dissociation of the exciplex, the mechanism being represented as PBZT*+TTA→(PBZT* TTA)→(PBZT⁻· TTA⁺·) →PBZT⁻·+TTA⁺.

Figure 7:
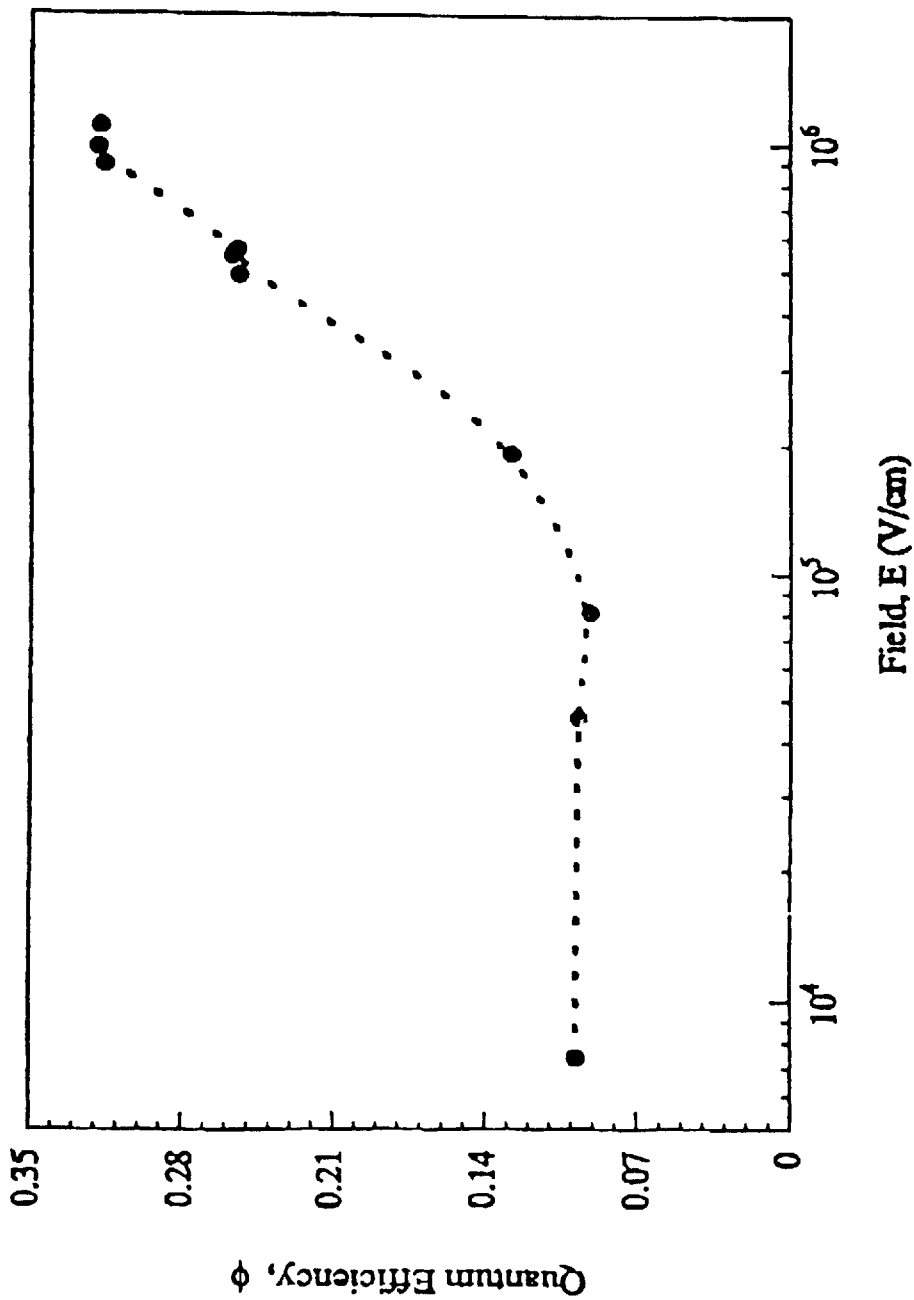
FIG. 7 is a graph depicting the quantum efficiency for charge photogeneration, Φ, as measured against the electric field applied to the assembly shown in FIG. 6A.

As shown in FIG. 7, the charge photogeneration efficiency, Φ, varied from about 10% at low fields (less than about $10^4$ V/cm) to 31% at fields of about $10^6$ V/cm. In comparison, the charge photogeneration efficiency of the individual components, PBZT and TTA, were too small to be measurable.

Examples 60 to 71

Light Emitting Properties of Polymeric Films

Polymeric films were tested to determine their light emitting properties by imposing a voltage across the light emitting diodes prepared in Example 50. This determination involved providing a voltage source in electrical communication with the electrical conduits connected to the aluminum layer and the conductive indium tin oxide layer of the glass substrate.

Initially, an EMF of 1 volt was applied. This was slowly increased to a maximum of about 20 volts. The wavelength color and intensity of any light emission resulting therefrom was observed. From this data the quantum efficiency of fluorescence, $\Phi_f$ is determined. $\Phi_f$ is the fraction of the excited carriers that combine radioactively. The higher this quantum efficiency the better is the polymer as a light emitting source most polymers do not possess this property and have a $\Phi_f$ of O.

The polymeric films, within the contemplation of the present invention, which were tested as light emitters are summarized in the Table 2 below. This table includes $\Phi_f$, the wavelength of maximum light emission and the color of that light emission.

TABLE 2

| Exam Light No. | Polymer | Thin Film $\Phi_f$, % | Wavelength of Max. Emission, nm | Color of Emitted |
|---|---|---|---|---|
| 60 | PBO[1] | 10.4 | 500 | Green |
| 61 | PBZT[2] | 8.0 | 560 | Yellow |
| 62 | PBTPV | 4.0–5.0 | 640 | Red |
| 63 | 2,6-PNBT | 4.0–5.0 | 578 | Yellow |
| 64 | 1,4-PNBT | 4.0–5.0 | 572 | Yellow |

TABLE 2-continued

| Exam Light No. | Polymer | Thin Film $\Phi_f$, % | Wavelength of Max. Emission, nm | Color of Emitted |
|---|---|---|---|---|
| 65 | PBBZT | 4.0–5.0 | 536 | Green |
| 66 | BBL[3] | <10$^{-3}$ | 740 | Near Infrared |
| 67 | PBIV | <10$^{-3}$ | 620 | Orange |
| 68 | PBIDV | <10$^{-3}$ | 652 | Red |
| 69 | PBIPV | <10$^{-3}$ | 638 | Red |
| 70 | PBZI | <10$^{-3}$ | 560 | Yellow |
| 71 | PBBI | <10$^{-5}$ | Below S/N[4] | — |

[1] Poly(p-phenylene benzobisoxazole)
[2] Poly(p-phenylene benzobisthiazole)
[3] Polybenzimidozolebenzophenyanthiolane-type ladder (Polymeric having repeating structure of Formula XIII)
[4] Signal to Noise ratio.

What is claimed is:

1. An assembly comprising a π-conjugated polymer and an electron donor or acceptor component different from said π-conjugated polymer and effective to form an exciplex with said π-conjugated polymer when at least one of said π-conjugated polymer or said electron donor or acceptor component is in an excited stated, said π-conjugated polymer and said electron donor or acceptor component having a contact relationship in said assembly sufficient to permit said exciplex to form.

2. The assembly of claim 1 wherein said π-conjugated polymer is contained in a first layer and said electron donor or acceptor component is contained in a second layer, said first layer adhered to said second layer sufficient to permit said exciplex to form when at least one of said first layer or said second layer is excited.

3. The assembly of claim 2 wherein said first layer and said second layer alternate to form a plurality of layers.

4. The assembly of claim 2 wherein said first layer and second layer each comprise a thin film.

5. The assembly of claim 2 wherein either of said first or second layer is adhered to a substrate.

6. The assembly of claim 5 wherein said substrate is glass, fused silica or an inert polymer.

7. The assembly of claim 6 wherein said inert-polymer is polycarbonate, polymethylmethacrylate, poly (ethyleneterephthalate) or polystyrene.

8. The assembly of claim 1 wherein said π-conjugated polymer is dispersed in said electron donor or acceptor component.

9. The assembly of claim 1 wherein said electron donor or acceptor component is dispersed in said π-conjugated polymer.

10. The assembly of claim 1 wherein said π-conjugated polymer and said electron donor or acceptor component are both dispersed in an inert matrix.

11. The assembly of claim 10 wherein said inert matrix comprises polycarbonate, polymethylmethacrylate, poly (ethyleneterephthalate) or polystyrene.

12. The assembly of claim 10 wherein said excited state is photogenerated, electrically generated, electrochemically generated or chemically generated.

13. An article of manufacture comprising the assembly of claim 10.

14. The article of claim 13 further comprising means for generating said excited state.

15. The article of claim 13 wherein said article is a light emitting diode, a xerographic photoreceptor, a solar cell, a photodetector, a laser, a waveguide switch or a modulator.

16. The article of claim 13 wherein said assembly forms a stabilizer against photodegradation.

17. A light emitting diode comprising a substrate, a first conductive electrode layer disposed upon said substrate, the assembly of claim 1 disposed upon said conductive electrode layer, second conductive electrode layer disposed upon said assembly and means for imposing a source of energy between said first and second conductive electrode layers were upon said assembly emits light.

18. The diode of claim 17 wherein said substrate is transparent.

19. The diode of claim 18 wherein said substrate comprises glass or plastic.

20. The diode of claim 19 wherein said first conductive electrode layer comprises indium thin oxide, gold or a conductive polymer.

21. The diode of claim 20 wherein said second conductive electrode layer is aluminum, magnesium, calcium or mixtures thereof.

22. The diode of claim 21 wherein said assembly comprises a layer comprising said π-conjugated polymer adhered to a layer comprising said electron donor or acceptor component.

23. The diode of claim 22 wherein said layer comprising said π-conjugated polymer and said layer comprising said electron donor or acceptor component are each about 10 to about 1000 nm thick.

24. The diode of claim 23 wherein said layer comprising said electron donor or acceptor component is disposed upon said first conductive layer and said layer comprising, said π-conjugated polymer is disposed thereon.

25. The diode of claim 24 wherein said means for imposing a source of energy is a voltage source.

26. The diode of claim 21 wherein said assembly comprises a dispersion layer of said π-conjugated polymer in said electron donor or acceptor component, or a dispersion layer of said electron donor or acceptor component in said π-conjugated polymer, or a dispersion layer of both said π-conjugated polymer and said electron donor or acceptor component in an inert matrix.

27. The diode of claim 26 wherein said dispersion layer is about 10 to about 1000 nm thick.

28. The diode of claim 27 wherein said inert matrix is polycarbonate, polymethylmethacrylate, poly(ethylene terephthalate) or polystyrene.

29. The diode of claim 28 wherein said means for imposing a source of energy is a voltage source.

30. A photoreceptor/photoconductive device for electrophotographic imaging which comprises a substrate and an assembly of claim 1 comprising a layer comprising said π-conjugated polymer having one side disposed upon said substrate and the other side adhered to a layer comprising said electron donor or acceptor component configured to have a surface charge applied whereby photoexcitation of said layer comprising said π-conjugated polymer subsequent to said surface charge application results in the formation of said exciplex, dissociation of which generates charge carriers for electrophotographic imaging.

31. The photoreceptor/photoconductive device of claim 30 wherein said dissociation is in the presence of an electric field.

32. The photoreceptor/photoconductor device of claim 31 wherein said substrate is a plastic film coated with a metal conductor.

33. The photoreceptor/photoconductor device of claim 32 wherein said plastic film is poly(ethylene terephthalate) and said metal conductor is nickel.

34. A method of enhancing the optoelectric properties of a π-conjugated polymer which comprises forming an exciplex of said π-conjugated polymer and an electron donor, or acceptor component different from said π-conjugated polymer and effective to form said exciplex with said π-conjugated polymer when at least one of said π-conjugated polymer or said electron donor or acceptor component is in an excited state.

35. The method of claim 34 wherein said π-conjugated polymer is a polybenzobisthiazole, a polybenzobisoxazole, a polybenzobisimidazole, a polyquinoline, a polyanthrazoline, a poly(phenylene), a poly(pyridine), a poly(phenylene vinylene), a poly(thiophene) or a poly(thiophene vinylene).

36. The method of claim 34 wherein said electron donor or acceptor compound is tris(p-tolyl)amine, 9,10-dicyanoanthracene, anthracene, poly(N-vinylcarbazole), N,N'-diphenyl-N-N'-bis(3-methylphenyl)(1,1'-biphenyl)-4-4'-diamine, tri(p-dimethylaminophenyl)amine, N,N'-dimethylaniline, N,N'-diethylaniline, tetracyanobenzene or 9,10-dimethylanthracene.

* * * * *

UNITED STATES PATENT AND TRADEMARK OFFICE
CERTIFICATE OF CORRECTION

PATENT NO. : 5,814,833

DATED : September 29, 1999

INVENTOR(S) : Samson A. Jenekhe, et al.

It is certified that error appears in the above-identified patent and that said Letters Patent is hereby corrected as shown below:

Column 44, line 21: "trip(" should read --tri(--

Column 44, line 33: "and R13" should read --and $R_{13}$--

Column 51, line 65: "The metal..." should begin a new paragraph

Column 54, line 62: "= -7.65" should read --- = 7.65--

Column 56, line 48: "$cm^{-2}$" should read --$cm^{-1}$--

Column 61, line 2: "tri-nbutyl..." should read --tri-n-butyl...--

Column 61, line 58: delete "(" first occurrence.

Column 65, line 35: "$N_2O$" should read --$NO_2$--

Column 66, line 21: "(PBTCB)" should read --(PBTC8)--

UNITED STATES PATENT AND TRADEMARK OFFICE
CERTIFICATE OF CORRECTION

PATENT NO. : 5,814,833
DATED : September 29, 1999
INVENTOR(S) : Samson A. Jenekhe, et al.

It is certified that error appears in the above-identified patent and that said Letters Patent is hereby corrected as shown below:

Column 70, line 8: "polyl-" should read --poly(--

Column 70, line 18: "aczeptor" should read --acceptor--

Column 74, line 4: ")(" should read --)-(--

Signed and Sealed this

Fifteenth Day of February, 2000

Attest:

Q. TODD DICKINSON

Attesting Officer

Commissioner of Patents and Trademarks